US012538489B2

(12) United States Patent
Tsutsumi et al.

(10) Patent No.: US 12,538,489 B2
(45) Date of Patent: Jan. 27, 2026

(54) THREE-DIMENSIONAL MEMORY DEVICE HAVING CONTROLLED LATERAL ISOLATION TRENCH DEPTH AND METHODS OF FORMING THE SAME

(71) Applicant: WESTERN DIGITAL TECHNOLOGIES, INC., San Jose, CA (US)

(72) Inventors: Masanori Tsutsumi, Yokkaichi (JP); Keita Akasaki, Yokkaichi (JP); Tomohiro Kubo, Yokkaichi (JP); Shinsuke Yada, Yokkaichi (JP); Takaaki Iwai, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 365 days.

(21) Appl. No.: 18/349,527

(22) Filed: Jul. 10, 2023

(65) Prior Publication Data

US 2025/0024676 A1 Jan. 16, 2025

(51) Int. Cl.
*H10B 43/27* (2023.01)
*H01L 23/00* (2006.01)
(Continued)

(52) U.S. Cl.
CPC ............ *H10B 43/27* (2023.02); *H01L 24/08* (2013.01); *H01L 24/80* (2013.01);
(Continued)

(58) Field of Classification Search
CPC ........ H10B 43/27; H10B 41/27; H10B 80/00; H10B 43/10; H10B 43/50; H01L 24/08;
(Continued)

(56) References Cited

U.S. PATENT DOCUMENTS 9,524,976 B2 12/2016 Pachamuthu et al.
9,799,670 B2 10/2017 Nishikawa et al.
(Continued)

OTHER PUBLICATIONS

ISA—Invitation to Pay Additional Fees and, where applicable, protest Fee for International Patent Application No. PCT/US2024/030349, mailed Aug. 8, 2024, 6 pages.
(Continued)

*Primary Examiner* — Thanh Y. Tran
(74) *Attorney, Agent, or Firm* — THE MARBURY LAW GROUP PLLC

(57) ABSTRACT

A memory device includes a lower source-level semiconductor layer, a source contact layer, and an upper source-level semiconductor layer, an alternating stack of insulating layers and electrically conductive layers, a memory opening vertically extending through the alternating stack, the upper source-level semiconductor layer, and the source contact layer, and a memory opening fill structure located in the memory opening and including a memory film and a vertical semiconductor layer having a surface segment that contacts the source contact layer. In one embodiment, the upper source-level semiconductor layer may be locally thickened to provide sufficient etch resistance during formation of a lateral isolation trench. In another embodiment, a sacrificial line trench fill structure may be employed as an etch stop structure during formation of a lateral isolation trench.

20 Claims, 80 Drawing Sheets

(51) Int. Cl.

| | |
|---|---|
| ***H01L 25/00*** | (2006.01) |
| ***H01L 25/065*** | (2023.01) |
| ***H01L 25/18*** | (2023.01) |
| ***H10B 41/27*** | (2023.01) |
| ***H10B 80/00*** | (2023.01) |

(52) U.S. Cl.
CPC .......... *H01L 25/0657* (2013.01); *H01L 25/18* (2013.01); *H01L 25/50* (2013.01); *H10B 41/27* (2023.02); *H10B 80/00* (2023.02); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 24/80; H01L 25/0657; H01L 25/18; H01L 25/50; H01L 2224/08145; H01L 2224/80895; H01L 2224/80896; H01L 2924/1431; H01L 2924/14511
See application file for complete search history.

(56) References Cited

U.S. PATENT DOCUMENTS

| | | | | |
|---|---|---|---|---|
| 9,831,266 | B2 | 11/2017 | Kai et al. | |
| 9,876,031 | B1 | 1/2018 | Shimizu et al. | |
| 9,917,100 | B2 | 3/2018 | Zhang et al. | |
| 9,985,098 | B2 | 5/2018 | Matsumoto et al. | |
| 10,008,570 | B2 | 6/2018 | Yu et al. | |
| 10,020,363 | B2 | 7/2018 | Ogawa et al. | |
| 10,115,681 | B1 | 10/2018 | Ariyoshi | |
| 10,199,359 | B1 | 2/2019 | Sakakibara et al. | |
| 10,224,340 | B2 | 3/2019 | Hada et al. | |
| 10,224,373 | B2 | 3/2019 | Sel et al. | |
| 10,290,645 | B2 | 5/2019 | Nakatsuji et al. | |
| 10,290,650 | B1 | 5/2019 | Iwai | |
| 10,354,956 | B1 | 7/2019 | Yu et al. | |
| 10,381,373 | B2 | 8/2019 | Okizumi et al. | |
| 10,381,443 | B2 | 8/2019 | Matsumoto et al. | |
| 10,438,964 | B2 | 10/2019 | Makala et al. | |
| 10,559,582 | B2 | 2/2020 | Nishikawa et al. | |
| 10,600,800 | B2 | 3/2020 | Nishikawa et al. | |
| 10,629,613 | B1 | 4/2020 | Shimizu et al. | |
| 10,629,616 | B1 | 4/2020 | Kai et al. | |
| 10,720,445 | B1 | 7/2020 | Shimizu et al. | |
| 10,748,925 | B1 | 8/2020 | Tsutsumi et al. | |
| 10,797,070 | B2 | 10/2020 | Mushiga et al. | |
| 10,804,291 | B1 | 10/2020 | Rajashekhar et al. | |
| 10,854,627 | B1 | 12/2020 | Moriyama et al. | |
| 10,861,869 | B2 | 12/2020 | Nakamura et al. | |
| 10,868,025 | B2 | 12/2020 | Zhou et al. | |
| 10,903,222 | B2 | 1/2021 | Sakakibara et al. | |
| 10,916,556 | B1 | 2/2021 | Sakakibara et al. | |
| 10,923,496 | B2 | 2/2021 | Mushiga et al. | |
| 10,923,498 | B2 | 2/2021 | Otsu et al. | |
| 10,957,648 | B2 | 3/2021 | Hsu et al. | |
| 10,964,715 | B2 | 3/2021 | Makazu et al. | |
| 11,121,153 | B1 | 9/2021 | Obu et al. | |
| 11,127,759 | B2 | 9/2021 | Obu et al. | |
| 11,195,781 | B2 | 12/2021 | Okina et al. | |
| 11,201,107 | B2 | 12/2021 | Okina et al. | |
| 11,239,253 | B2 | 2/2022 | Rajashekhar et al. | |
| 11,244,953 | B2 | 2/2022 | Kanakamedala et al. | |
| 11,302,713 | B2 | 4/2022 | Baraskar et al. | |
| 11,322,509 | B2 | 5/2022 | Baraskar et al. | |
| 11,342,347 | B2 | 5/2022 | Hinoue | |
| 11,444,101 | B2 | 9/2022 | Sato et al. | |
| 11,521,984 | B2 | 12/2022 | Sharangpani et al. | |
| 11,552,100 | B2 | 1/2023 | Cui et al. | |
| 11,600,634 | B2 | 3/2023 | Cui et al. | |
| 2017/0148810 | A1 | 5/2017 | Kai et al. | |
| 2017/0148811 | A1 | 5/2017 | Zhang et al. | |
| 2018/0122904 | A1 | 5/2018 | Matsumoto et al. | |
| 2018/0122905 | A1 | 5/2018 | Ogawa et al. | |
| 2018/0122906 | A1 | 5/2018 | Yu et al. | |
| 2018/0261671 | A1 | 9/2018 | Matsumoto et al. | |
| 2018/0366486 | A1 | 12/2018 | Hada et al. | |
| 2018/0366487 | A1 | 12/2018 | Okizumi et al. | |
| 2018/0374866 | A1 | 12/2018 | Makala et al. | |
| 2019/0006381 | A1 | 1/2019 | Nakatsuji et al. | |
| 2019/0006418 | A1 | 1/2019 | Sel et al. | |
| 2019/0043830 | A1 | 2/2019 | Sakakibara et al. | |
| 2019/0214344 | A1 | 7/2019 | Yu et al. | |
| 2019/0371807 | A1 | 12/2019 | Nishikawa et al. | |
| 2020/0335487 | A1 | 10/2020 | Rajashekhar et al. | |
| 2020/0357815 | A1 | 11/2020 | Iwai et al. | |
| 2020/0388688 | A1* | 12/2020 | Baraskar | H10B 43/27 |
| 2021/0265379 | A1 | 8/2021 | Obu et al. | |
| 2021/0265380 | A1 | 8/2021 | Obu et al. | |
| 2021/0375910 | A1 | 12/2021 | Baraskar et al. | |
| 2021/0408032 | A1 | 12/2021 | Baraskar et al. | |
| 2021/0408035 | A1 | 12/2021 | Sato et al. | |
| 2022/0045091 | A1 | 2/2022 | Cui et al. | |
| 2022/0052073 | A1 | 2/2022 | Kitazawa et al. | |
| 2022/0336484 | A1 | 10/2022 | Iwai et al. | |

OTHER PUBLICATIONS

ISR-WO—Notification of Transmittal of The International Search Report and Written Opinion of the International Searching Authority for International Patent Application No. PCT/US2024/030349, mailed Sep. 9, 2024, 14 pages.

Endoh et al., "Novel Ultra High-Density Memory with a Stacked-Surrounding Gate Transistor (S-SGT) Structured Cell," IEDM Proc. (2001) 33-36.

U.S. Appl. No. 17/244,258, filed Apr. 29, 2021, SanDisk Technologies LLC.

U.S. Appl. No. 17/244,311, filed Apr. 29, 2021, SanDisk Technologies LLC.

U.S. Appl. No. 17/355,955, filed Jun. 23, 2021, SanDisk Technologies LLC.

U.S. Appl. No. 17/462,446, filed Aug. 31, 2021, SanDisk Technologies LLC.

U.S. Appl. No. 17/583,456, filed Jan. 25, 2022, SanDisk Technologies LLC.

U.S. Appl. No. 17/655,272, filed Mar. 17, 2022, SanDisk Technologies LLC.

U.S. Appl. No. 17/715,549, filed Apr. 7, 2022, SanDisk Technologies LLC.

U.S. Appl. No. 17/715,662, filed Apr. 7, 2022, SanDisk Technologies LLC.

U.S. Appl. No. 17/934,676, filed Sep. 23, 2022, SanDisk Technologies LLC.

U.S. Appl. No. 17/934,685, filed Sep. 23, 2022, SanDisk Technologies LLC.

U.S. Appl. No. 18/348,727, filed Jul. 7, 2023, Western Digital Technologies, Inc.

U.S. Appl. No. 63/380,307, filed Oct. 20, 2022, SanDisk Technologies LLC.

U.S. Appl. No. 63/380,309, filed Oct. 20, 2022, SanDisk Technologies LLC.

U.S. Appl. No. 63/381,354, filed Oct. 28, 2022, SanDisk Technologies LLC.

U.S. Appl. No. 63/492,573, filed Mar. 28, 2023, SanDisk Technologies LLC.

U.S. Appl. No. 63/492,576, filed Mar. 28, 2023, SanDisk Technologies LLC.

U.S. Appl. No. 63/498,915, filed Apr. 28, 2023, Western Digital Technologies, Inc.

U.S. Appl. No. 63/499,549, filed May 2, 2023, Western Digital Technologies, Inc.

Iwai, T. et al., "Three-Dimensional Memory Device Having Controlled Lateral Isolation Trench Depth and Methods of Forming the Same," U.S. Appl. No. 18/349,560, filed Jul. 10, 2023.

* cited by examiner

THREE-DIMENSIONAL MEMORY DEVICE HAVING CONTROLLED LATERAL ISOLATION TRENCH DEPTH AND METHODS OF FORMING THE SAME

FIELD

The present disclosure relates generally to the field of semiconductor devices, and particularly to a three-dimensional semiconductor device having controlled lateral isolation trench depth and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device comprises: source-level material layers comprising a lower source-level semiconductor layer, an upper source-level semiconductor layer located over the lower source-level semiconductor layer, and a source contact layer located between the lower source-level semiconductor layer and the upper source-level semiconductor layer, wherein the lower source-level semiconductor layer comprises a first portion having a first thickness and a second portion having a second thickness that is less than the first thickness; an alternating stack of insulating layers and electrically conductive layers located over the source-level material layers; a memory opening vertically extending through the alternating stack and partially through the source-level material layers into the first portion of the lower source-level semiconductor layer; and a memory opening fill structure located in the memory opening and comprising a memory film and a vertical semiconductor layer that contacts the source contact layer. The source contact layer comprises: a first horizontally extending portion overlying the first portion of the lower source-level semiconductor layer; a second horizontally-extending portion overlying the second portion of the lower source-level semiconductor layer; and a third portion connecting the first horizontally-extending portion and the second horizontally-extending portion.

According to another aspect of the present disclosure, a method of forming a device structure is provided, which comprises: forming a lower source-level semiconductor layer over a substrate, wherein the lower source-level semiconductor layer has a first portion having a first thickness and a second portion having a second thickness that is less than the first thickness; forming a source-level sacrificial layer and an upper source-level semiconductor layer over the lower source-level semiconductor layer; forming an alternating stack of insulating layers and sacrificial material layers over the upper source-level semiconductor layer; forming a lateral isolation trench through the alternating stack and the upper source-level semiconductor layer over the second portion of the lower source-level semiconductor layer; replacing the source-level sacrificial layer with at least a source contact layer by providing an etchant that etches the source-level sacrificial layer through the lateral isolation trench and by providing a reactant that deposits the source contact layer through the lateral isolation trench; and replacing the sacrificial material layers with electrically conductive layers.

According to yet another aspect of the present disclosure, a memory device comprises: source-level material layers comprising, from bottom to top, a lower source-level semiconductor layer, a source contact layer, and an upper source-level semiconductor layer; an alternating stack of insulating layers and electrically conductive layers located over of the source-level material layers; a memory opening vertically extending through the alternating stack, the upper source-level semiconductor layer, and the source contact layer; a memory opening fill structure located in the memory opening and comprising a memory film and a vertical semiconductor layer having a surface segment that contacts the source contact layer; and a lateral isolation trench fill structure including an insulating material portion having a stepped outer sidewall that contacts the alternating stack, wherein the stepped sidewall comprises an upper sidewall segment that vertically extends through a first subset of the insulating layers and the electrically conductive layers within the alternating stack, a lower sidewall segment that contacts a second subset of the insulating layers and the electrically conductive layers within the alternating stack, and a horizontally-extending surface segment that is adjoined to the upper sidewall segment and to the lower sidewall segment.

According to still another aspect of the present disclosure, a method comprises: forming a layer stack over a substrate, the layer stack comprising a lower source-level semiconductor layer, an upper source-level semiconductor layer and source-level sacrificial layer located between the lower source-level semiconductor layer and the upper source-level semiconductor layer; forming a first alternating stack of first insulating layers and first sacrificial material layers over the layer stack; forming a line trench through the first alternating stack and the upper source-level semiconductor layer; forming a sacrificial line trench fill structure in the line trench; forming a second alternating stack of second insulating layers and second sacrificial material layers over the first alternating stack; forming a lateral isolation trench through the second alternating stack such that a surface of the sacrificial line trench fill structure is exposed underneath the lateral isolation trench; vertically extending the lateral isolation trench by removing the sacrificial line trench fill structure; replacing the source-level sacrificial layer with at least a source contact layer by providing an etchant that etches the source-level sacrificial layer through the lateral isolation trench and by providing a reactant that deposits the source contact layer through the lateral isolation trench; and replacing the first sacrificial material layers and the second sacrificial material layers with first electrically conductive layers and second electrically conductive layers, respectively.

DETAILED DESCRIPTION

Figure 1:
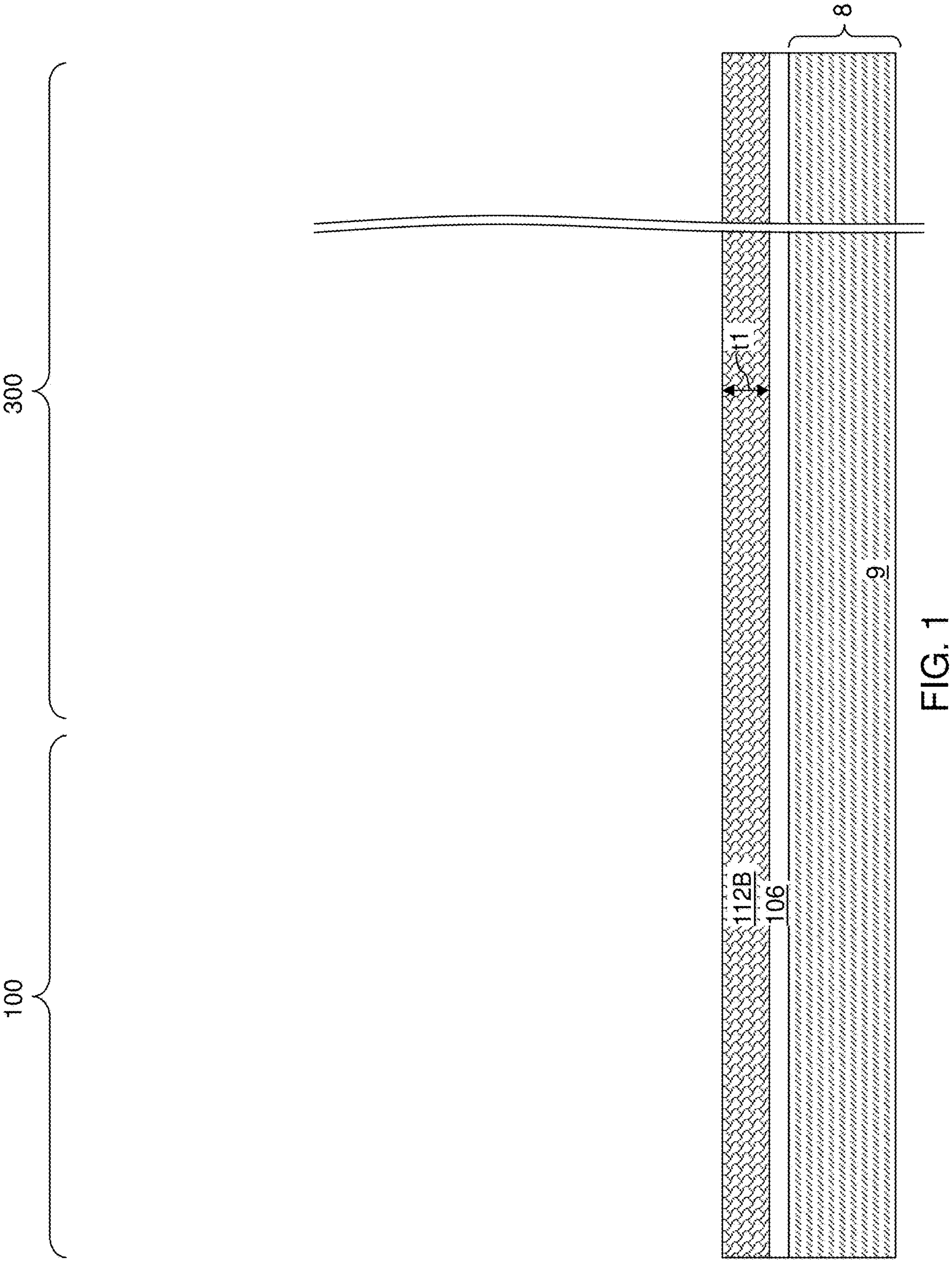
FIG. 1 is a schematic vertical cross-sectional view of a first exemplary structure after formation of a backside insulating layer and a lower source-level semiconductor layer according to a first embodiment of the present disclosure.

As discussed above, the present disclosure is directed to a three-dimensional memory device with controlled lateral isolation trench depth and methods for forming the same, the various aspects of which are described below. Embodiments of the disclosure can be employed to form various structures including a multilevel memory structure, non-limiting examples of which include semiconductor devices such as three-dimensional memory array devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased in a single erase operation. Each block contains a number of pages, which are the smallest unit that can be programmed, i.e., a smallest unit on which a read operation can be performed.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Referring to FIG. 1, a first exemplary structure according to a first embodiment of the present disclosure comprises a substrate 8, a backside insulating layer 106 formed on a top surface of the substrate 8, and a blanket semiconductor material layer 112B. The substrate 8 may be a semiconductor substrate, an insulating substrate, or a conductive substrate. In one embodiment, the substrate 8 may be a semiconductor substrate including a semiconductor material layer 9. For example, the substrate 8 may comprise a commercially available silicon wafer and the semiconductor material layer 9 may comprise a doped well in an upper part of the silicon wafer or an epitaxial silicon layer formed on the top surface of the silicon wafer. The backside insulating layer 106 comprises an insulating material, such as silicon oxide, and may have a thickness in a range from 50 nm to 500 nm, although lesser and greater thicknesses may also be employed.

Optionally, a peripheral circuit may be formed in the semiconductor material layer 9 below the backside insulating layer 106. According to an aspect of the present disclosure, the peripheral circuit can be configured to control operation of the memory array to be formed above the backside insulating layer 106. For example, the peripheral circuit may comprise word line driver regions, bit line driver regions, sense amplifier regions, input/output buffer regions, etc. Alternatively, the peripheral circuit formation below the backside insulating layer 106 may be omitted, and the peripheral circuit may be formed on a separate logic die which is then bonded to the memory array, as will be described in more detail below with respect to FIGS. 21-22.

The blanket semiconductor material layer 112B comprises a semiconductor material and may have a uniform thickness throughout, which is herein referred to as a first thickness t1. The first thickness t1 may be in a range from 150 nm to 500 nm, such as from 250 nm to 400 nm, although lesser and greater thicknesses may also be employed. The blanket semiconductor material layer 112B has a doping of an opposite conductivity type of the doping of vertical semiconductor channels to be subsequently employed. In one embodiment, the vertical semiconductor channels to be subsequently formed have a doping of a first conductivity type, and the blanket semiconductor material layer 112B has a doping of a second conductivity type that is the opposite of the first conductivity type. If the first conductivity type is p-type, the second conductivity type is n-type, and vice versa. The atomic concentration of dopants of the second conductivity type in the blanket semiconductor material layer 112B may be in a range from $5.0\times10^{18}/cm^3$ to $2.0\times10^{21}/cm^3$, although lesser and greater atomic concentrations may also be employed. In one embodiment, the blanket semiconductor material layer 112B comprises and/or consists essentially of doped amorphous silicon or doped polysilicon. The first exemplary structure may comprise a memory array region 100 in which a three-dimensional memory array is to be subsequently formed, and a contact region 300 in which layer contact via structures contacting electrically conductive layers are to be subsequently formed.

Figure 2A:
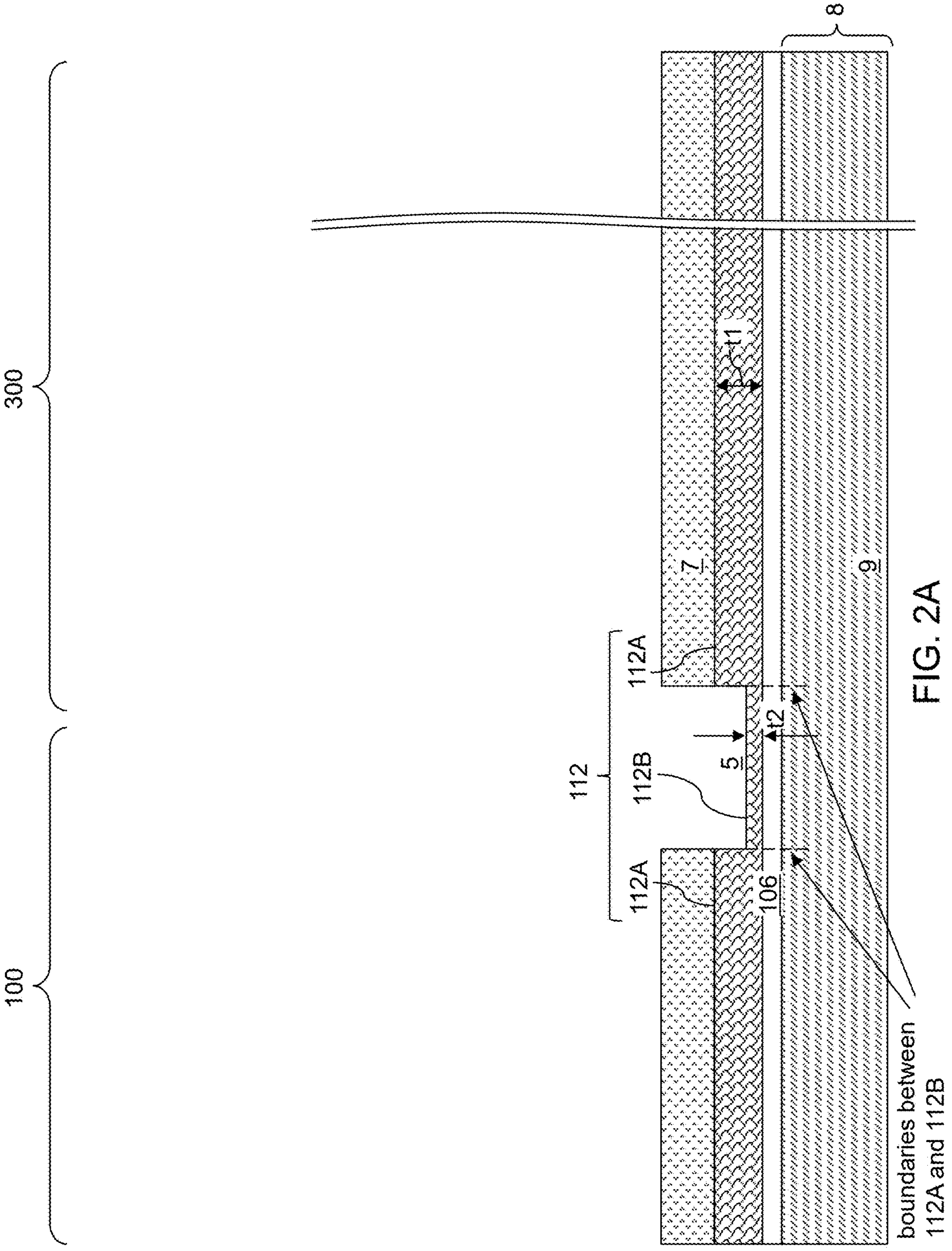
FIG. 2A is a schematic vertical cross-sectional view of the first exemplary structure after formation of line trenches according to the first embodiment of the present disclosure.
Figure 2B:
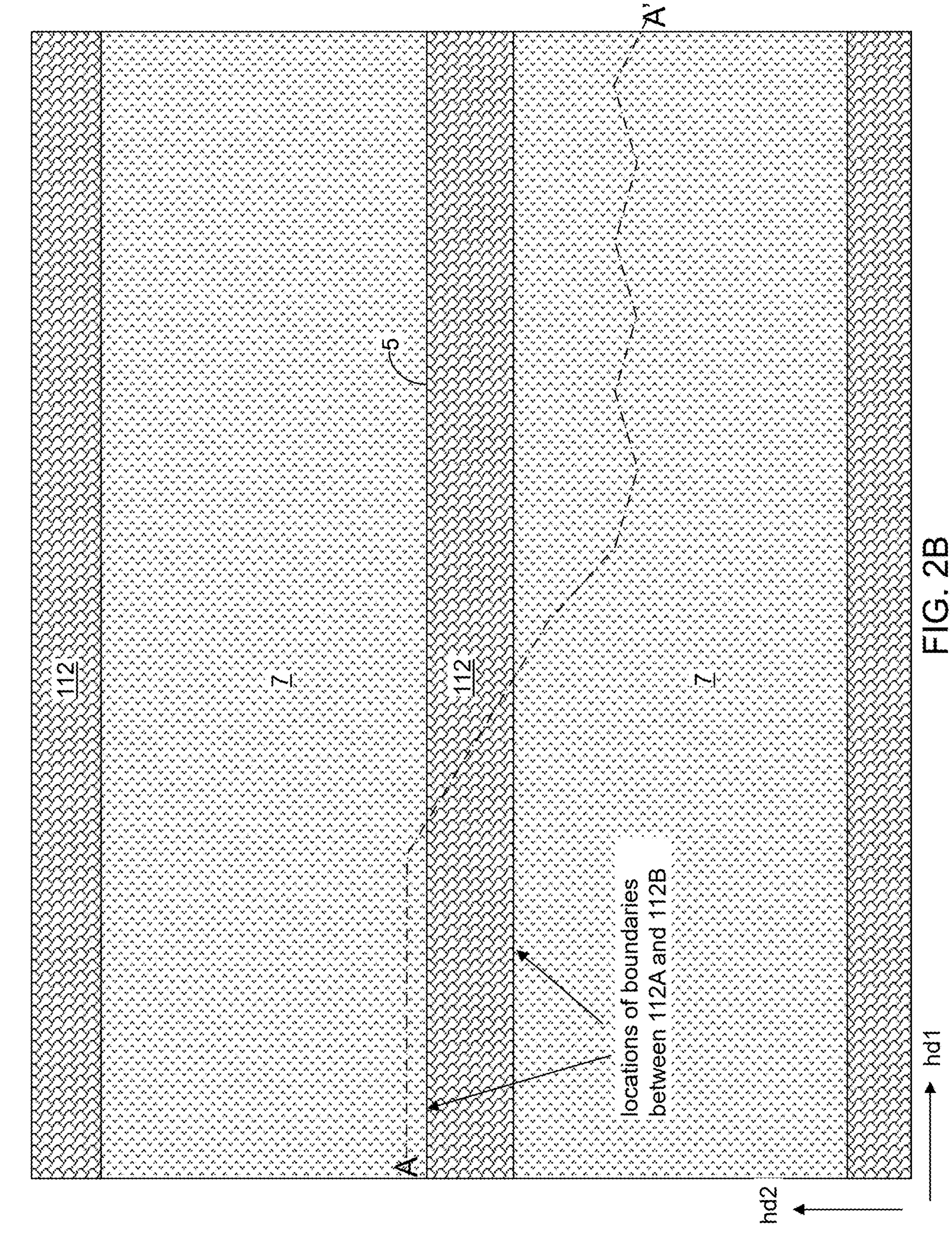
FIG. 2B is a top-down view of the first exemplary structure of FIG. 2A. The hinged vertical cross-sectional plane A-A' is the cut plane of the vertical cross-sectional view of FIG. 2A.

Referring to FIGS. 2A and 2B, a photoresist layer 7 can be applied over the blanket semiconductor material layer 112B, and can be lithographically patterned to form slit-shaped openings that laterally extend along a first horizontal direction (e.g., word line direction) hd1. The slit-shaped openings may be arranged as a periodic one-dimensional array along a second horizontal direction (e.g., bit line direction) hd2 that is perpendicular to the first horizontal direction hd1. The periodicity of the slit-shaped openings may be the periodicity of blocks of three-dimensional memory array to be subsequently formed, and may be in a range from 600 nm to 10 microns, although lesser and greater periodicities may also be employed. The width of each slit-shaped opening may be in a range from 150 nm to 600 nm, although lesser and greater widths may also be employed.

An anisotropic etch process can be performed to transfer the pattern of the slit-shaped openings into an upper portion of the blanket semiconductor material layer 112B without etching through the entire thickness of the blanket semiconductor material layer 112B. A line trench 5 can be formed in each volume from which the material of the blanket semiconductor material layer 112B is etched. Thus, the line trenches 5 may have the same pattern in a plan view as the slit-shaped openings in the photoresist layer 7. The blanket semiconductor material layer 112B is converted into a patterned semiconductor material layer, which is herein referred to as a lower source-level semiconductor layer 112. Each thinned portion of the lower source-level semiconductor layer 112 has a second thickness t2, which is less than the first thickness t1. The second thickness t2 may be in a range from 5% to 60%, such as from 10% to 40%, of the first thickness. For example, the second thickness t2 may be in a range from 30 nm to 300 nm, such as from 50 nm to 150 nm, although lesser and greater thicknesses may also be employed. The photoresist layer 7 can be subsequently removed, for example, by ashing. Generally, the lower source-level semiconductor layer 112 has a first portion 112A having a first thickness t1 and a second portion 112B having a second thickness t2 that is less than the first thickness t1. The line trenches 5 laterally extend along the first horizontal direction hd1, have a uniform width along the second horizontal direction hd2 that is invariant under translation along the first horizontal direction hd1, and are arranged as a two-dimensional periodic array along the second horizontal direction hd2.

Figure 3:
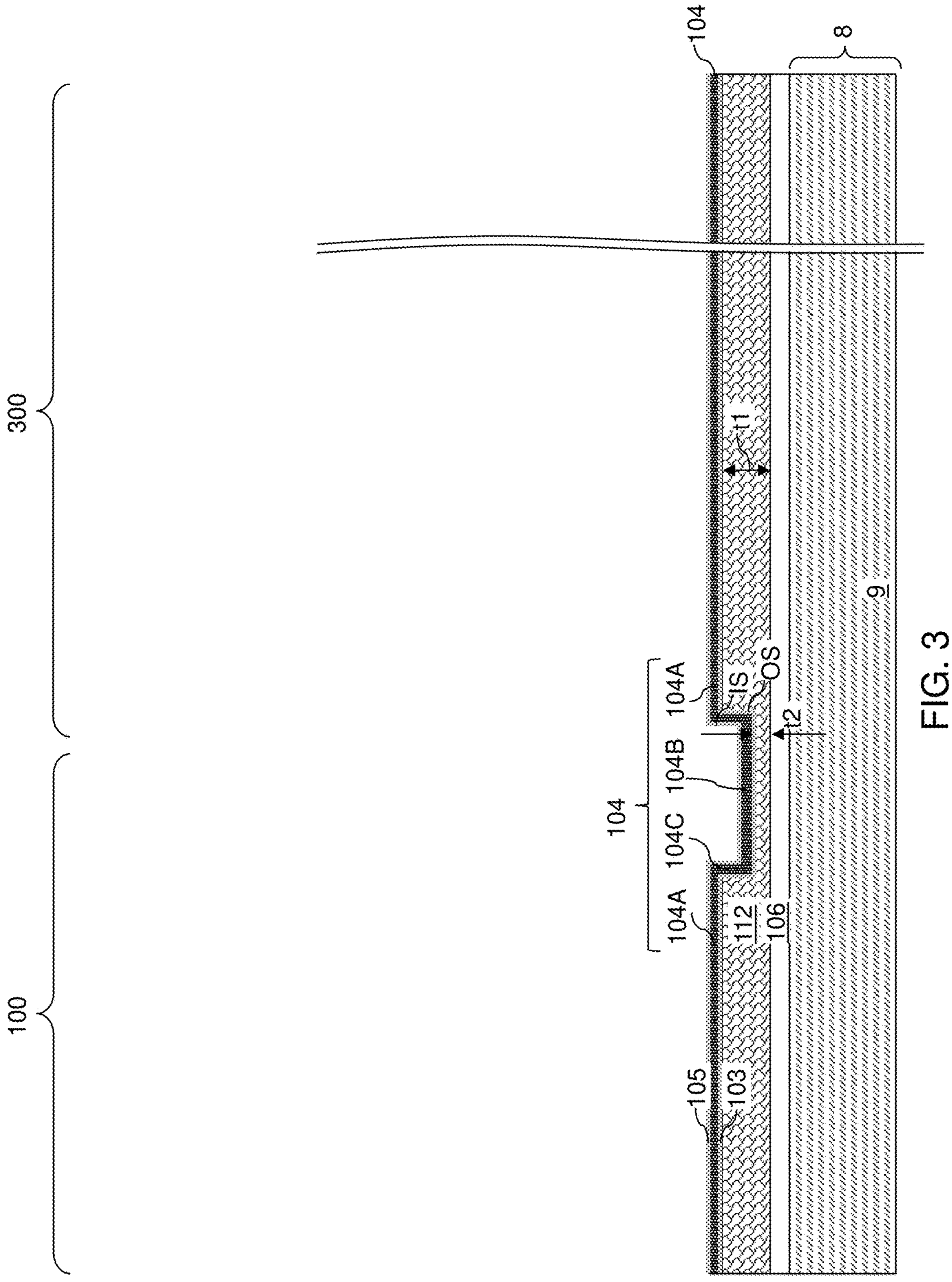
FIG. 3 is a schematic vertical cross-sectional view of the first exemplary structure after formation of a lower sacrificial liner, a source-level sacrificial layer, and an upper sacrificial liner according to the first embodiment of the present disclosure.

Referring to FIG. 3, an optional lower sacrificial liner 103, a source-level sacrificial layer 104, and an optional upper sacrificial liner 105 may be conformally formed. The source-level sacrificial layer 104 includes a sacrificial material that may be subsequently removed selective to the lower sacrificial liner 103 (or selective to the lower source-level semiconductor layer 112) and the upper sacrificial liner 105 (or selective to an upper source-level semiconductor layer to be subsequently formed). In one embodiment, the source-level sacrificial layer 104 may include a dielectric material such as silicon nitride, or may include a semiconductor material such as undoped amorphous silicon or a silicon-germanium alloy with an atomic concentration of germanium greater than 20%. The source-level sacrificial layer 104 may be formed by a conformal deposition process, such as a chemical vapor deposition process. The thickness of the source-level sacrificial layer 104 may be in a range from 20 nm to 200 nm, such as from 25 nm to 50 nm, although lesser and greater thicknesses may also be used.

The source-level sacrificial layer 104 can be formed by a conformal deposition process and comprises first horizontally-extending portions 104A overlying the first portions 112A of the lower source-level semiconductor layer 112, second horizontally-extending portions 104B overlying the second portions 112B of the lower source-level semiconductor layer 112 located in the respective line trench 5, and vertically-extending portions 104C contacting a sidewall of a respective first portion 112A of the lower-level semiconductor layer 112 in the respective line trench 5 and connecting a first horizontally-extending portion 104A and a second horizontally-extending portion 104B. Thus, each first horizontally-extending portion 104A can be formed outside volumes of the line trenches 5, and each second horizontally-extending portion 104B can be formed within a bottom region of a respective line trench 5.

The lower sacrificial liner 103 (if present) and the upper sacrificial liner 105 (if present) include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. The lower sacrificial liner 103 may be formed by thermal oxidation of a surface portion of the lower source-level semiconductor layer 112 or by conformal deposition of a sacrificial material. The upper sacrificial liner 105 may be formed by conformal deposition of a sacrificial material. In one embodiment, each of the lower sacrificial liner 103 and the upper sacrificial liner 105 may include a respective silicon oxide layer having a thickness in a range from 2 nm to 30 nm, although lesser and greater thicknesses may also be used.

Each portion of the combination of the optional lower sacrificial liner 103, the source-level sacrificial layer 104, the optional upper sacrificial liner 105 located within a respective line trench 5 within the lower source-level semiconductor layer 112 may have a respective inner sidewall IS facing the inner volume of the respective line trench 5 and a respective outer sidewall OS that contacts a sidewall of the lower source-level semiconductor layer 112.

Figure 4:
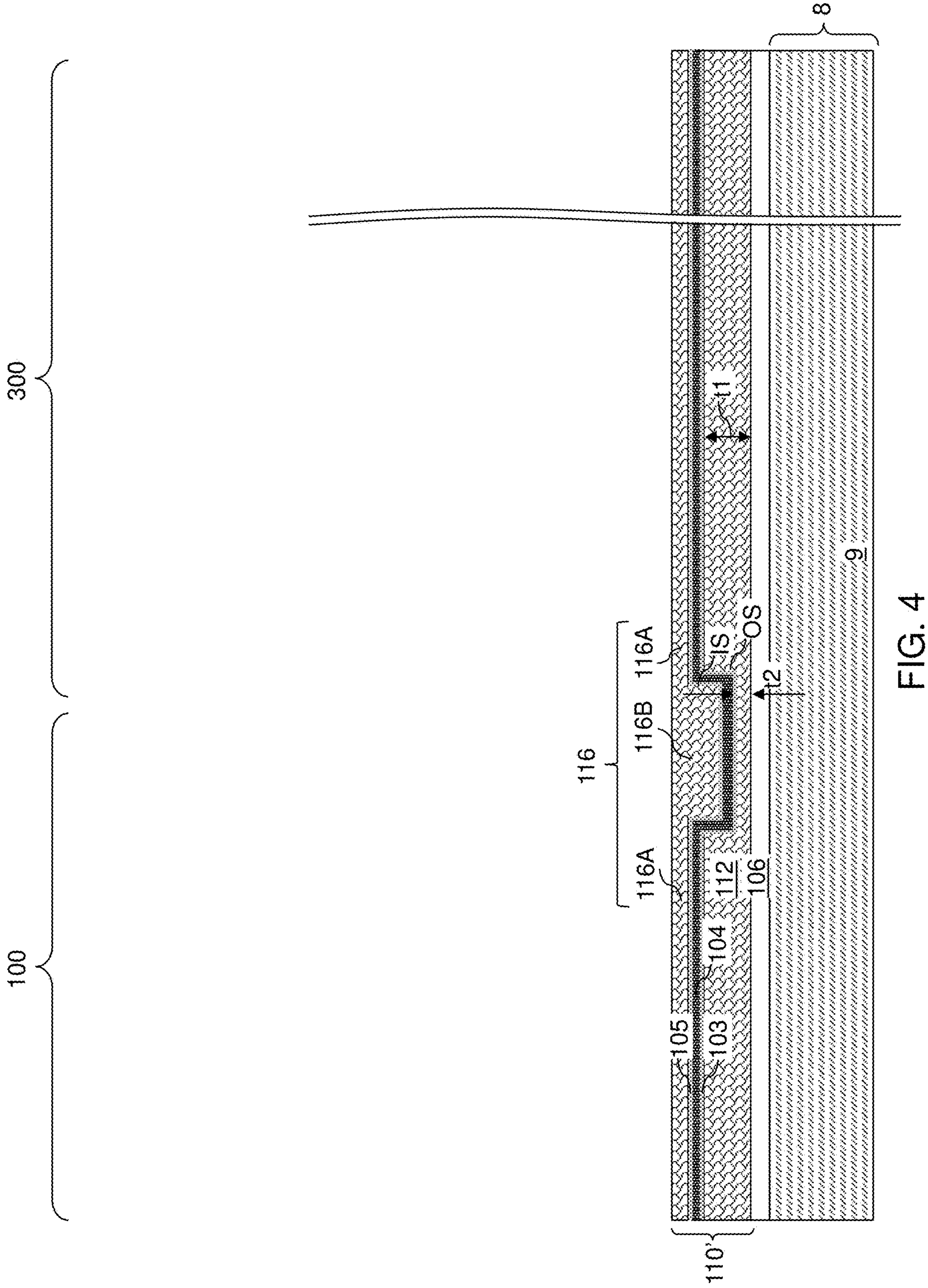
FIG. 4 is a schematic vertical cross-sectional view of the first exemplary structure after formation of an upper source-level semiconductor layer according to the first embodiment of the present disclosure.

Referring to FIG. 4, an upper source-level semiconductor layer 116 can be formed by depositing a doped semiconductor material having a doping of the second conductivity type into remaining volumes of the line trenches 5 and over the topmost surface of the source-level sacrificial layer 104, such as on the topmost surface of the upper sacrificial liner 105 (if present). The doped semiconductor material may comprise any material that may be employed for the lower source-level semiconductor layer 112, and may or may not comprise the same semiconductor material as the lower source-level semiconductor layer 112. The doped semiconductor material fills remaining volumes of the line trenches 5.

A planarization process such as a chemical mechanical polishing process can be removed to planarize the top surface of the deposited doped semiconductor material. The remaining portion of the doped semiconductor material after the planarization process constitutes the upper source-level semiconductor layer 116. The thickness of the first portion 116A of the upper source-level semiconductor layer 116 that overlies the first region 112A of the lower source-level semiconductor layer 112 having the first thickness t1 is less than the second portion 116B of the upper source-level semiconductor layer 116 that overlies a recessed top surface of the source-level sacrificial layer 104 in a line trench 5 by the difference between the first thickness t1 and the second thickness t2. In one embodiment, the thickness of the first portion 116A of the upper source-level semiconductor layer 116 that overlies the first region 112A of the lower source-level semiconductor layer 112 may be in a range from 20 nm to 200 nm, such as from 25 nm to 50 nm, although lesser and greater thicknesses may also be employed.

A lesser thickness for the upper source-level semiconductor layer 116 is preferred in areas in which memory stack structures including a vertical semiconductor channel layer and a memory film are to be subsequently formed because a vertical diffusion distance for dopants of the second conductivity type from a source contact layer into a bottom end portion of each vertical semiconductor channel layer should be controlled in order to provide well controlled electrical characteristics for vertical NAND strings. Specifically, variations in the height of the p-n junctions within bottom ends of the vertical semiconductor channels can lead to channel cut-off failures during operation of source-select-level electrically conductive layers (i.e., source side select gate electrodes) and/or to reduction in gate-induced-drain leakage (GIDL) current which is used during an erase operation of the memory device. At the same time, a greater thickness for the upper source-level semiconductor layer 116 is preferred in areas in which lateral isolation trenches are to be subsequently formed through an alternating stack of insulating layers and sacrificial material layers because the etch selectivity of an anisotropic etch process that etches the lateral isolation trenches is limited, and a thick doped semiconductor material within the upper source-level semiconductor layer 116 functions as an etch stop layer during etching of the lateral isolation trenches.

Therefore, in the first embodiment of the present disclosure, the thinner first portions 116A of the upper source-level semiconductor layer 116 are provided in areas in which memory openings and memory opening fill structures are to be subsequently formed, and the thicker second portions 116B of the upper source-level semiconductor layer 116 are provided in area in which lateral isolation trenches are to be subsequently formed through an alternating stack of insulating layers and sacrificial material layers. The thinner first portions 116A of the upper source-level semiconductor layer 116 reduce the vertical diffusion distance for dopants from a source contact layer, and the thicker second portions 116B of the upper source-level semiconductor layer 116 increases the thickness of the doped semiconductor material of the upper source-level semiconductor layer 116 that can be employed as an etch stop structure during formation of the lateral isolation trenches.

In summary, a source-level sacrificial layer 104 and an upper source-level semiconductor layer 116 can be formed over the lower source-level semiconductor layer 112. The upper source-level semiconductor layer 116 has a greater thickness above a strip-shaped second portion 112B of the lower source-level semiconductor layer 112 than above the first portion 112A of the lower source-level semiconductor layer 112. The top surface of the upper source-level semiconductor layer 116 can be planarized such that the entirety of the top surface of the upper source-level semiconductor layer 116 is formed within a horizontal plane. The combination of the lower source-level semiconductor layer 112, the optional lower sacrificial liner 103, the source-level sacrificial layer 104, the optional upper sacrificial liner 105, and the upper source-level semiconductor layer 116 constitutes in-process source-level material layers 110', which are subsequently modified into source-level material layers.

Figure 5:
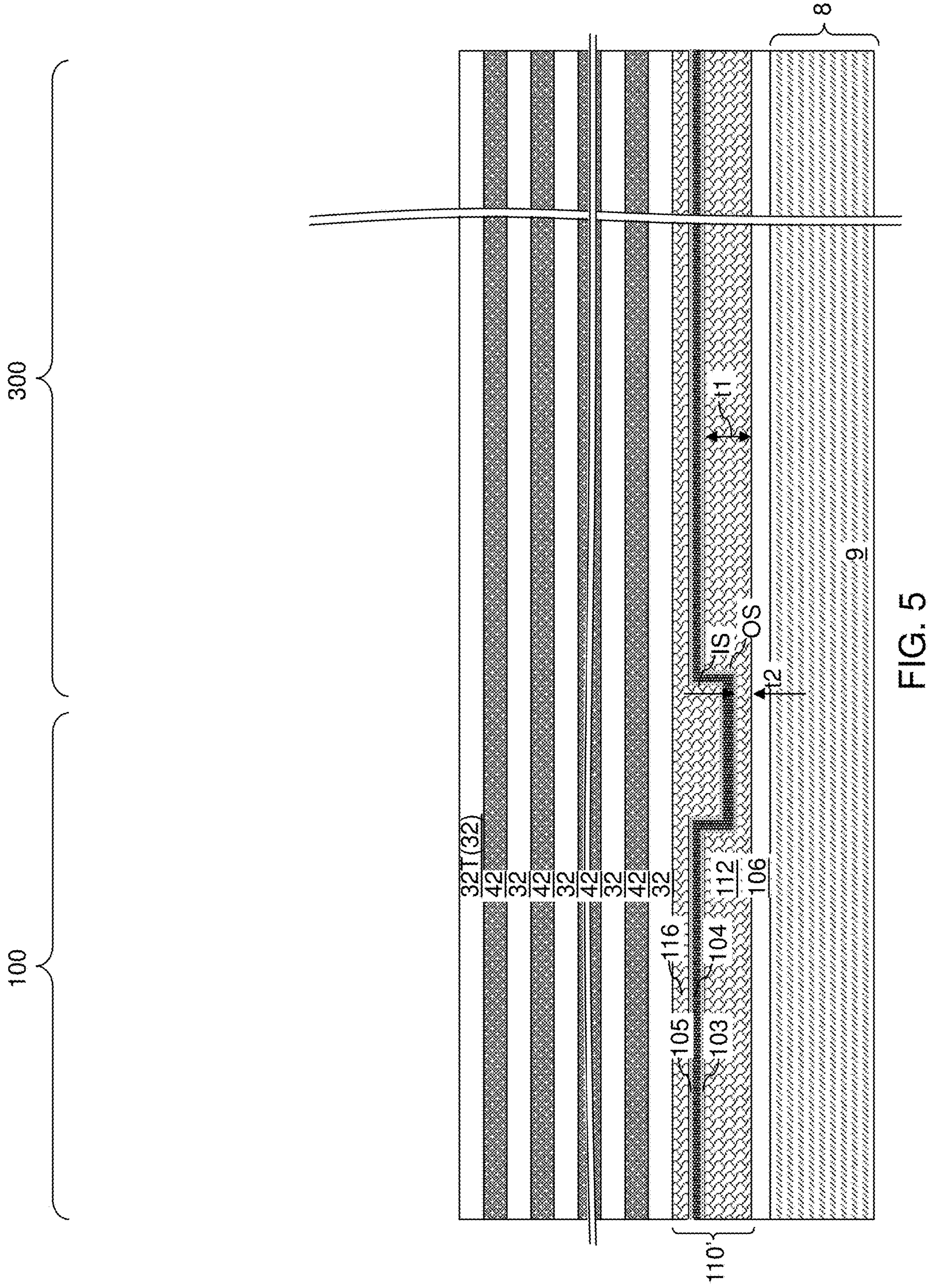
FIG. 5 is a schematic vertical cross-sectional view of the first exemplary structure after formation of an alternating stack of insulating layers and sacrificial material layers according to the first embodiment of the present disclosure.

Referring to FIG. 5, an alternating stack of first material layers and second material layers can be formed over the in-process source-level material layers 110'. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the in-process source-level material layers 110'. The insulating layers 32 comprise an insulating material such as undoped silicate glass or a doped silicate glass, and the sacrificial material layers 42 comprise a sacrificial material, such as silicon nitride or a silicon-germanium alloy. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1.024, such as from 32 to 256, although lesser and greater number of repetitions may also be employed. The topmost one of the insulating layers 32 is hereafter referred to as a topmost insulating layer 32T.

Each of the insulating layers 32 other than the topmost insulating layer 32T may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32. Generally, an alternating stack (32, 42) of insulating layers 32 and sacrificial material layers 42 over the upper source-level semiconductor layer 116. In one embodiment, the entirety of the interface between the upper source-level semiconductor layer 116 and the alternating stack (32, 42) is located within a horizontal plane.

Figure 6:
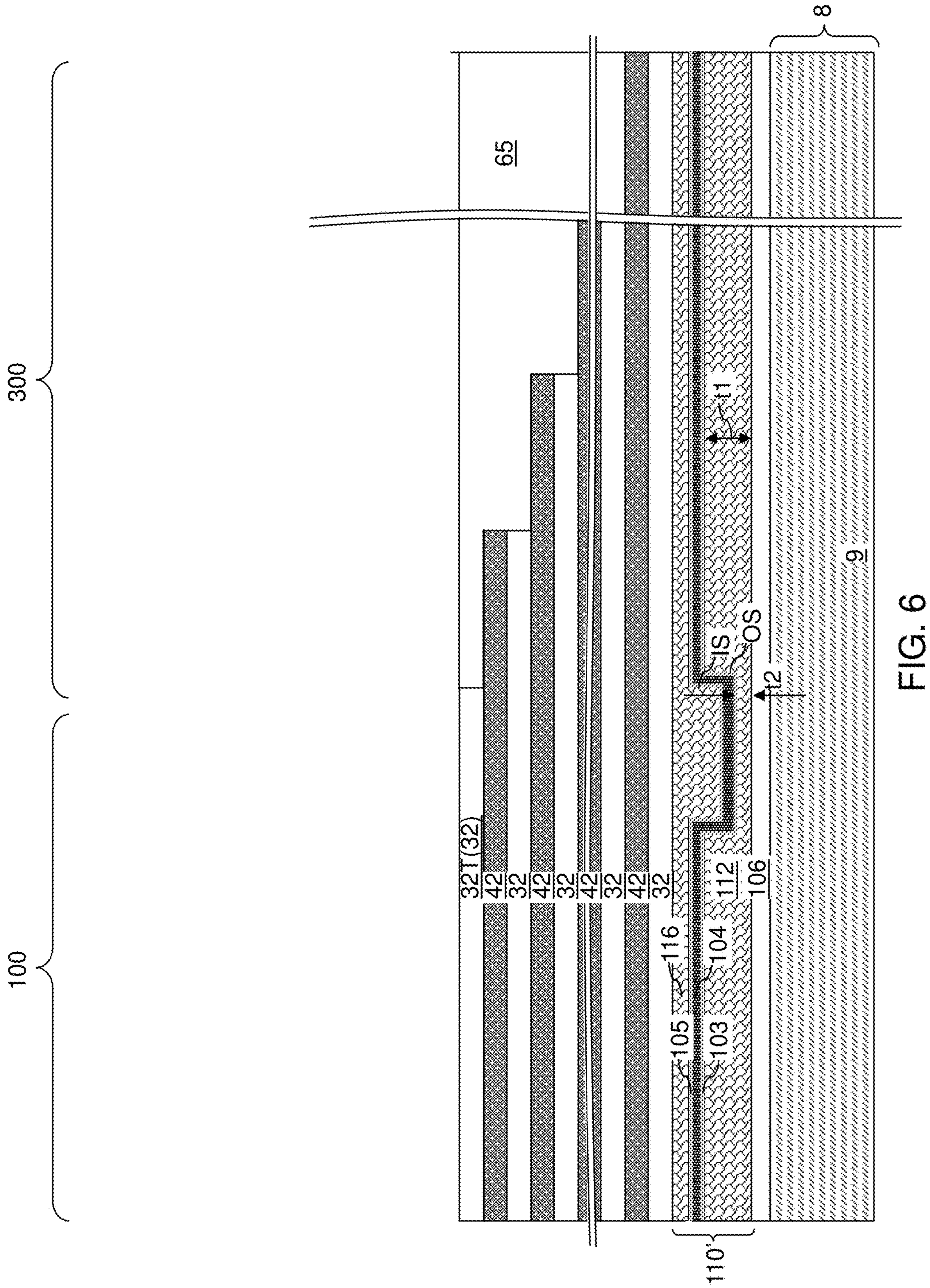
FIG. 6 is a schematic vertical cross-sectional view of the first exemplary structure after formation of stepped surfaces and a retro-stepped dielectric material portion according to the first embodiment of the present disclosure.

Referring to FIG. 6, stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the in-process source-level material layers 110'. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer) to a topmost layer within the alternating stack (32, 42) (such as the topmost insulating layer 32T).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures (not shown) can be formed through the topmost insulating layer 32T and a subset of the sacrificial material layers 42 located at drain-select-levels. The drain-select-level isolation structures can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 7A:
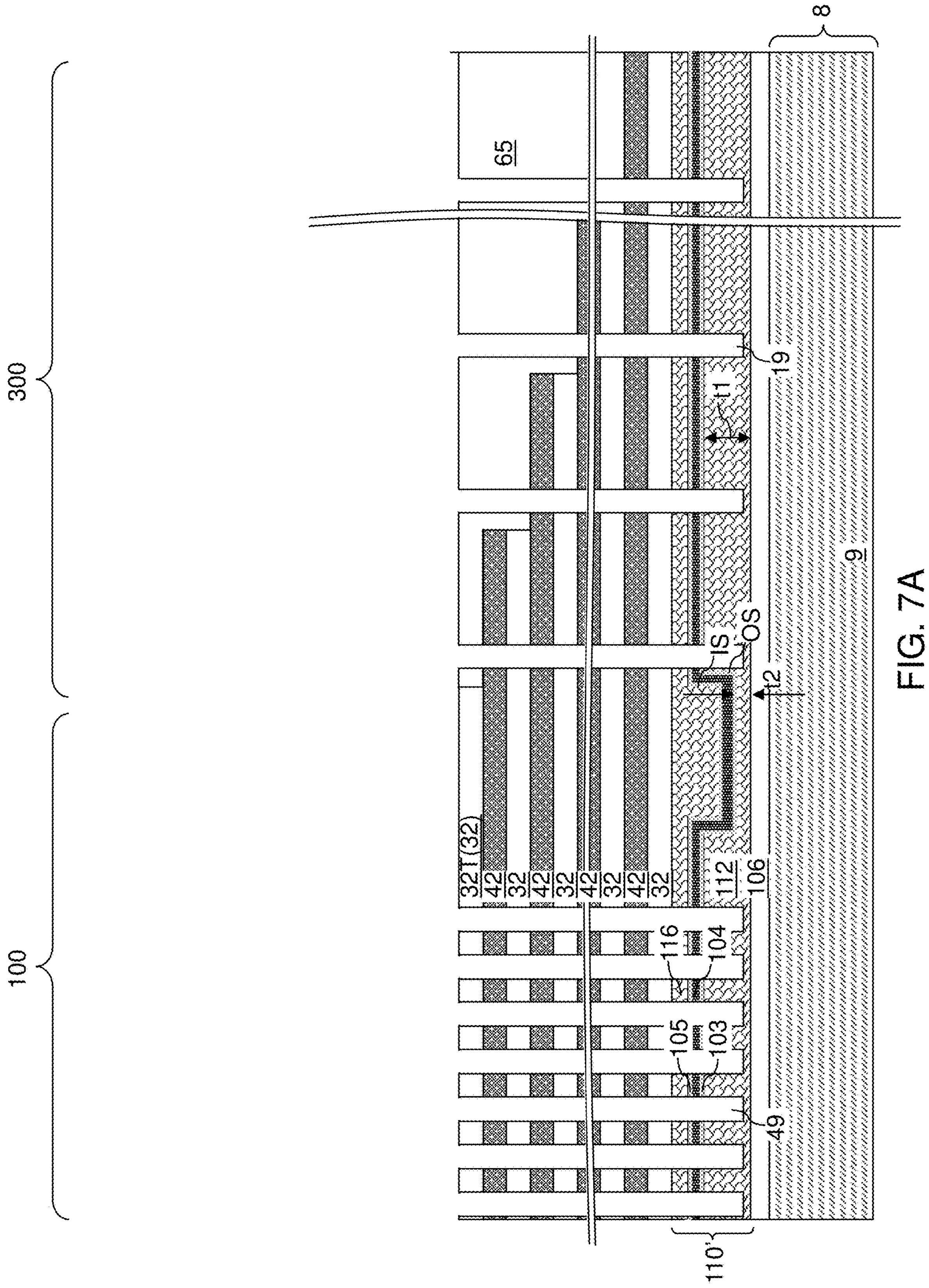
FIG. 7A is a schematic vertical cross-sectional view of the first exemplary structure after forming memory openings and support openings according to the first embodiment of the present disclosure.
Figure 7B:
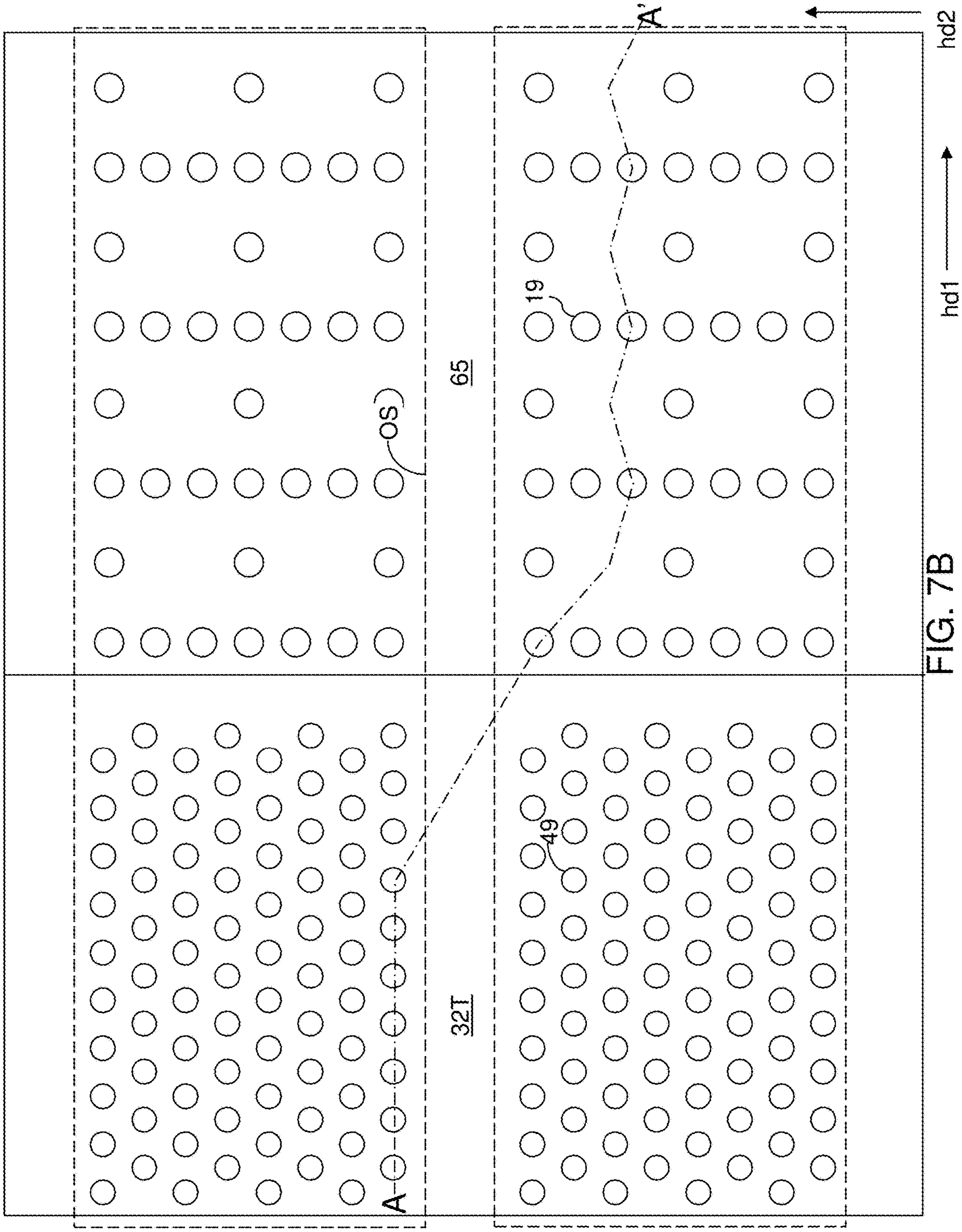
FIG. 7B is a top-down view of the first exemplary structure of FIG. 7A. The hinged vertical plane A-A' is the cut plane of the vertical cross-sectional view of FIG. 7A.

Referring to FIGS. 7A and 7B, an etch mask layer (not shown) can be formed over the alternating stack (32, 42), and can be lithographically patterned to form various openings therein. An anisotropic etch process can be performed to transfer the pattern of the openings in the etch mask layer through the alternating stack (32, 42). Various openings can be formed through the alternating stack (32, 42). The various openings may comprise memory openings 49 that are formed in the memory array region 100 and support openings 19 that are formed in the contact region 300. Each of the memory openings 49 and the support openings 19 can vertically extend through the alternating stack (32, 42) and into the in-process source-level material layers 110' In one embodiment, bottom surfaces of the memory openings 49 and the support openings 19 may be formed within the lower source-level semiconductor layer 112 or at an interface between the lower source-level semiconductor layer and the backside insulating layer 106.

The support openings 19 may have a diameter in a range from 60 nm too 400 nm, such as from 120 nm to 300 nm, although lesser and greater thicknesses may be employed. The memory openings 49 may have a diameter in a range from 60 nm too 400 nm, such as from 120 nm to 300 nm, although lesser and greater thicknesses may be employed. The memory openings 49 and the support openings 19 can be formed through the alternating stack (32, 42), the upper source-level semiconductor layer 116, and the source-level sacrificial layer 104 into the first portions 112A of the lower source-level semiconductor layer 112 having the first thickness.

In one embodiment, the memory array region 100 may be laterally spaced apart from the contact region 300 along a first horizontal direction hd1. The memory openings 49 may comprise rows of memory openings 49 that are arranged along the first horizontal direction hd1 and laterally spaced apart along a second horizontal direction hd2 that is perpendicular to the first horizontal direction hd2. Multiple clusters of memory openings 49, each containing a respective two-dimensional periodic array of memory openings 49, may be formed in the memory array region 100. The clusters of memory openings 49 may be laterally spaced apart along the second horizontal direction hd2 by the areas of the line trenches 5 in the lower source-level semiconductor layer 112.

Each portion of the combination of the optional lower sacrificial liner 103, the source-level sacrificial layer 104, the optional upper sacrificial liner 105 located within a respective line trench 5 within the lower source-level semiconductor layer 112 may have the respective inner sidewall IS that contacts a sidewall of the upper source-level semiconductor layer 116, and may have the respective outer sidewall OS that contacts a sidewall of the lower source-level semiconductor layer 112. Each cluster of memory openings 49 can be formed between a neighboring pair of outer sidewalls OS in a plan view. Likewise, each cluster of support openings 19 can be formed between a neighboring pair of outer sidewalls OS in the plan view.

Figure 8:
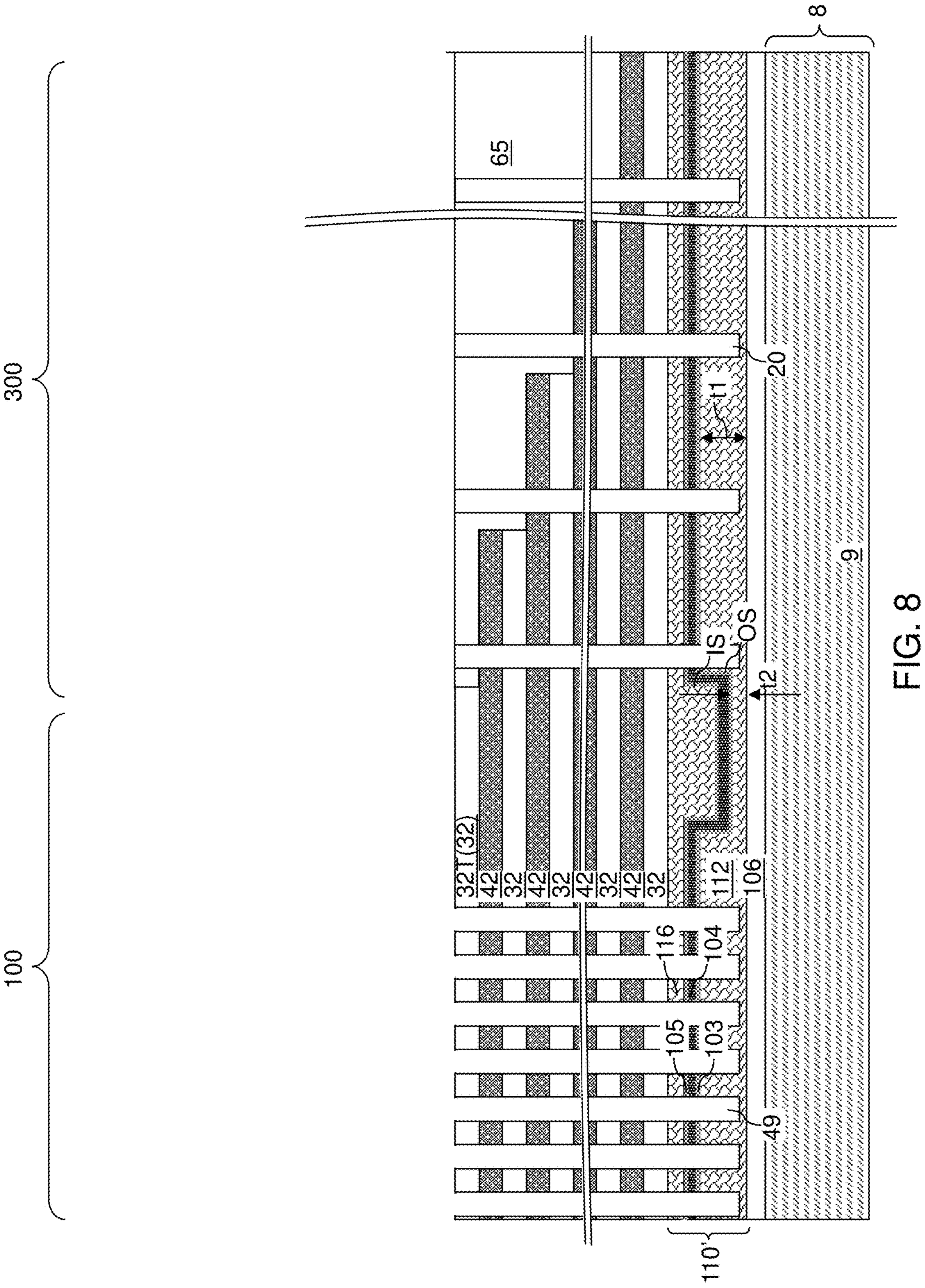
FIG. 8 is a schematic vertical cross-sectional view of the first exemplary structure after formation of support pillar structures according to the first embodiment of the present disclosure.
Figure 9B:
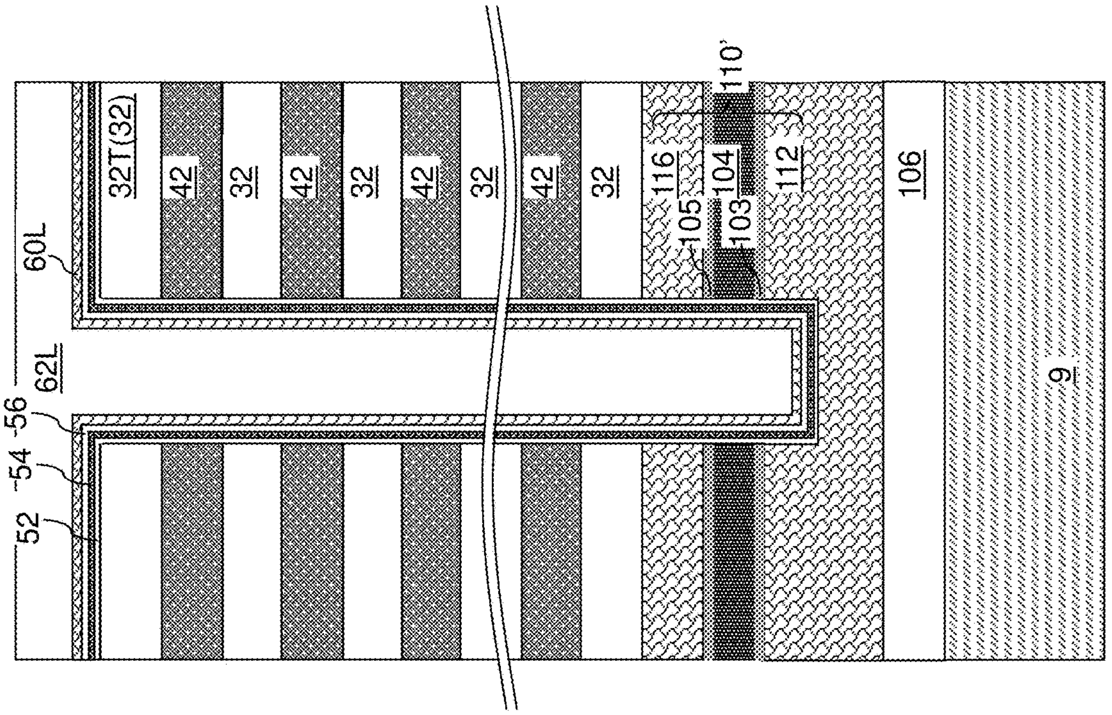
FIGS. 9A-9D are sequential vertical cross-sectional views of a memory opening during formation of a memory opening fill structure according to the first embodiment of the present disclosure.
Figure 9A:
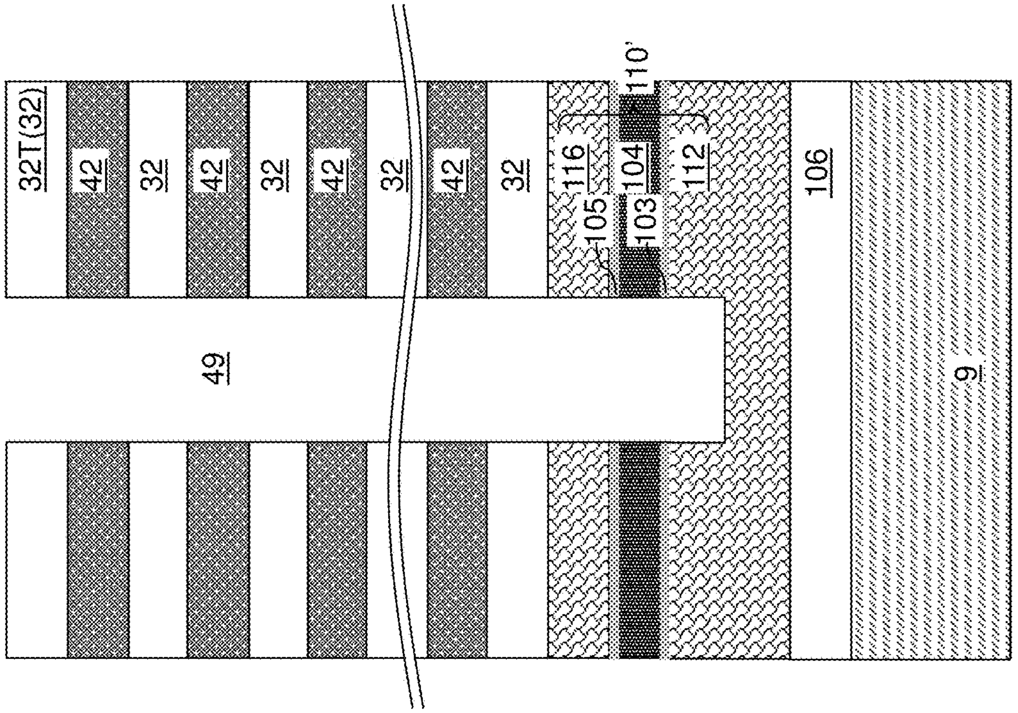
Figure 9D:
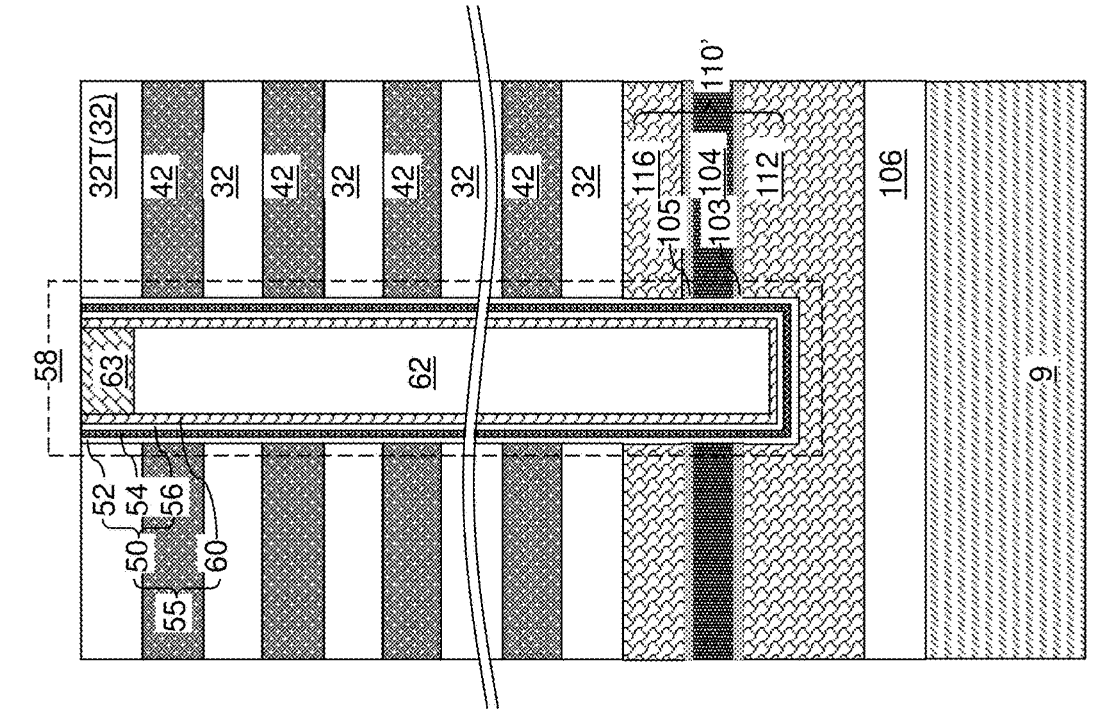
Figure 9C:
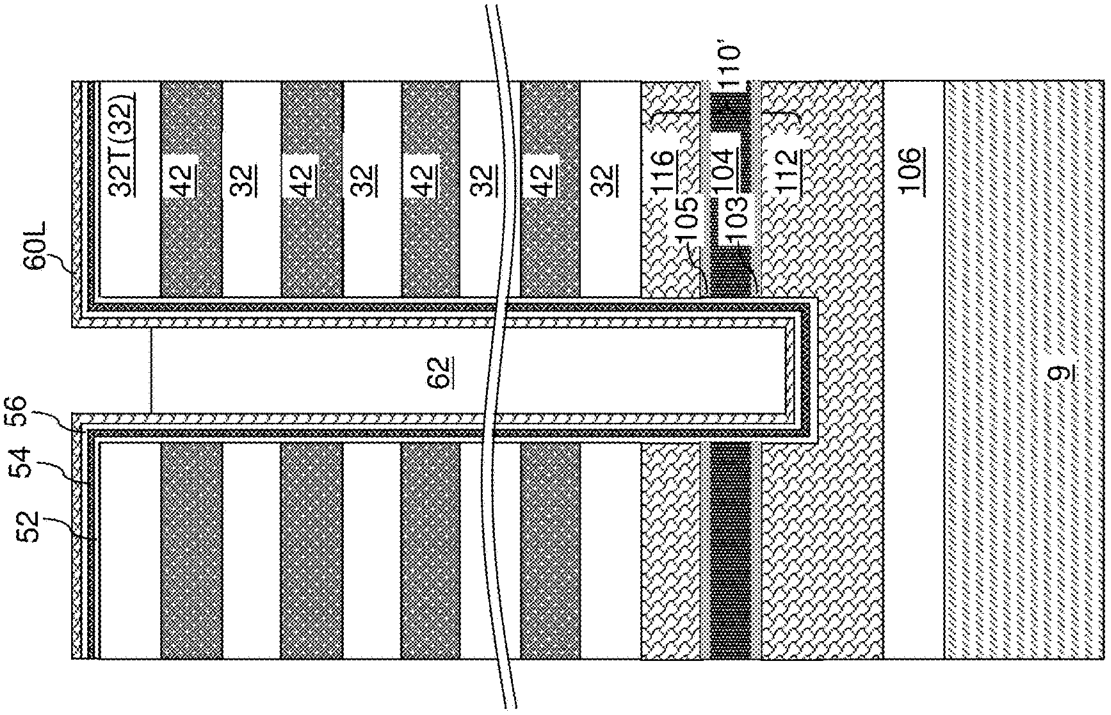

Referring to FIG. 8, an optional etch stop liner (not shown) and a sacrificial fill material (not shown) can be deposited in the memory openings 49 and the support openings. The optional etch stop liner (if present) comprises a thin dielectric material layer comprising silicon oxide, silicon nitride, or a dielectric metal oxide and having a thickness in a range from 1 nm to 6 nm. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material can be removed from above the horizontal plane including the topmost layer of the alternating stack (32, 42) by a planarization process such as an etch back process. Remaining portions of the sacrificial fill material that fill the memory openings 49 and the support openings 19 constitute sacrificial memory opening fill structures (not shown) and sacrificial support opening fill structures (not shown).

A photoresist layer (not shown) can be applied over the alternating stack (32, 42) and the retro-stepped dielectric material portion 65, and can be lithographically patterned to cover the memory array region 100 without covering the contact region 300. The sacrificial support opening fill structures and portions of the optional etch stop liner in the contact region 300 can be removed selective to the materials of the retro-stepped dielectric material portion 65 and the alternating stack (32, 42). For example, an etch process or an ashing process may be employed to remove the sacrificial support opening fill structures and portions of the optional etch stop liner in the contact region 300. The photoresist layer can be subsequently removed.

A dielectric fill material such as silicon oxide can be deposited in the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the retro-stepped dielectric material portion 65 during replacement of the sacrificial material layers 42 with electrically conductive layers.

Subsequently, the sacrificial memory opening fill structures and portions of the optional etch stop liner in the memory array region 100 can be removed selective to the materials of the retro-stepped dielectric material portion 65 and the alternating stack (32, 42). For example, an etch process or an ashing process may be employed to remove the sacrificial memory opening fill structures and portions of the optional etch stop liner in the memory array region 100. Voids are formed in the volumes of the memory openings 49.

Figure 10A:
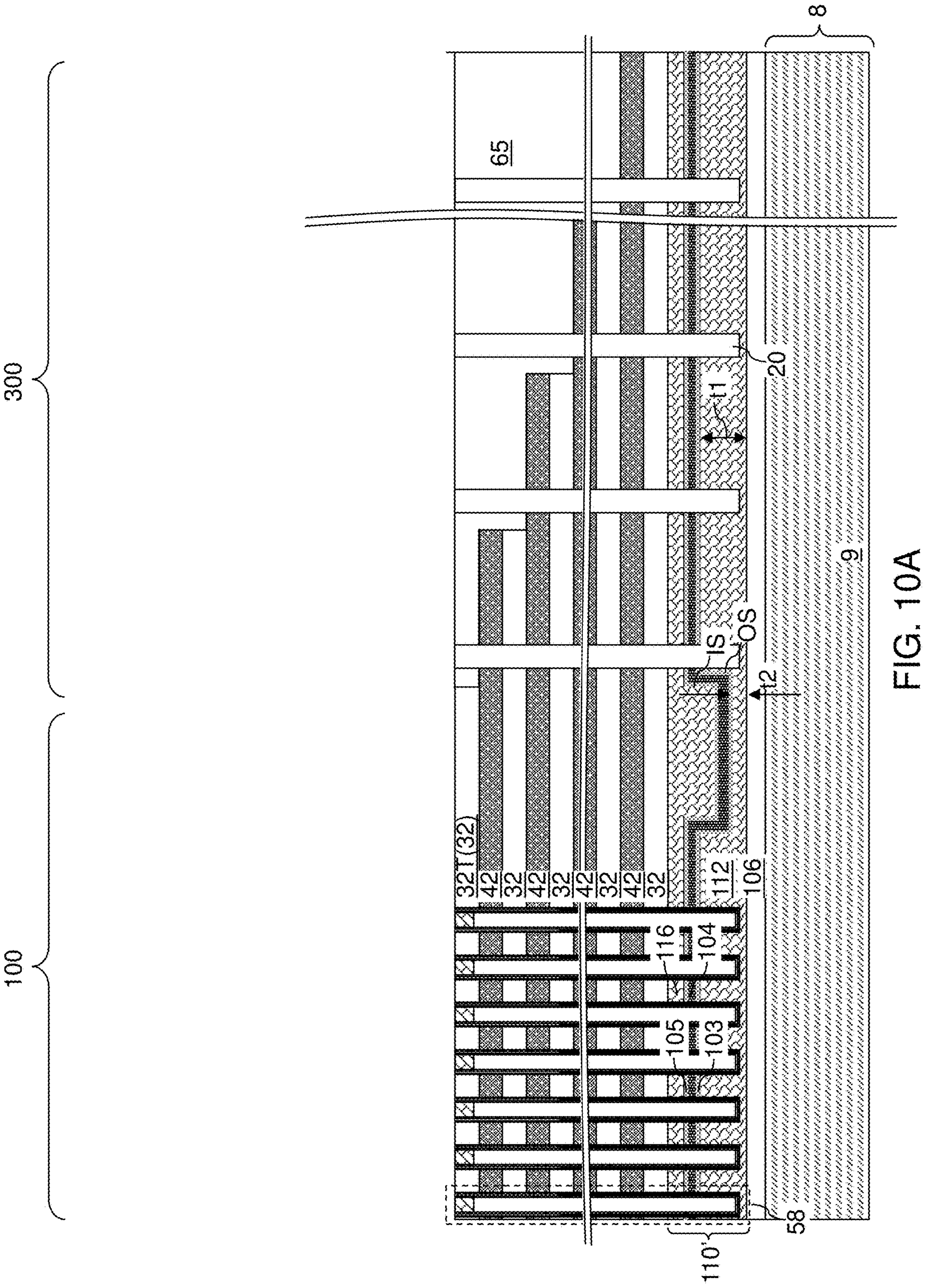
FIG. 10A is a vertical cross-sectional view of the first exemplary structure after formation of memory opening fill structures according to the first embodiment of the present disclosure.
Figure 10B:
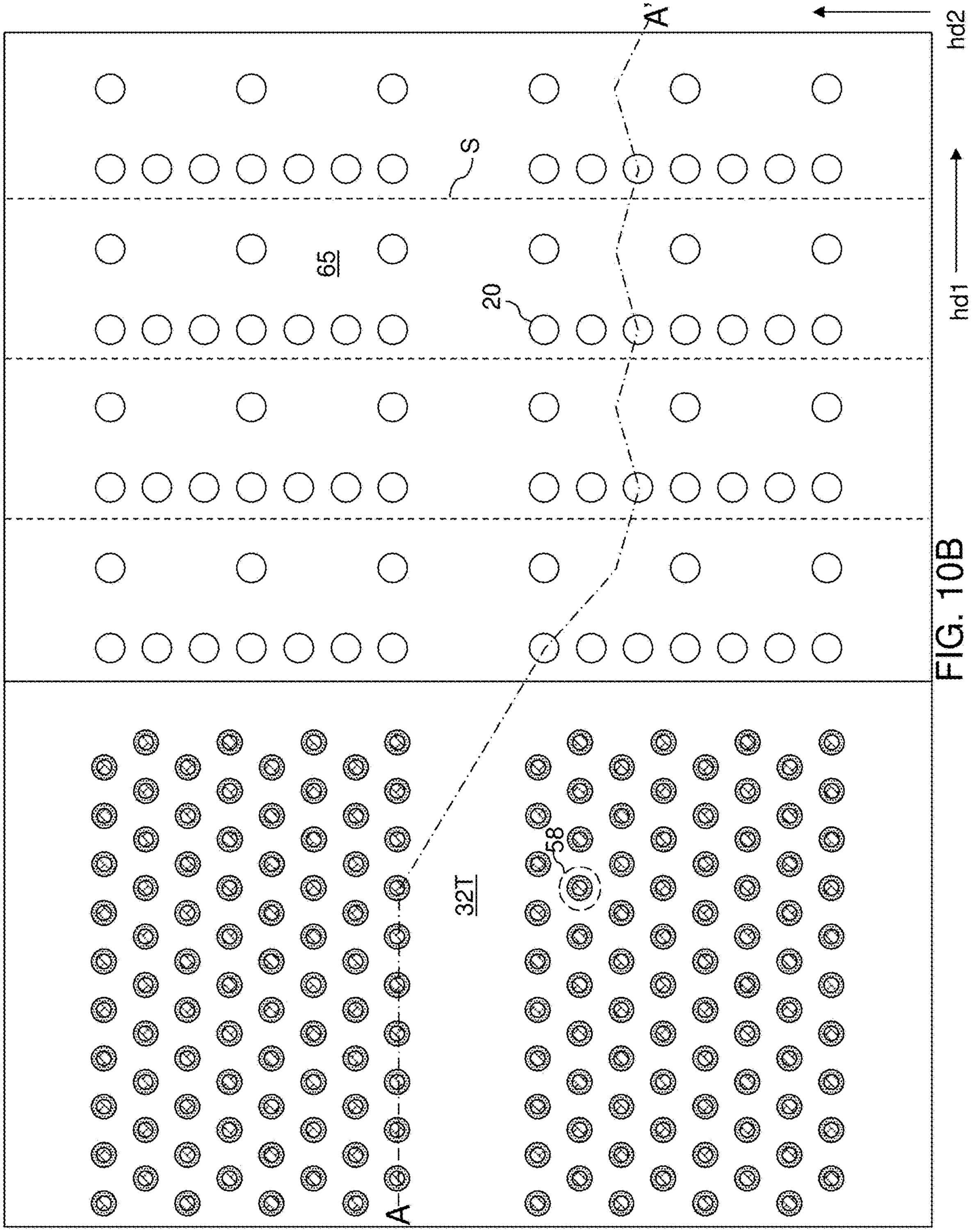
FIG. 10B is a top-down view of the first exemplary structure of FIG. 10A. The hinged vertical plane A-A' is the cut plane of the vertical cross-sectional view of FIG. 10A.

Referring to FIGS. 10A and 10B, the exemplary structure is illustrated after formation of memory opening fill structures 58 within the memory openings 49. Each of the memory opening fill structures 58 may comprise a memory film 50 and a vertical semiconductor layer 60.

Figure 11A:
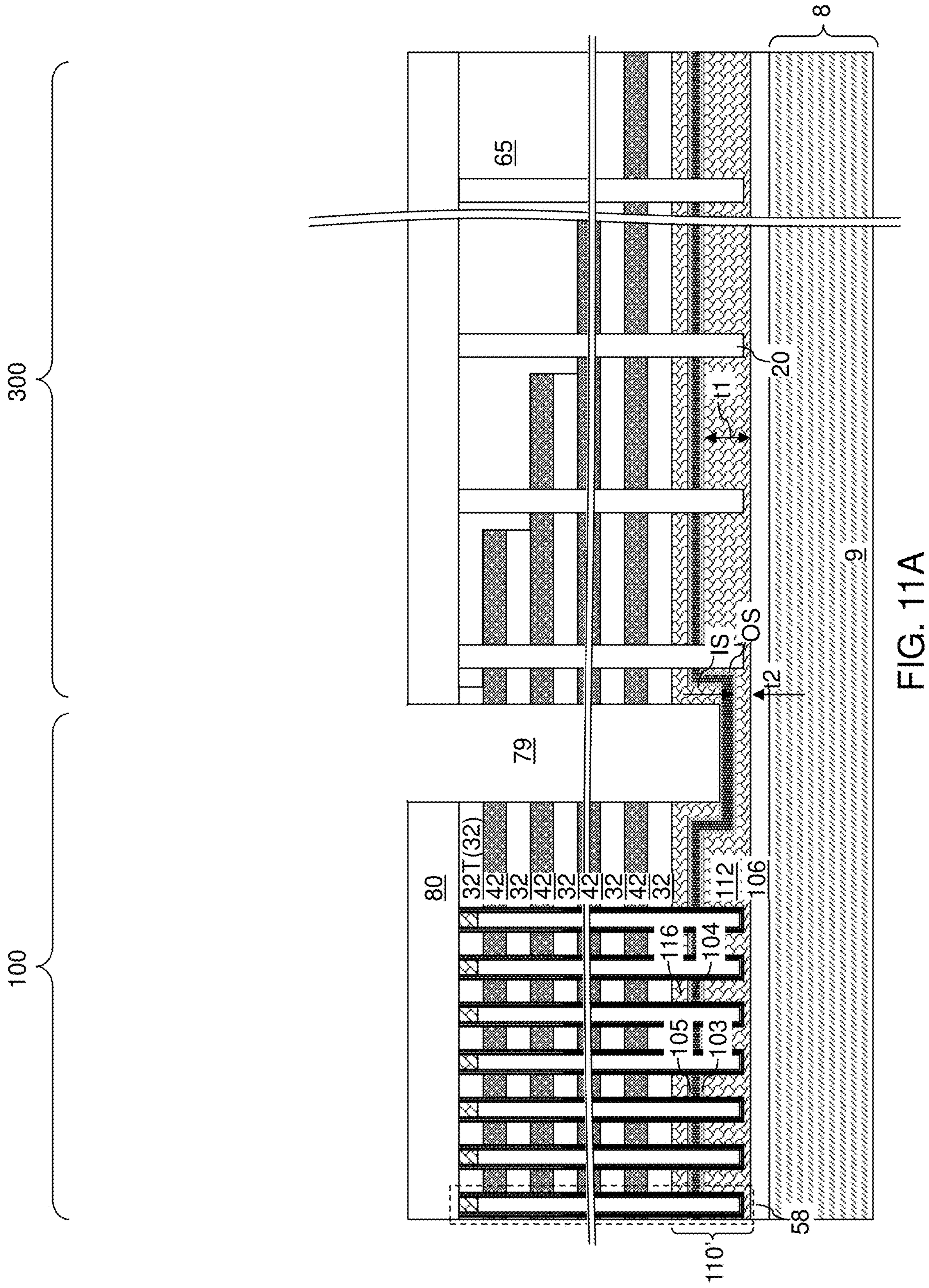
FIG. 11A is a vertical cross-sectional view of the first exemplary structure after formation of lateral isolation trenches according to the first embodiment of the present disclosure.
Figure 11B:
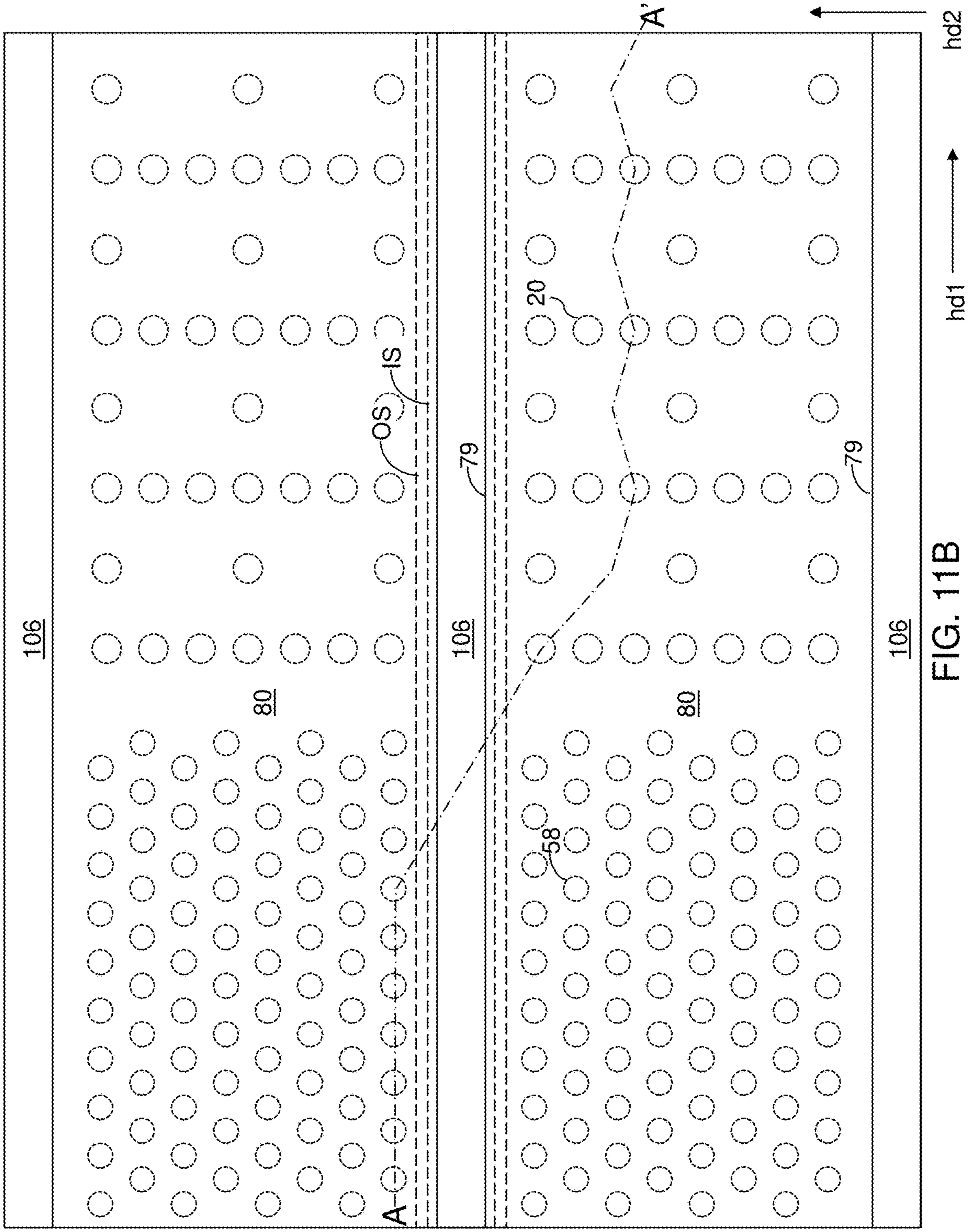
FIG. 11B is a top-down view of the first exemplary structure of FIG. 11A. The hinged vertical plane A-A' is the cut plane of the vertical cross-sectional view of FIG. 11A.

Referring to FIGS. 11A and 11B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stack (32, 42), the retro-stepped dielectric material portion 65, and the upper source-level semiconductor layer 116. A terminal step of the anisotropic etch process may etch the semiconductor material of the upper source-level semiconductor layer 116 selective to the material of the upper sacrificial liner 105.

Lateral isolation trenches 79 laterally extending along the first horizontal direction hd1 can be formed through the alternating stack (32, 42), the retro-stepped dielectric material portion 65, the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the backside insulating layer 106 to the top surface of the contact-level dielectric layer 80. A top surface of the backside insulating layer 106 can be physically exposed underneath each lateral isolation trench 79. The lateral isolation trenches 79 isolate adjacent blocks (e.g., 102 and/or 104) from each other along the second horizontal (i.e., bit line) direction hd2. The photoresist layer can be subsequently removed, for example, by ashing.

Lateral isolation trenches 79 are formed through the alternating stack (32, 42) and the upper source-level semiconductor layer 116 over the second portions 112B of the lower source-level semiconductor layer 112. In one embodiment, each lateral isolation trench 79 may be formed within an area that is laterally bounded by a respective pair of inner sidewalls IS of the second portion 116B of the upper source-level semiconductor layer 116. Thus, each lateral isolation trench 79 may be formed entirely within an area of a respective line trench 5 in a plan view along a vertical direction.

Figure 12:
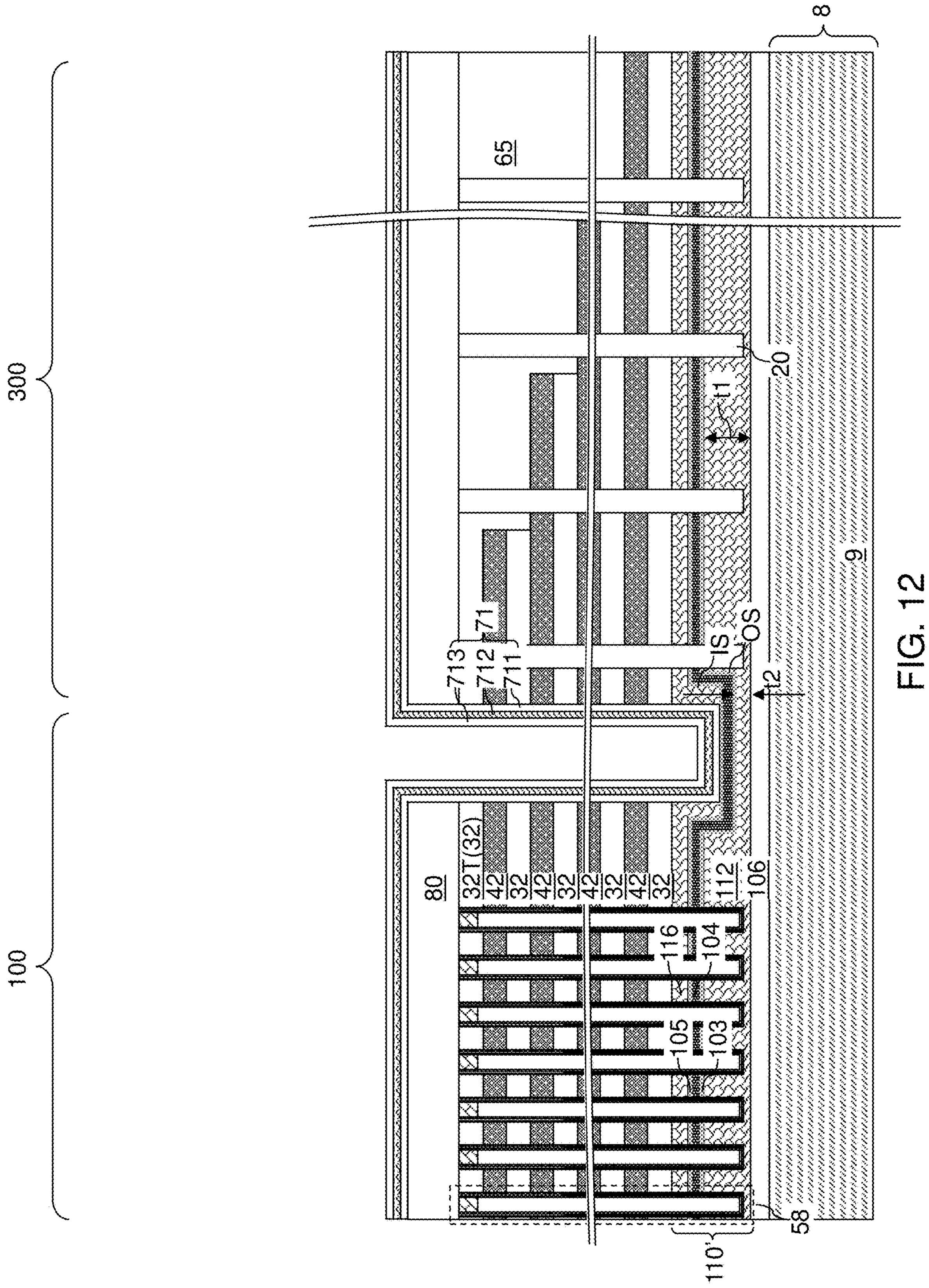
FIG. 12 is a vertical cross-sectional view of the first exemplary structure after formation of sacrificial spacer layers according to the first embodiment of the present disclosure.

Referring to FIG. 12, sacrificial spacer layers 71 can be conformally deposited in peripheral regions of the lateral isolation trenches 79 and above the contact-level dielectric layer 80. In one embodiment, the sacrificial spacer layers 71 may comprise a first sacrificial spacer layer 711, a second sacrificial spacer layer 712, and a third sacrificial spacer layer 713. Each of the sacrificial spacer layers 71 may comprise a respective sacrificial spacer material that can be employed to prevent etching of the sacrificial material layers 42 during replacement of the source-level sacrificial layer 104 with a source contact layer. In an illustrative example, the first sacrificial spacer layer 711 may comprise a first silicon oxide material, the second sacrificial spacer layer 712 may comprise a semiconductor material, such as amorphous silicon, and the third sacrificial spacer layer 713 may comprise a second silicon oxide material. Each of the first, second, and third sacrificial spacer layers (711, 712, 713) may have a respective thickness in a range from 10 nm to 50 nm, such as from 15 nm to 30 nm, although lesser and greater thicknesses may also be employed.

Figure 13:
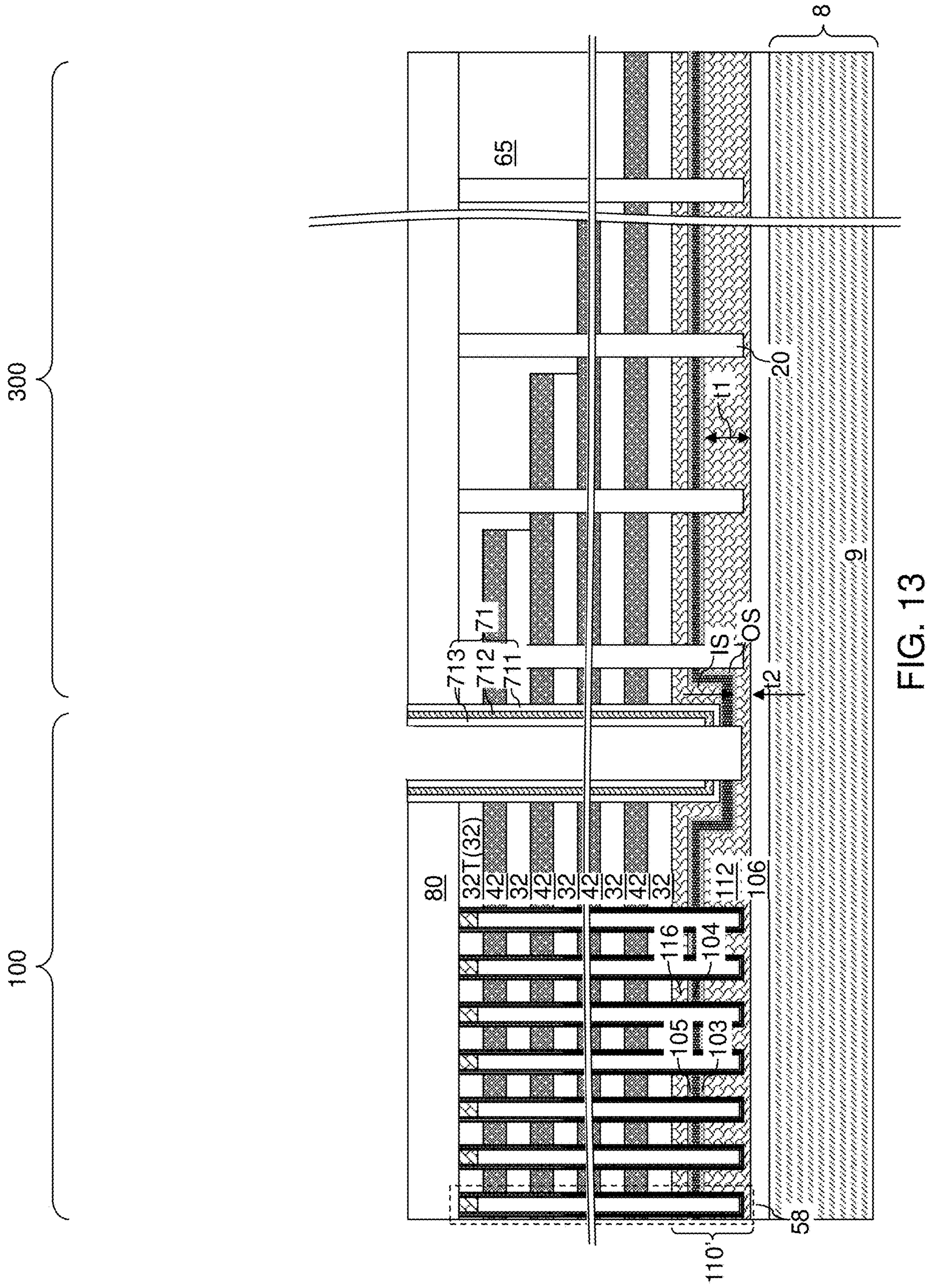
FIG. 13 is a vertical cross-sectional view of the first exemplary structure after removal of horizontally-extending portions of the sacrificial spacer layers according to the first embodiment of the present disclosure.

Referring to FIG. 13, an anisotropic etch process can be performed to etch horizontally-extending portions of the sacrificial spacer layers 71. The anisotropic etch process may be extended to etch through portions of the optional upper sacrificial liner 105, the source-level sacrificial layer 104, and the optional lower sacrificial liner 103, and optionally to etch into the second portion 112B of the lower source-level semiconductor layer 112 that underlie the voids within the lateral isolation trenches 79. Each remaining portion of the sacrificial spacer layers 71 in the lateral isolation trenches 79 may have a tubular configuration, and may vertically extend through the entirety of the alternating stacks (32, 42).

Figure 14A:
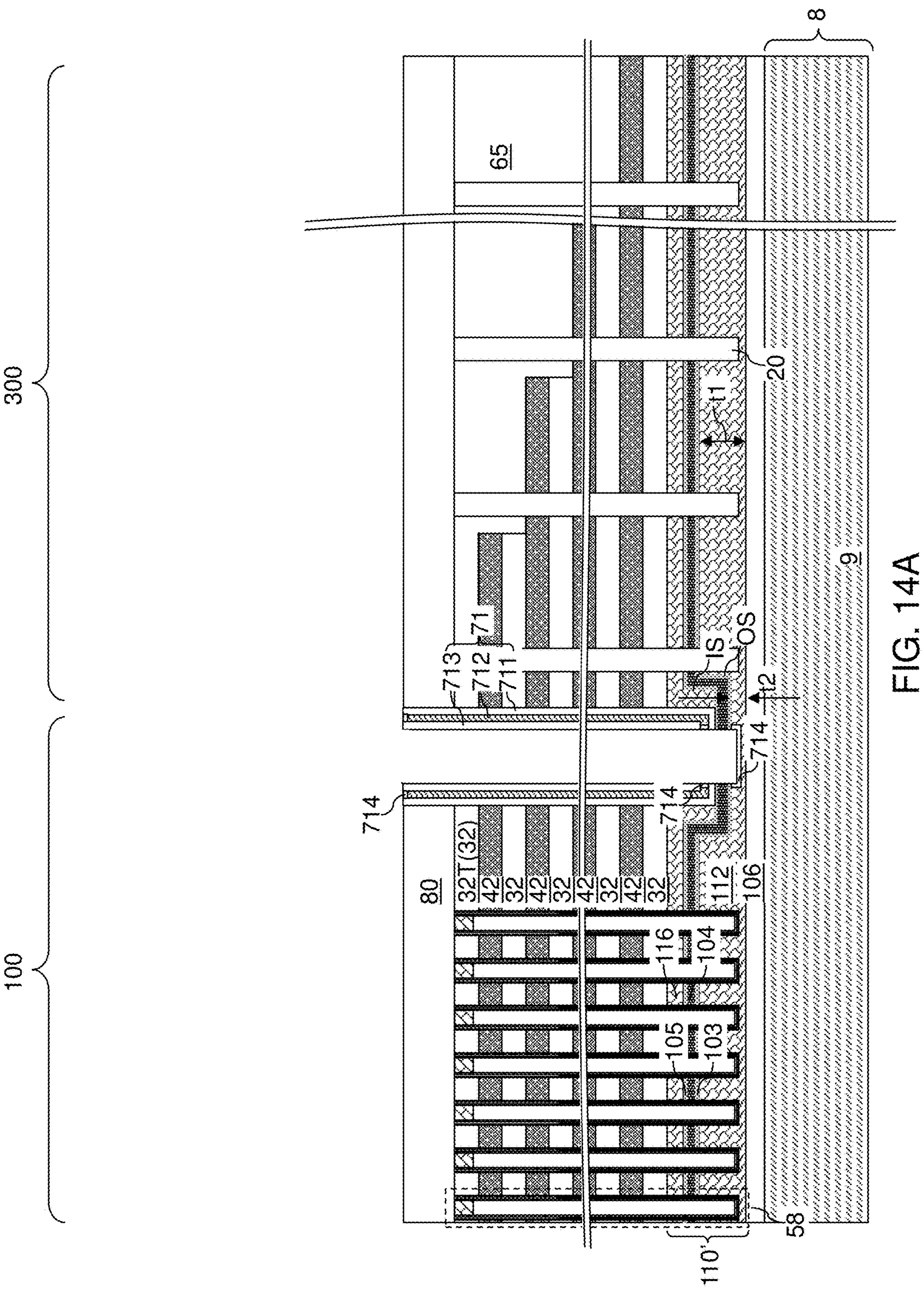
FIG. 14A is a vertical cross-sectional view of the first exemplary structure after formation of sacrificial semiconductor oxide liners according to the first embodiment of the present disclosure.
Figure 14B:
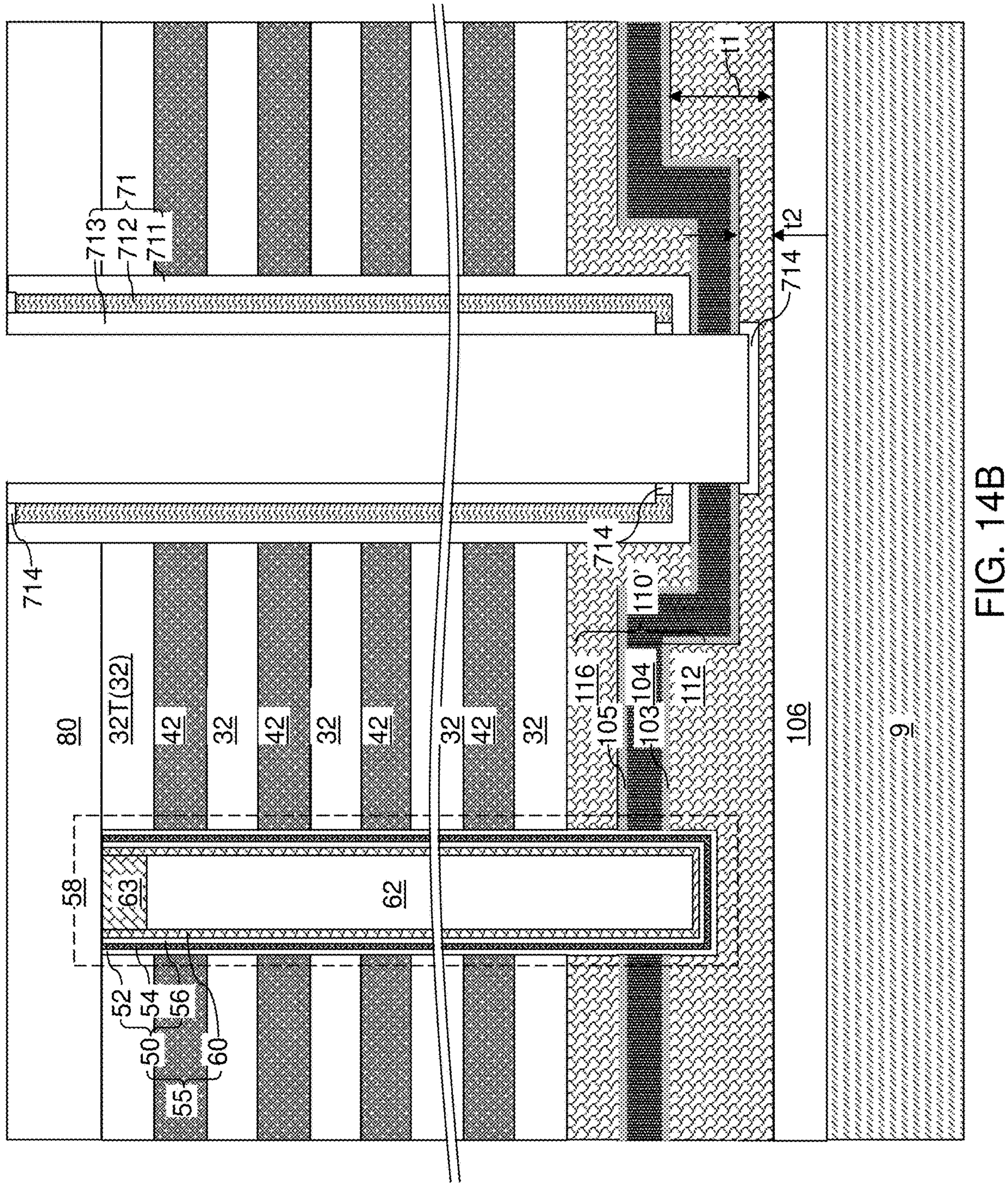
FIG. 14B is a magnified view of a region of the first exemplary structure of FIG. 14A.

Referring to FIGS. 14A and 14B, an oxidation process (such as a thermal oxidation process or a plasma oxidation process) may be performed to convert physically exposed surface portions of the semiconductor material potions (112B, 712) into sacrificial semiconductor oxide (e.g., silicon oxide) liners 714.

Figure 15A:
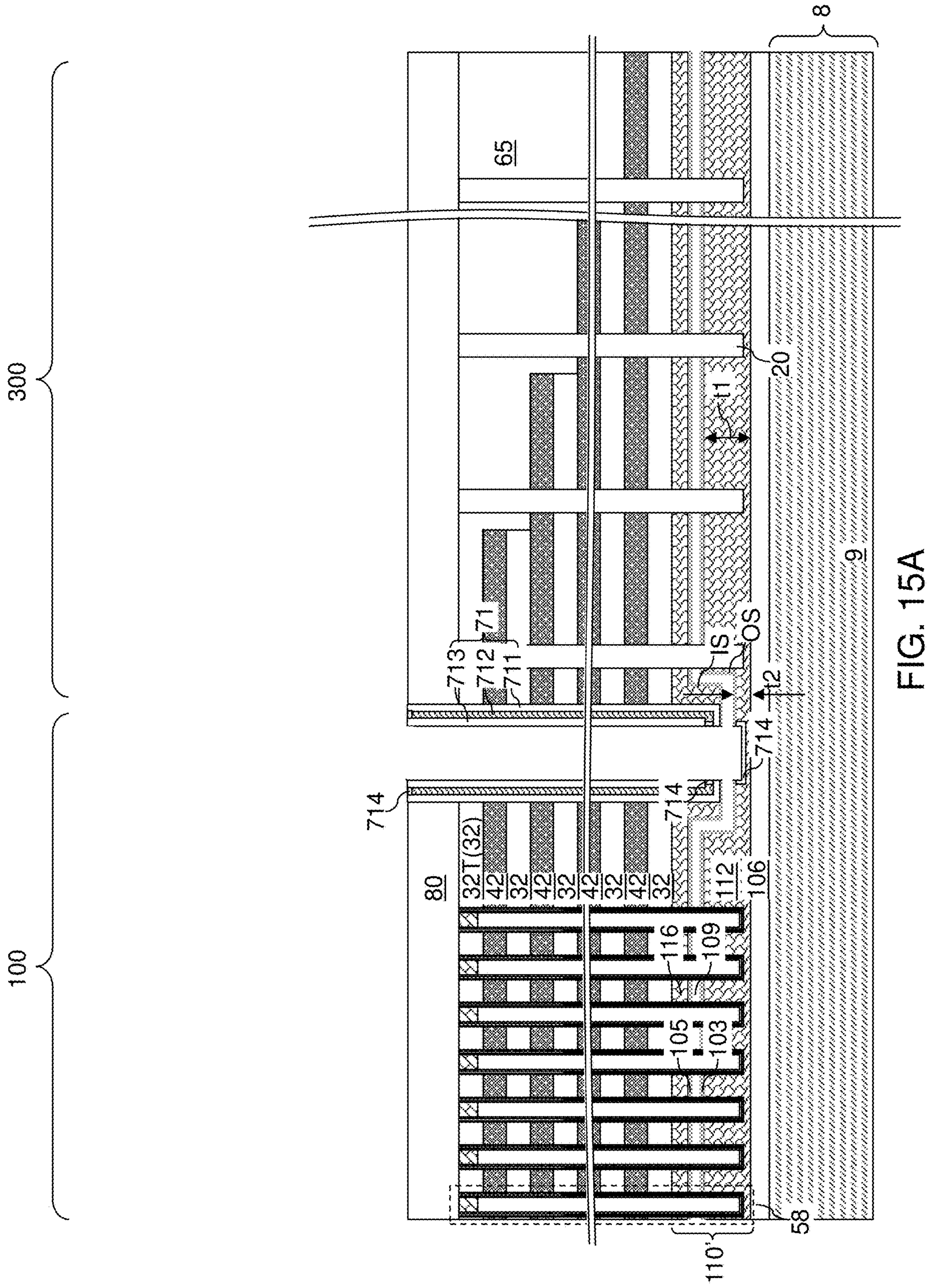
FIG. 15A is a vertical cross-sectional view of the first exemplary structure after formation of a source cavity according to the first embodiment of the present disclosure.
Figure 15B:
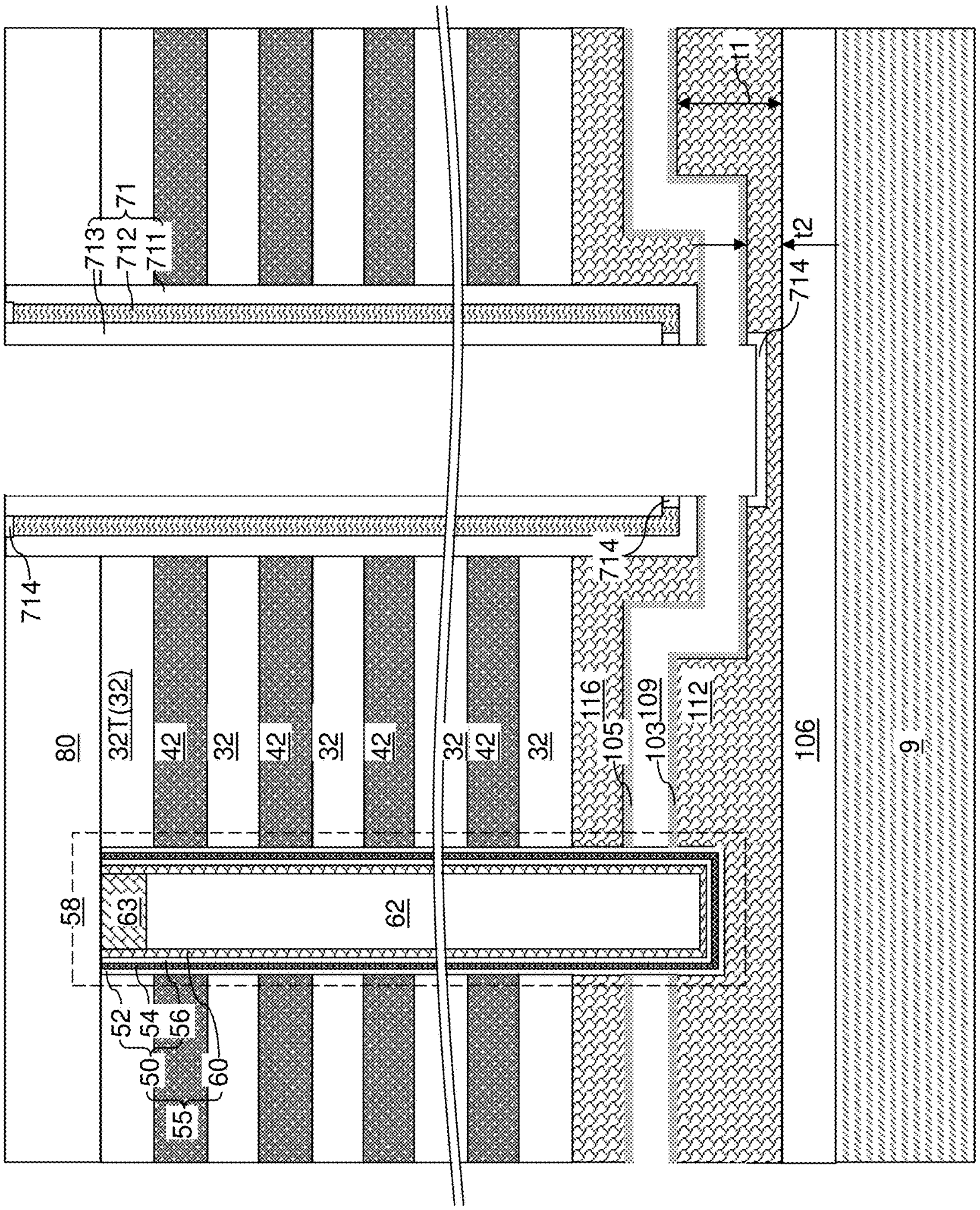
FIG. 15B is a magnified view of a region of the first exemplary structure of FIG. 15A.

Referring to FIGS. 15A and 15B, an etchant that etches the material of the source-level sacrificial layer 104 selective to the materials of the alternating stack (32, 42), the contact-level dielectric layer 80, the retro-stepped dielectric material portion 65, the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 comprises silicon nitride, a wet etch process using hot phosphoric acid may be used to remove the source-level sacrificial layer 104 selective to the alternating stack (32, 42), the contact-level dielectric layer 80, the retro-stepped dielectric material portion 65, the liners 714, the lower source-level semiconductor layer 112, and the upper source-level semiconductor layer 116. A source cavity 109 is formed in the volume from which the source-level sacrificial layer 104 is removed.

FIGS. 16A-16F are sequential vertical cross-sectional views of a region of the first exemplary structure during replacement of a source-level sacrificial layer with a source contact layer 114 and a source-level dielectric fill layer and replacement of the sacrificial material layers 42 with electrically conductive layers 46 according to the first embodiment of the present disclosure.

Figure 16A:
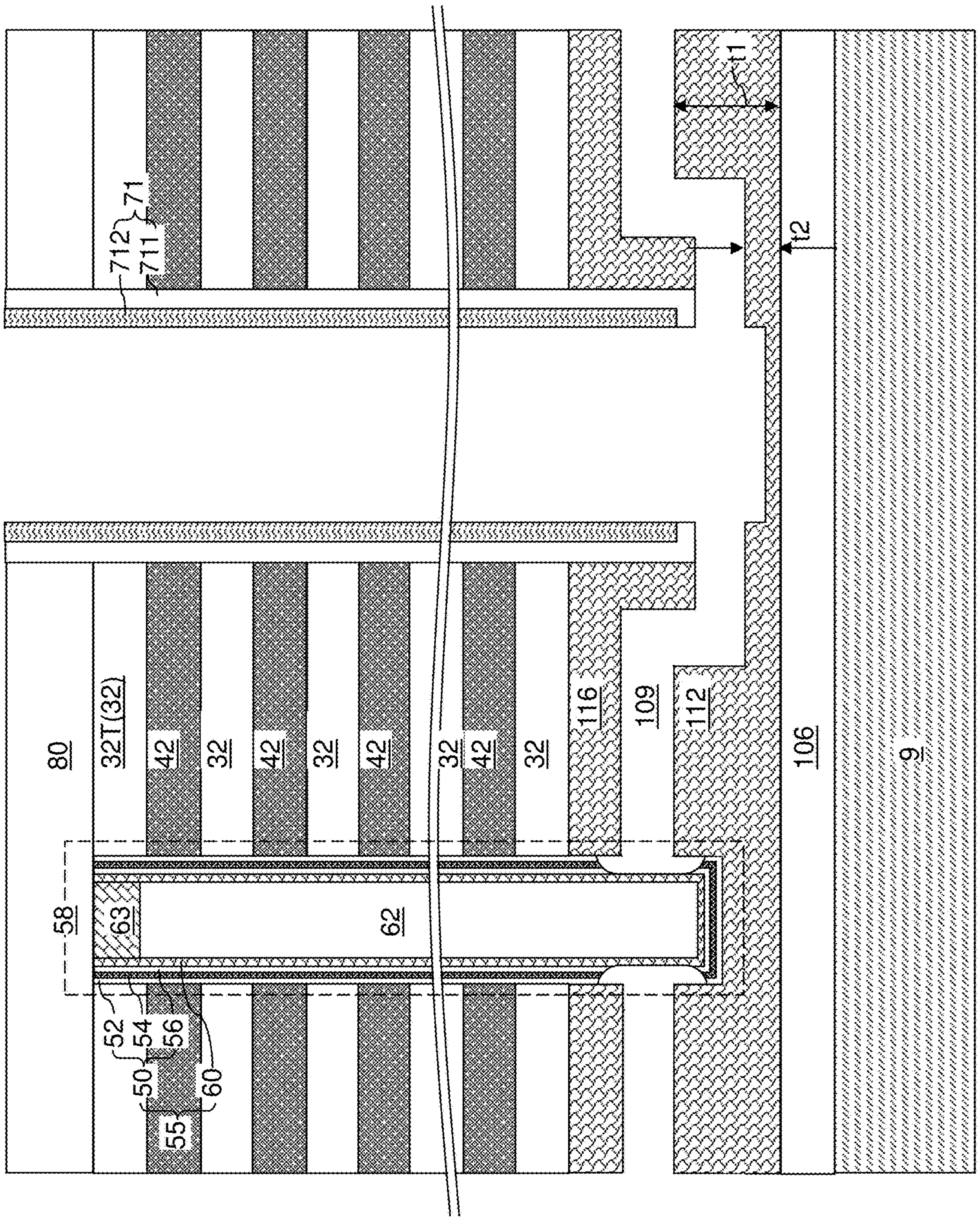
FIGS. 16A-16F are sequential vertical cross-sectional views of a region of the first exemplary structure during replacement of a source-level sacrificial layer with a source contact layer and a source-level dielectric fill layer and replacement of the sacrificial material layers with electrically conductive layers according to the first embodiment of the present disclosure.

Referring to FIG. 16A, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor layers 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor layers 60.

Figure 16B:
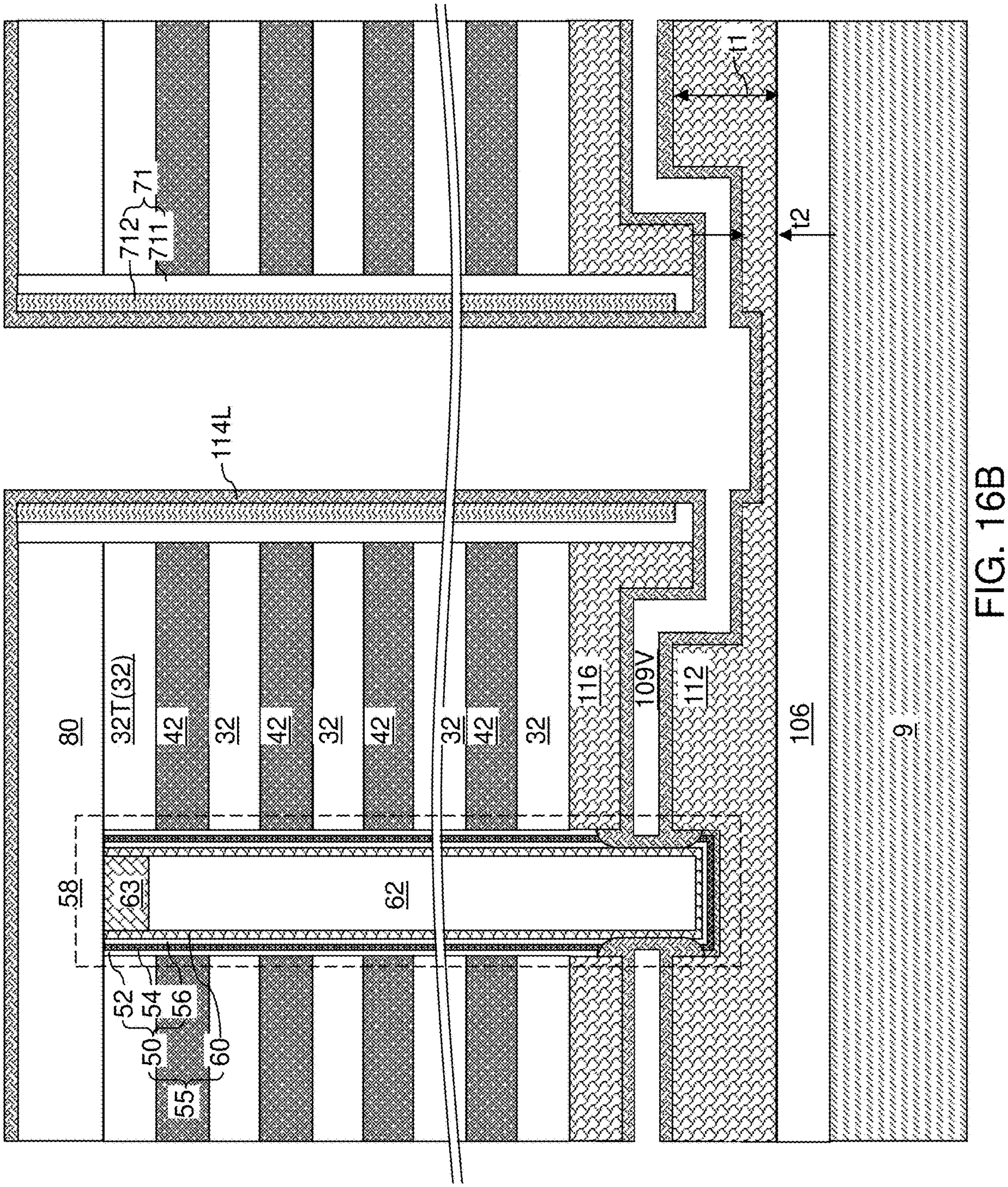

Referring to FIG. 16B, a semiconductor material having a doping of the second conductivity type may be deposited on the physically exposed semiconductor surfaces around the source cavity 109. The physically exposed semiconductor surfaces include bottom portions of outer sidewalls of the vertical semiconductor layers 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor layers 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process or by a non-selective conformal semiconductor deposition process. The deposited doped semiconductor material forms a source contact material layer 114L, which may contact sidewalls of the vertical semiconductor layers 60. The atomic concentration of the dopants of the second conductivity type in the deposited semiconductor material may be in a range from $1.0\times10^{19}/cm^3$ to $2.0\times10^{21}/cm^3$, such as from $2.0\times10^{19}/cm^3$ to $8.0\times10^{20}/cm^3$. In one embodiment, the source contact material layer 114L may be formed as a conformal doped semiconductor layer, and may have a thickness that is less than one half of the thickness of the source cavity 109. In this case, a laterally-extending void 109V may be present within the volume of the source cavity 109 after formation of the source contact material layer 114L.

Figure 16C:
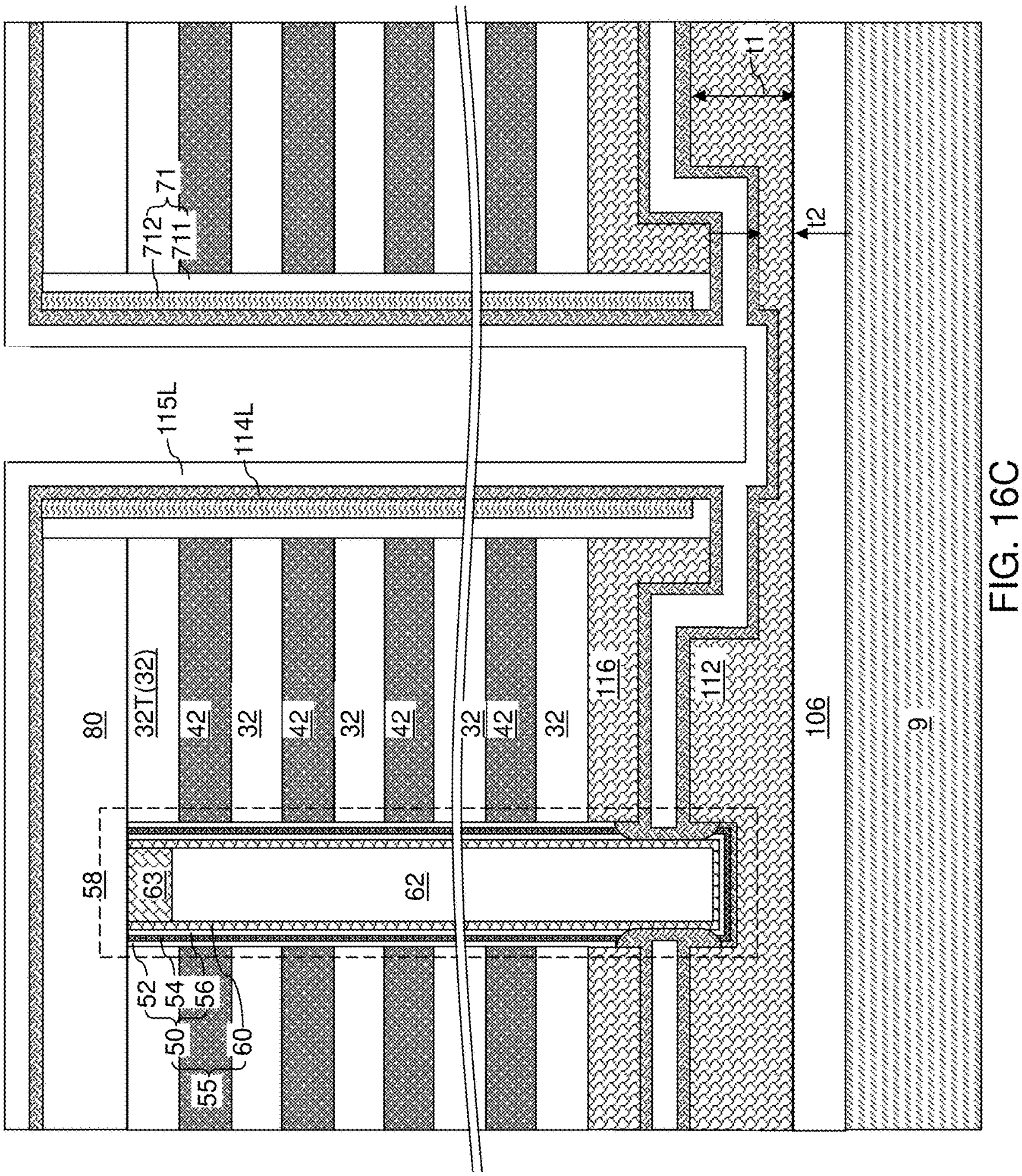

Referring to FIG. 16C, an insulating fill material, such as silicon oxide, may be conformally deposited in the laterally-extending void 109V in the volume of the source cavity 109 to form an insulating fill material layer 115L.

Figure 16D:
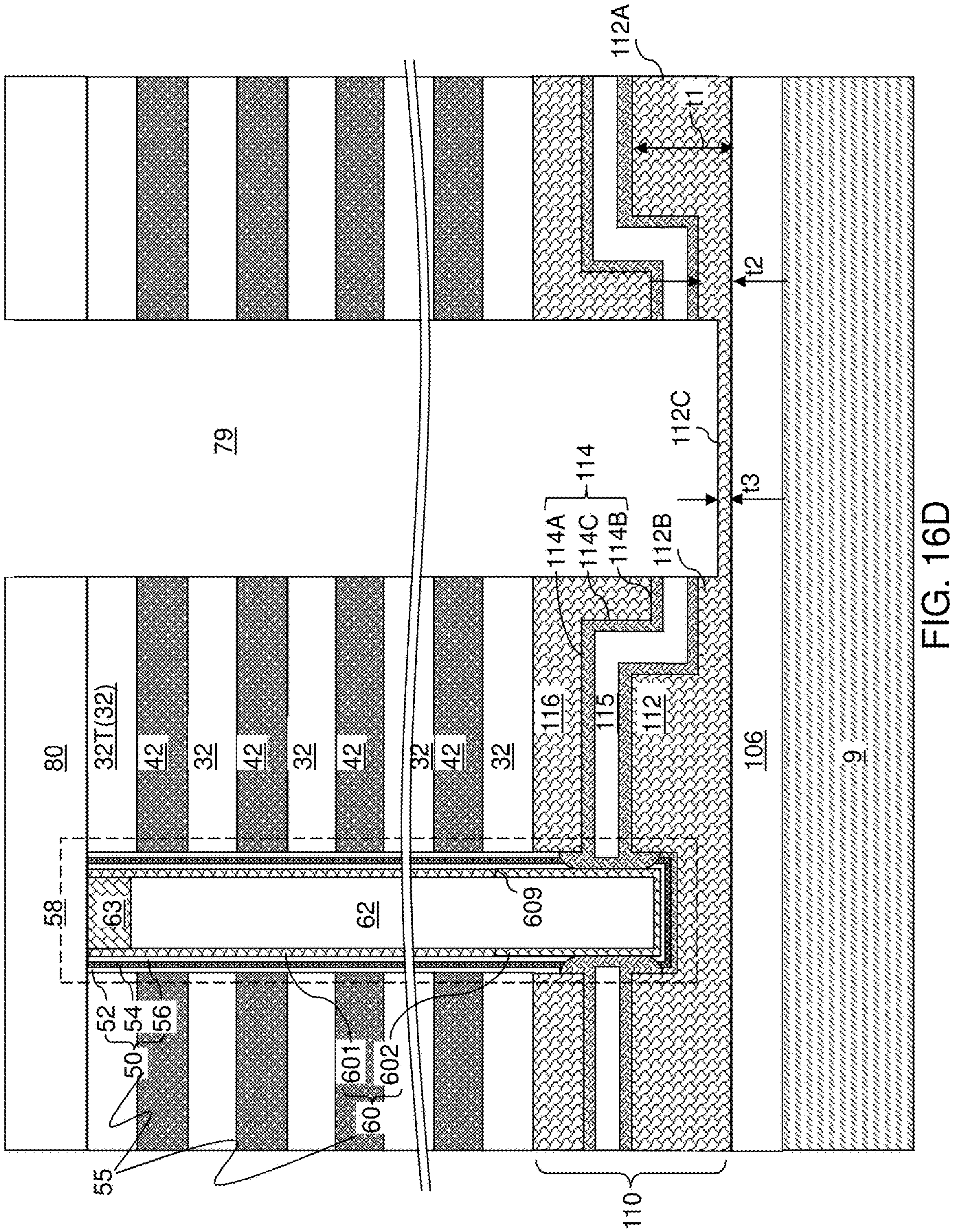

Referring to FIG. 16D, at least one etch back process can be performed to remove potions of the insulating fill material layer 115L, the source contact material layer 114L, and the sacrificial spacer layers 71 from within the volumes of the lateral isolation trenches 79 and from above the top surface of the contact-level dielectric layer 80. In one embodiment, an anisotropic etch process may be performed to remove portions of the insulating fill material layer 115L, the source contact material layer 114L, and the sacrificial spacer layers 71 from within the volumes of the lateral isolation trenches 79. In this case, each third portion 112C of the lower source-level material layer 112 that underlies a respective lateral isolation trench 79 may have a third thickness t3 that is less than the second thickness t2. Each remaining portion of the source contact material layer 114L constitutes a source contact layer 114. Each remaining portion of the insulating fill material layer 115L constitutes an insulating fill layer 115. In one embodiment, a sidewall of an insulating fill layer 115 may be vertically coincident with an overlying sidewall and an underlying sidewall of a source contact layer 114 around a bottom portion of a respective lateral isolation trench 79.

In one embodiment, each source contact layer 114 comprises: a first horizontally extending portion 114A overlying and in contact with the first portion 112A of the lower source-level semiconductor layer 112; a second horizontally-extending portion 114B overlying and in contact with the second portion 112B of the lower source-level semiconductor layer 112; and a vertically-extending portion 114C connecting the first horizontally-extending portion 114A and the second horizontally-extending portion 114B. In one embodiment, the vertically-extending portion of the source contact layer 114 contacts a sidewall of a first portion of the lower source-level semiconductor layer 112 having the first thickness.

In summary, the source-level sacrificial layer 104 is replaced with at least a source contact layer 114 by providing an etchant that etches the source-level sacrificial layer 104 through the lateral isolation trench 79 and by providing a reactant that deposits the source contact layer 114 through the lateral isolation trench 79. Each memory film 50 is in contact with a sidewall of the upper source-level semiconductor layer 116, and each vertical semiconductor layer 60 is laterally spaced from the upper source-level semiconductor layer 116 by the memory film 50.

The combination of the lower source-level semiconductor layer 112, the source contact layer 114, the optional insulating fill layer 115, and the upper source-level semiconductor layer 116 constitutes a source-level material layer 110. In one embodiment, the insulating fill layer 115 is surrounded by the source contact layer 114. The lower source-level semiconductor layer 112 comprises a first portion 112A having a first thickness t1 and a second portion 112B having a second thickness t2 that is less than the first thickness t1, and third second portion 112C having a third thickness t3 that is less than the second thickness t2.

Subsequently, an anneal process can be performed to diffuse dopants of the second conductivity type (e.g., n-type dopants, such as phosphorus) from the source contact layer 114 upward into a bottom end portion of each vertical semiconductor layer 60. A p-n junction 609 is formed within each vertical semiconductor layer 60. In one embodiment, the p-n junction 609 may be formed above the horizontal plane including the top surface of the upper source-level semiconductor layer 116. In one embodiment, the p-n junction 609 may be formed at the level of a bottommost insulating layer 32, or may be formed at the level of the bottommost sacrificial material layer 42. In one embodiment, each vertical semiconductor layer 60 may comprise a first-conductivity-type semiconductor channel 601 and a second-conductivity-type source extension region 602. Generally, each vertical semiconductor layer 60 comprises a channel 601 portion having a doping of a first conductivity type, and the source contact layer 114 has a doping of a second conductivity type that is an opposite of the first conductivity type.

Figure 16E:
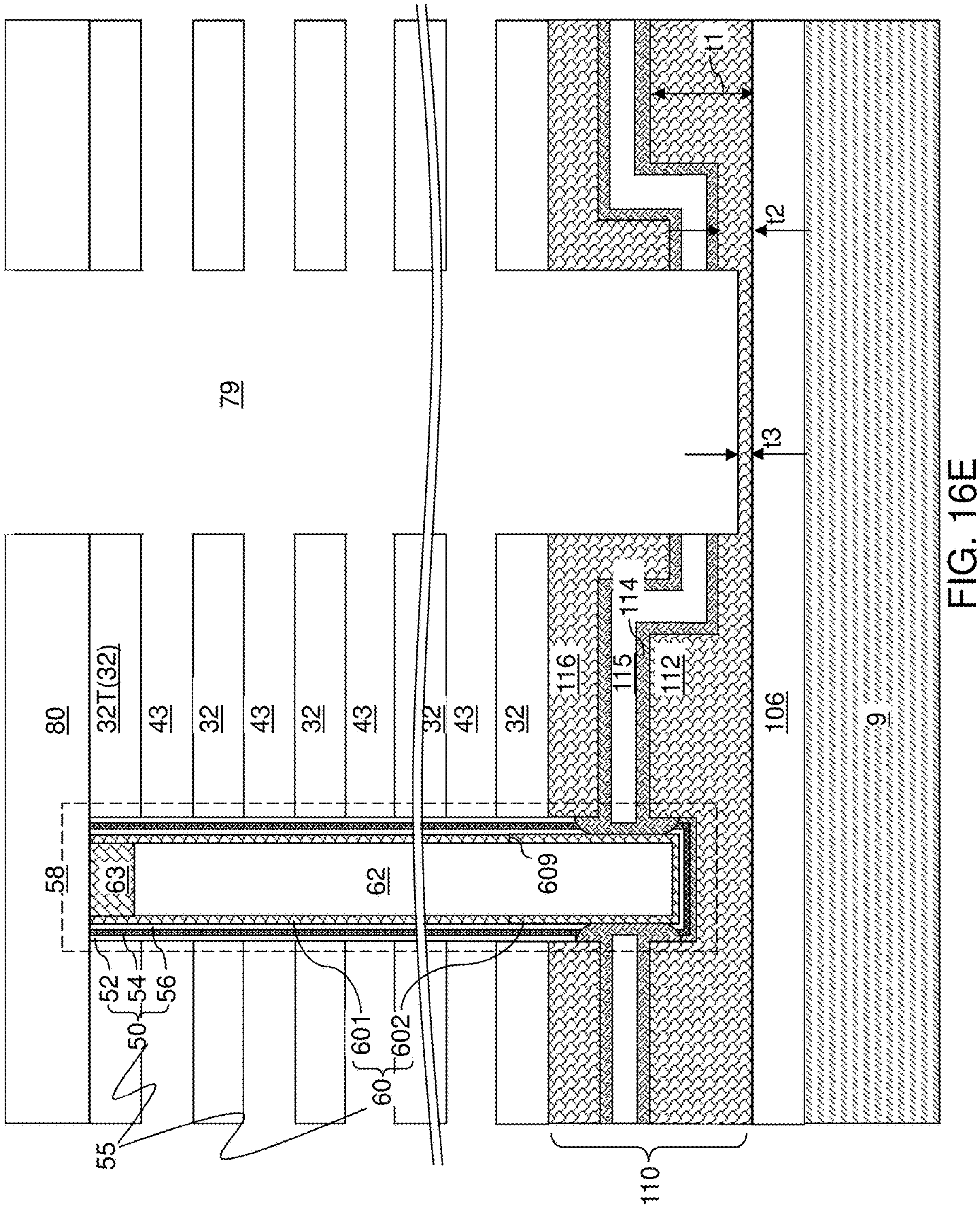

Referring to FIG. 16E, an isotropic etch process can be performed to remove the sacrificial material layers 42 selective to the insulating layers 32, the backside insulating layer 106, the memory opening fill structures 58, the sacrificial etch stop liners 71, and the source-level material layers 110. Laterally-extending cavities 43 can be formed in volumes from which the sacrificial material layers 42 are removed. Sidewall surface segments of the memory opening fill structures 58 can be physically exposed to the laterally-extending cavities 43. In an illustrative example, if the sacrificial material layers 42 comprise silicon oxide, the isotropic etch process may comprise a wet etch process employing hot phosphoric acid, which is a process in which the exemplary structure is immersed in phosphoric acid at, or near, the boiling point of the phosphoric acid. A suitable clean process may be performed as needed.

Figure 16F:
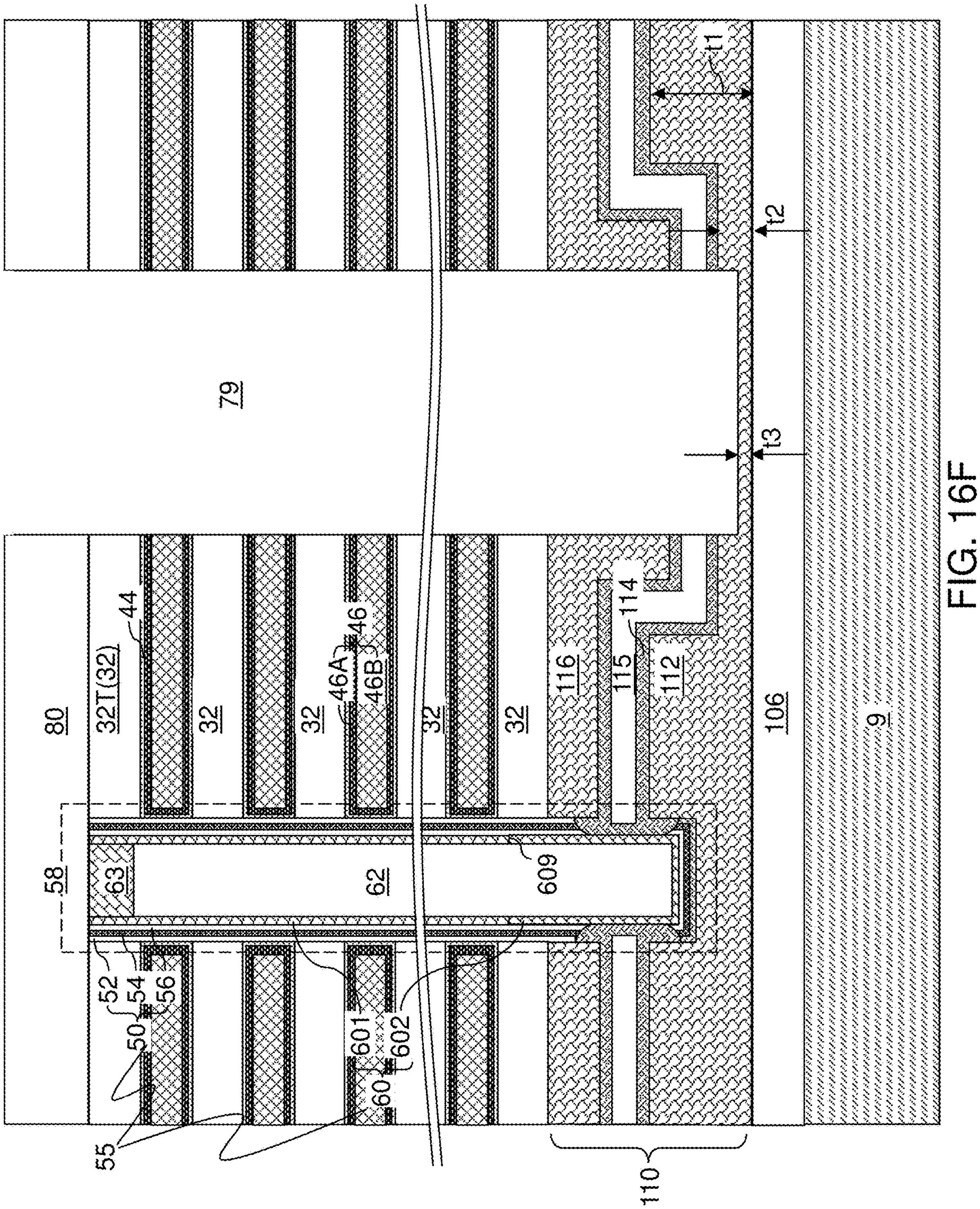

Referring to FIG. 16F, a backside blocking dielectric layer 44 can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MoN, TiC, TaC, WC, or a combination thereof. The metallic fill material may comprise, for example, Ti, Ta, Mo, Co, Ru, W, Cu, other transition metals, and/or alloys or layer stacks thereof.

Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46. An alternating stack of insulating layers 32 and electrically conductive layers 46 can be formed between each neighboring pair of lateral isolation trenches 79 over the substrate 8. A plurality of alternating stacks of insulating layers 32 and electrically conductive layers 46 can be laterally spaced apart among one another by the lateral isolation trenches 79. Optionally, a subset of the electrically conductive layers 46 including the bottommost electrically conductive layer 46 may be employed as at least one source-select electrode (i.e., source side select gate electrode). Optionally, a subset of the electrically conductive layers 46 including the topmost electrically conductive layer 46 may be employed as at least one drain-select electrode (i.e., drain side select gate electrode). A predominant fraction of the electrically conductive layers 46 (e.g., the electrically conductive layers located between the source-select electrodes and the drain-select electrodes may be employed as word lines.

In summary, the sacrificial material layers 42 can be replaced with the electrically conductive layers 46. An alternating stack (32, 46) of insulating layers 32 and electrically conductive layers 46 can be formed over the source-level material layers 110. Memory opening 49 can vertically extend through the alternating stack (32, 46) and into the first portion of the lower source-level semiconductor layer 112. A memory opening fill structure 58 can be formed within each memory opening 49. Each memory opening fill structure 58 comprises a memory film 50 and a vertical semiconductor layer 60 that contacts the source contact layer 114. The vertical semiconductor layer 60 comprises a p-n junction 609 located above the horizontal plane including the top surface of the upper source-level semiconductor layer 116, and separates the vertical semiconductor layer 60 into the first-conductivity-type semiconductor channel 601 and the second-conductivity-type source extension region 602.

Figure 16G:
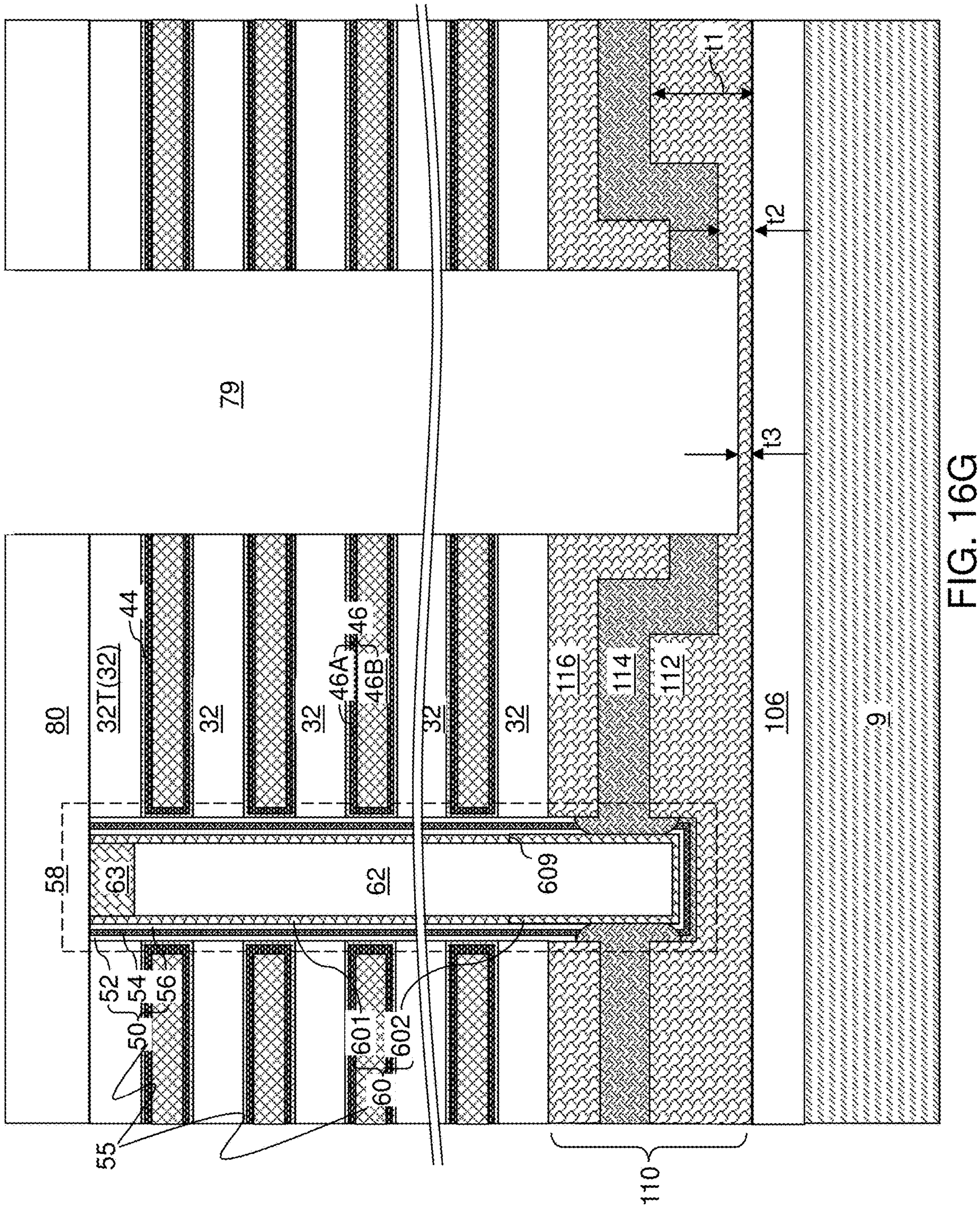
FIG. 16G is a vertical cross-sectional view of a region of an alternative embodiment of the first exemplary structure according to the first embodiment of the present disclosure.

Referring to FIG. 16G, an alternative embodiment of the first exemplary structure according to the first embodiment of the present disclosure can be derived from the first exemplary structure illustrated in FIG. 16E by increasing the thickness of the source contact material layer 114L so that the entirety of the source cavity 109 is filled with the source contact material layer 114L. In this case, the source-level material layers 110 may consist of the lower source-level semiconductor layer 112, the source contact layer 114, and the upper source-level semiconductor layer 116, and the insulating fill layer 115 may be omitted.

Figure 17A:
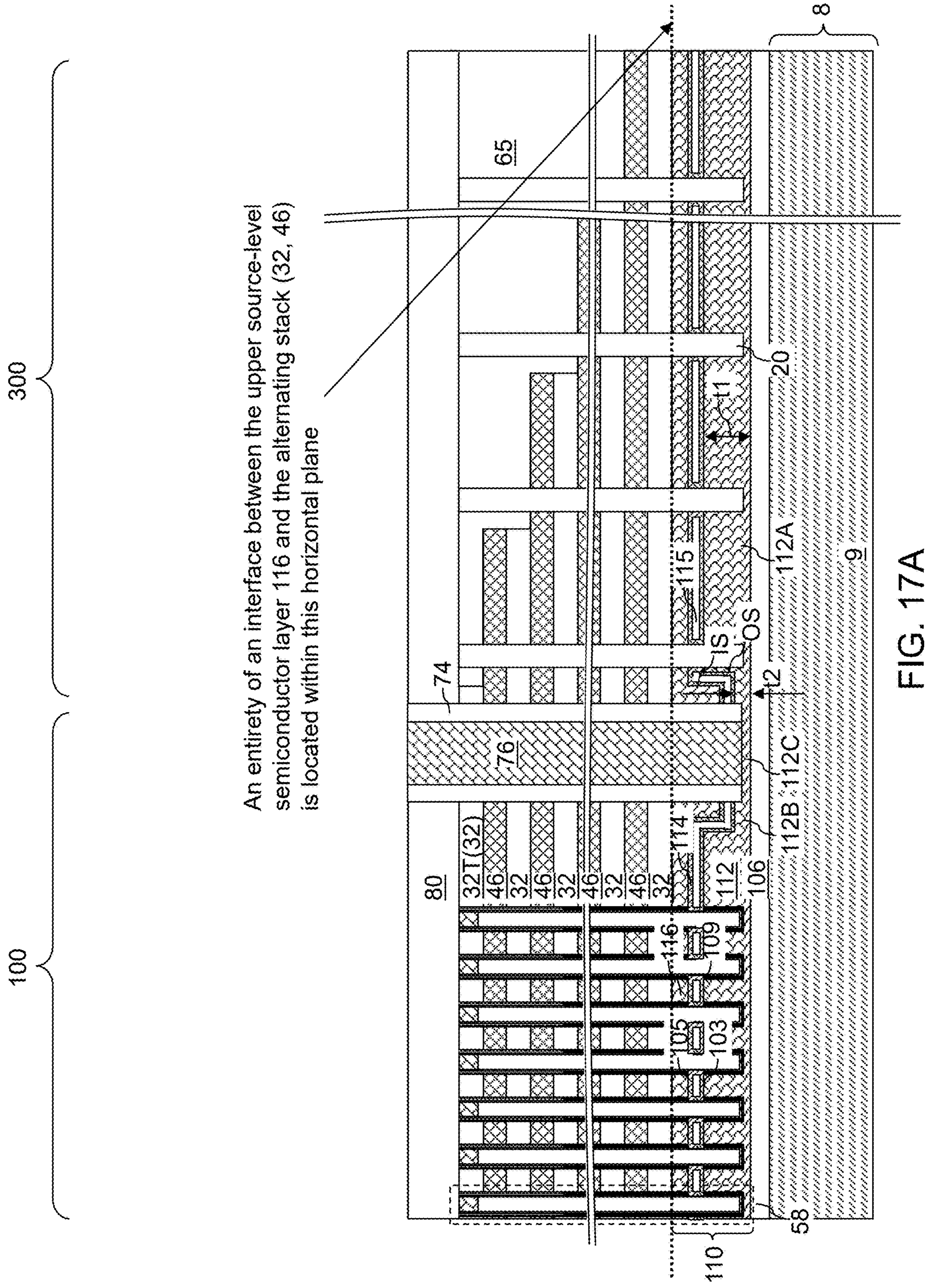
FIG. 17A is a vertical cross-sectional view of the first exemplary structure after formation of lateral isolation trench fill structures and contact via structures according to the first embodiment of the present disclosure.
Figure 17B:
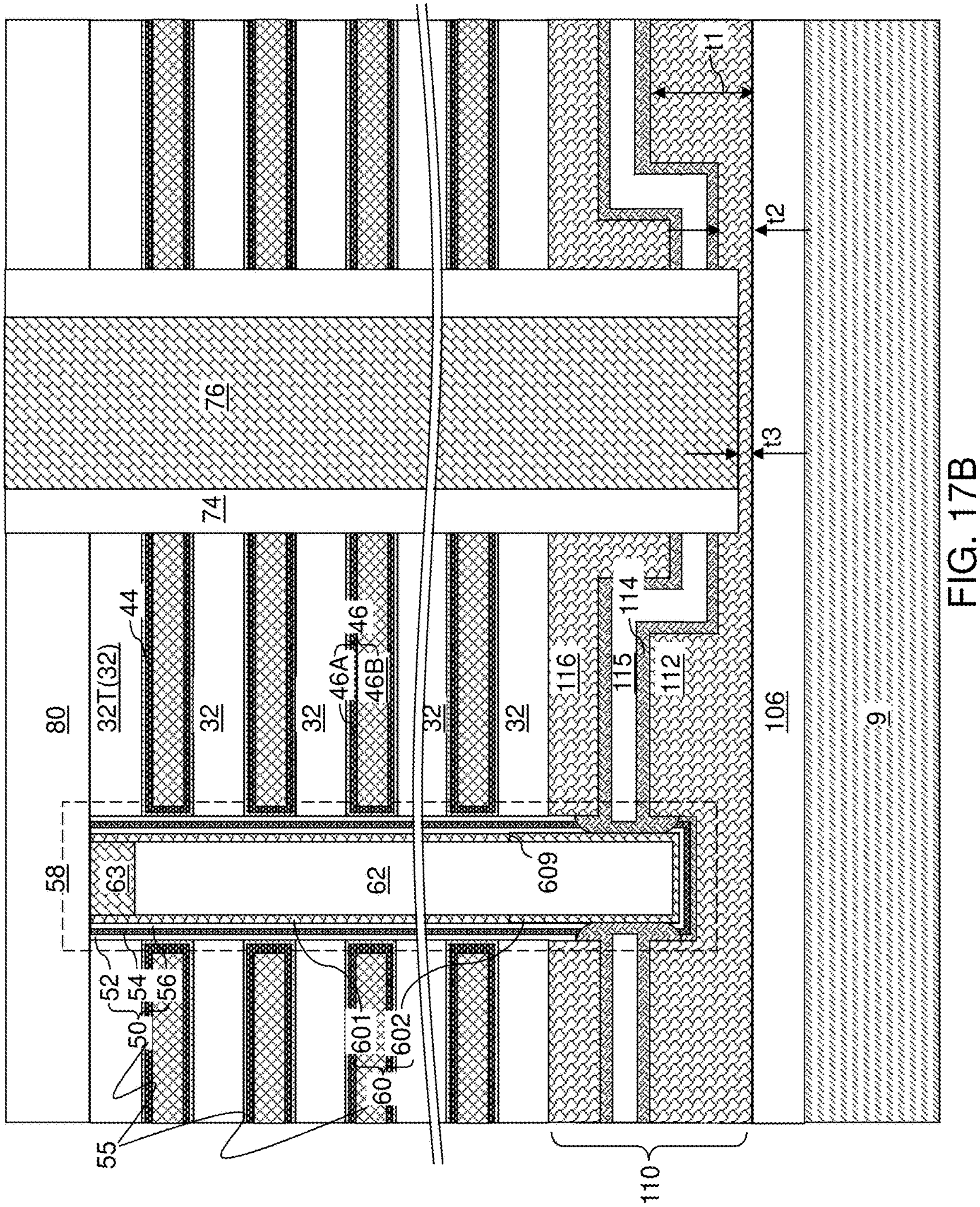
FIG. 17B is a magnified view of a region of the first exemplary structure of FIG. 17A.

Referring to FIGS. 17A and 17B, an insulating material, such as silicon oxide, can be conformally deposited in the peripheral portions of the lateral isolation trenches 79 and above the contact-level dielectric layer 80. An anisotropic etch process can be performed to remove horizontally-extending portions of the deposited insulating material. Each remaining vertically-extending portion of the deposited insulating material constitutes an insulating spacer 74.

At least one conductive material, such as at least one metallic material, can be deposited in remaining volumes of the lateral isolation trenches 79. Excess portions of the at least one conductive material can be removed from above the horizontal plane including the top surface of the contact-level dielectric layer 80 by a planarization process such as a chemical mechanical polishing process. Each remaining portion of the at least one conductive material constitutes a contact via structure, which is herein referred to as a source contact via structure 76. Each source contact via structure 76 can contact a top surface of a third potion 112C of the lower source-level semiconductor layer 112 having the third thickness t3, which is less than the second thickness t2.

In summary, an insulating spacer 74 can be formed in a peripheral region of the lateral isolation trench 79. A source contact via structure 76 can be formed in a volume that is laterally surrounded by the insulating spacer 74 on a surface of the lower source-level semiconductor layer 112. If an insulating fill layer 115 is employed, the insulating fill layer 115 may contact a surface segment of an outer sidewall of the insulating spacer 74.

Each contiguous combination of an insulating spacer 74 and a source contact via structure 76 constitutes a lateral isolation trench fill structure (74, 76). In an alternative embodiment, the entirety of each lateral isolation trench 79 may be filled with an insulating fill material that constitutes a lateral isolation trench fill structure, which consists essentially of the insulating fill material. Generally, each lateral isolation trench fill structure has an insulating sidewall (which may be an outer sidewall of an insulating spacer 74 or a sidewall of an insulating fill material portion) that contacts sidewalls of the insulating layers 32 and sidewalls of the electrically conductive layers 46. Generally, the insulating sidewall laterally extends along a first horizontal direction hd1; and a boundary between the first portion and the second portion is parallel to the first horizontal direction hd1.

In one embodiment, the insulating sidewall of each lateral isolation trench fill structure (74, 76) can be laterally spaced from the first portion 112A of the lower source-level semiconductor layer 112. In one embodiment, the lateral isolation trench fill structure (74, 76) contacts a top surface of a third portion 112C of the lower source-level semiconductor layer 112 having a third thickness t3 that is not greater than the second thickness t2. Generally speaking, the third thickness t3 may be the same as, or may be less than, the second thickness t2. In one embodiment, the third thickness t3 is less than the second thickness t2.

In one embodiment, the lateral isolation trench fill structure (74, 76) comprises: a source contact via structure 76 that contacts a surface segment of the third portion 112C of the lower source-level semiconductor layer 112; and an insulating spacer 74 that laterally surrounds the source contact via structure 76. In one embodiment, the entirety of the interface between the upper source-level semiconductor layer 116 and the alternating stack (32, 46) may be located within a horizontal plane.

Figure 18A:
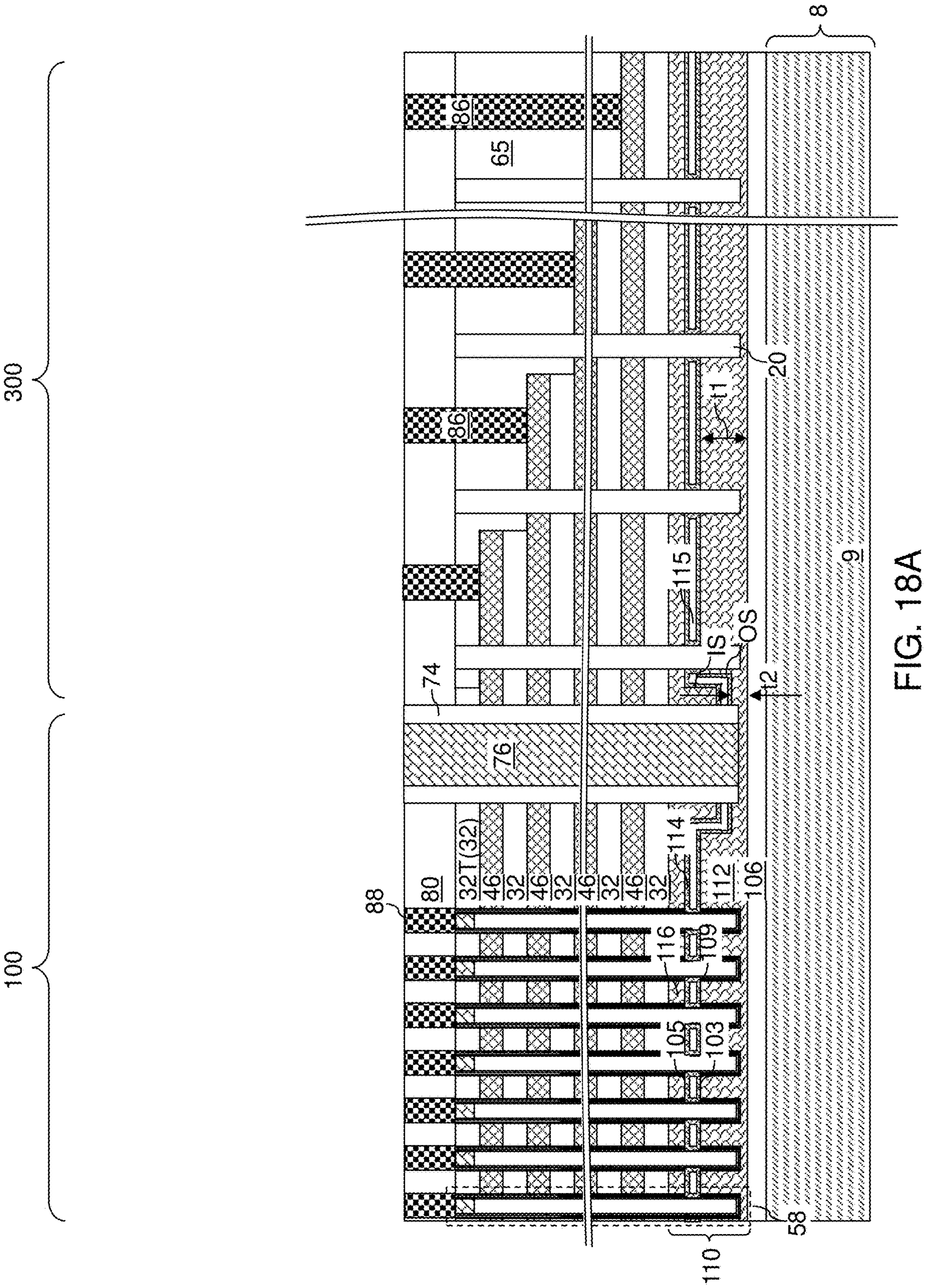
FIG. 18A is a vertical cross-sectional view of the first exemplary structure after formation of various contact via structures according to the first embodiment of the present disclosure.
Figure 18B:
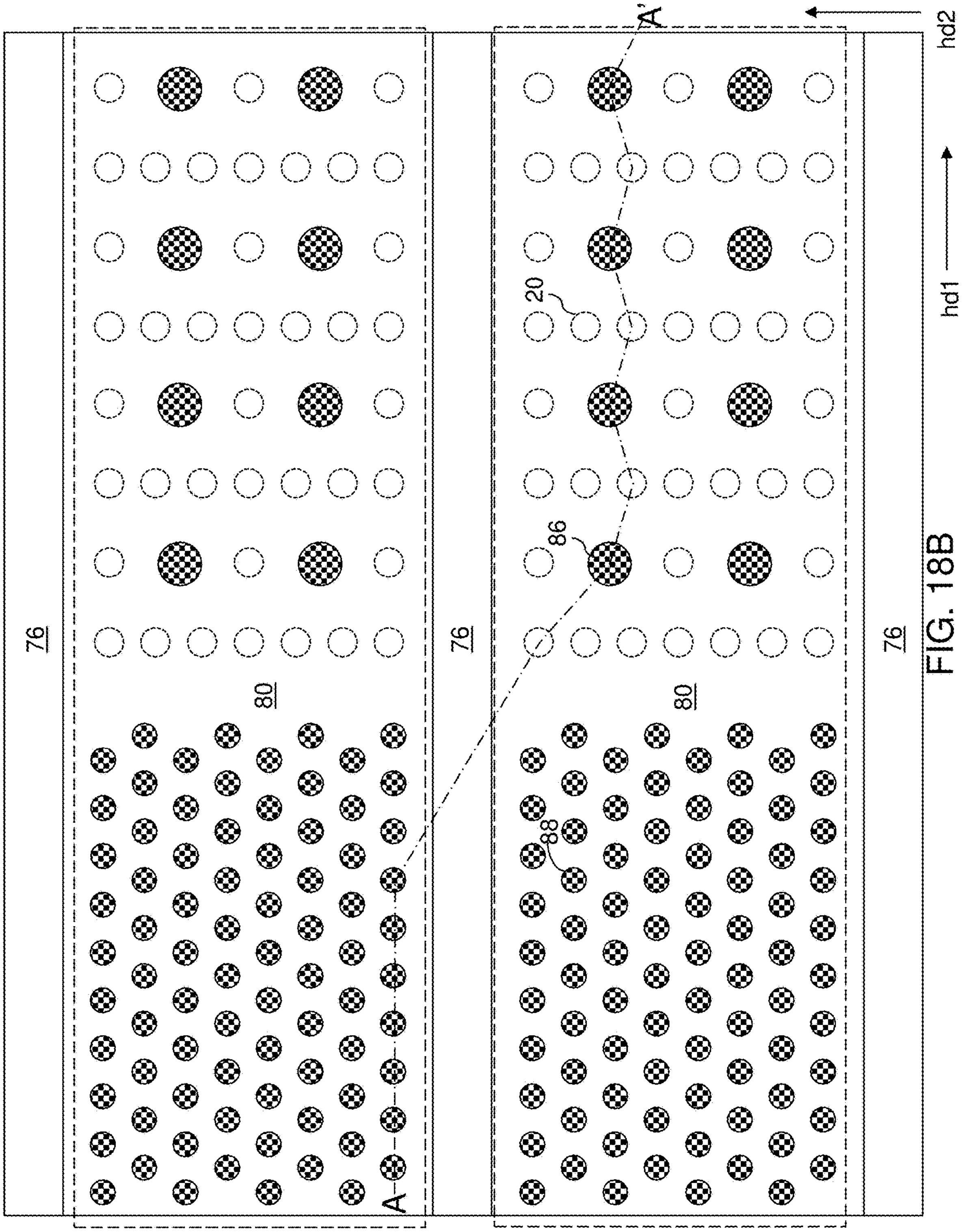
FIG. 18B is a top-down view of the first exemplary structure of FIG. 18A. The vertical plane A-A' is the cut plane of the vertical cross-sectional view of FIG. 18A.

Referring to FIGS. 18A and 18B, a photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the retro-stepped dielectric material portion 65. Drain contact via cavities can be formed through the contact-level dielectric layer 80 over the memory opening fill structures 58. Layer contact via structures can be formed through the contact-level dielectric layer 80 and the retro-stepped dielectric material portion 65 on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46.

In one embodiment, each memory opening fill structure 58 comprises a drain region 63 contacting an end portion of the semiconductor channel 601 portion of the vertical semiconductor layer 60; and a drain contact via structure 88 contacts a top surface of the drain region 63. In one embodiment, each of the electrically conductive layers 46 is contacted by a respective layer contact via structure 86 having a respective top surface located above a horizontal plane including a topmost surface of the alternating stack (32, 46).

Figure 19A:
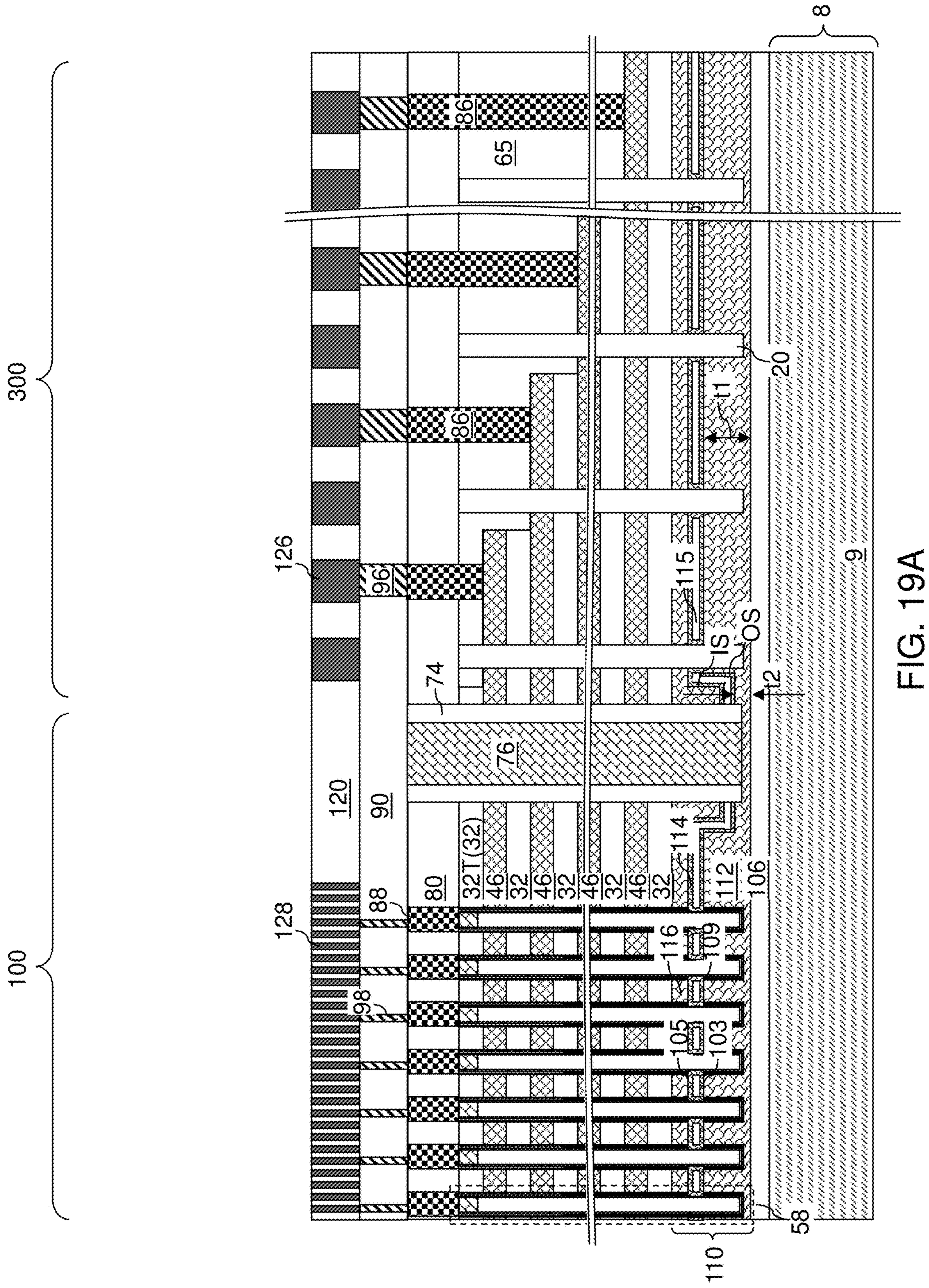
FIG. 19A is a vertical cross-sectional view of the first exemplary structure after formation of bit lines and bit-line-level metal lines according to the first embodiment of the present disclosure.
Figure 19B:
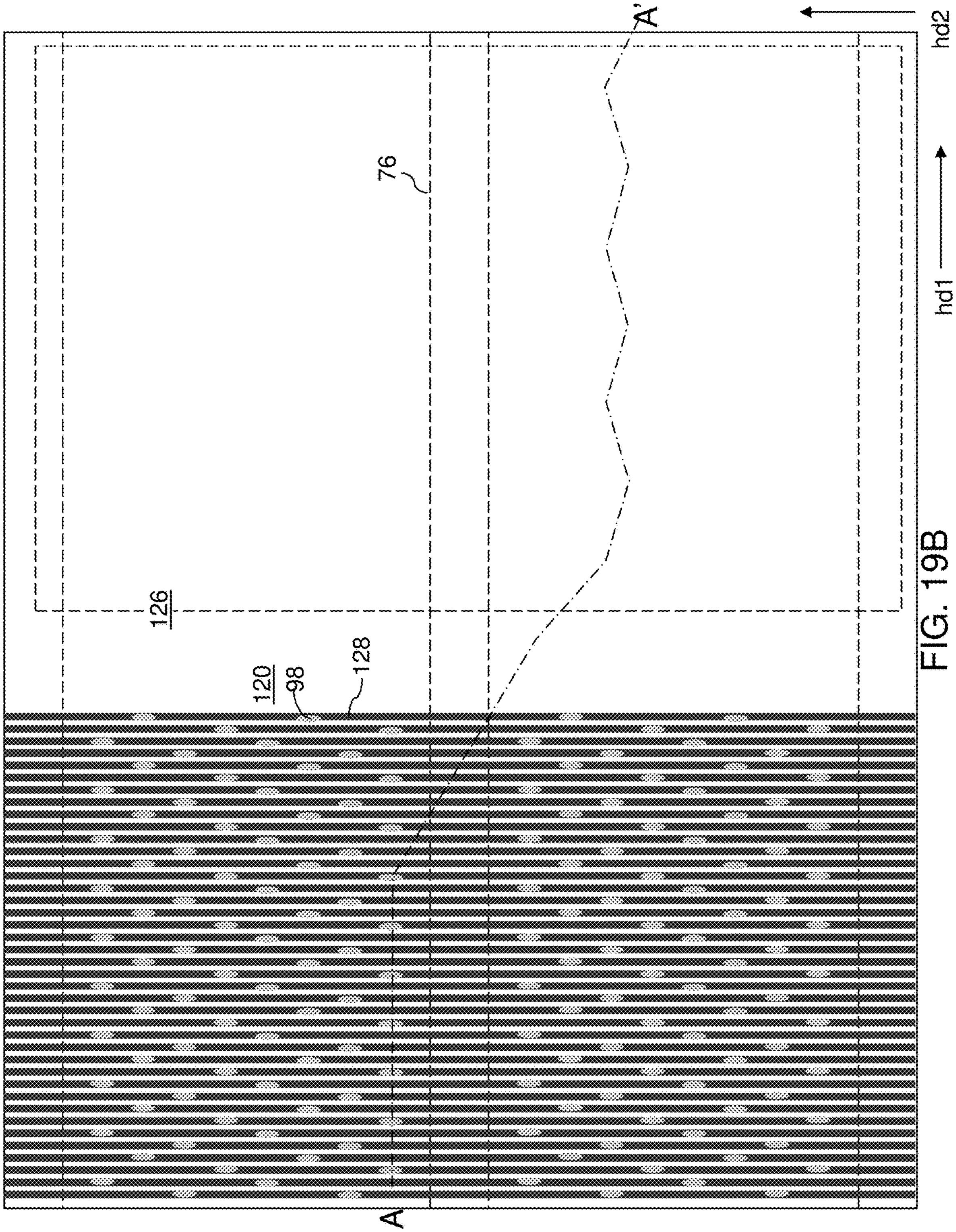
FIG. 19B is a top-down view of the first exemplary structure of FIG. 19A. The hinged vertical plane A-A' is the cut plane of the vertical cross-sectional view of FIG. 19A.

Referring to FIGS. 19A and 19B, a connection-level dielectric layer 90 can be formed above the contact-level dielectric layer 80. Connection via cavities can be formed through the connection-level dielectric layer 90, and can be filled with at least one conductive material (which may comprise at least one metallic material) to form connection-level via structures (98, 96). The connection-level via structures (98, 96) comprise drain connection via structures 98 that contact a respective one of the drain contact via structures 88, and layer connection via structures 96 that contact a respective one of the layer contact via structures 86.

A bit-line-level dielectric layer 120 can be formed above the connection-level dielectric layer 90. Bit-line-level line cavities can be formed through the bit-line-level dielectric layer 120, and can be filled with at least one conductive material (which may comprise at least one metallic material) to form bit-line-level metal lines (128, 126). The bit-line-level metal lines may comprise bit lines 128 that laterally extend along the second horizontal direction hd2, and bit-line-level interconnect metal lines 126 (not individually shown) that can be employed to provide electrical connection to the layer connection via structures 96.

Figure 20:
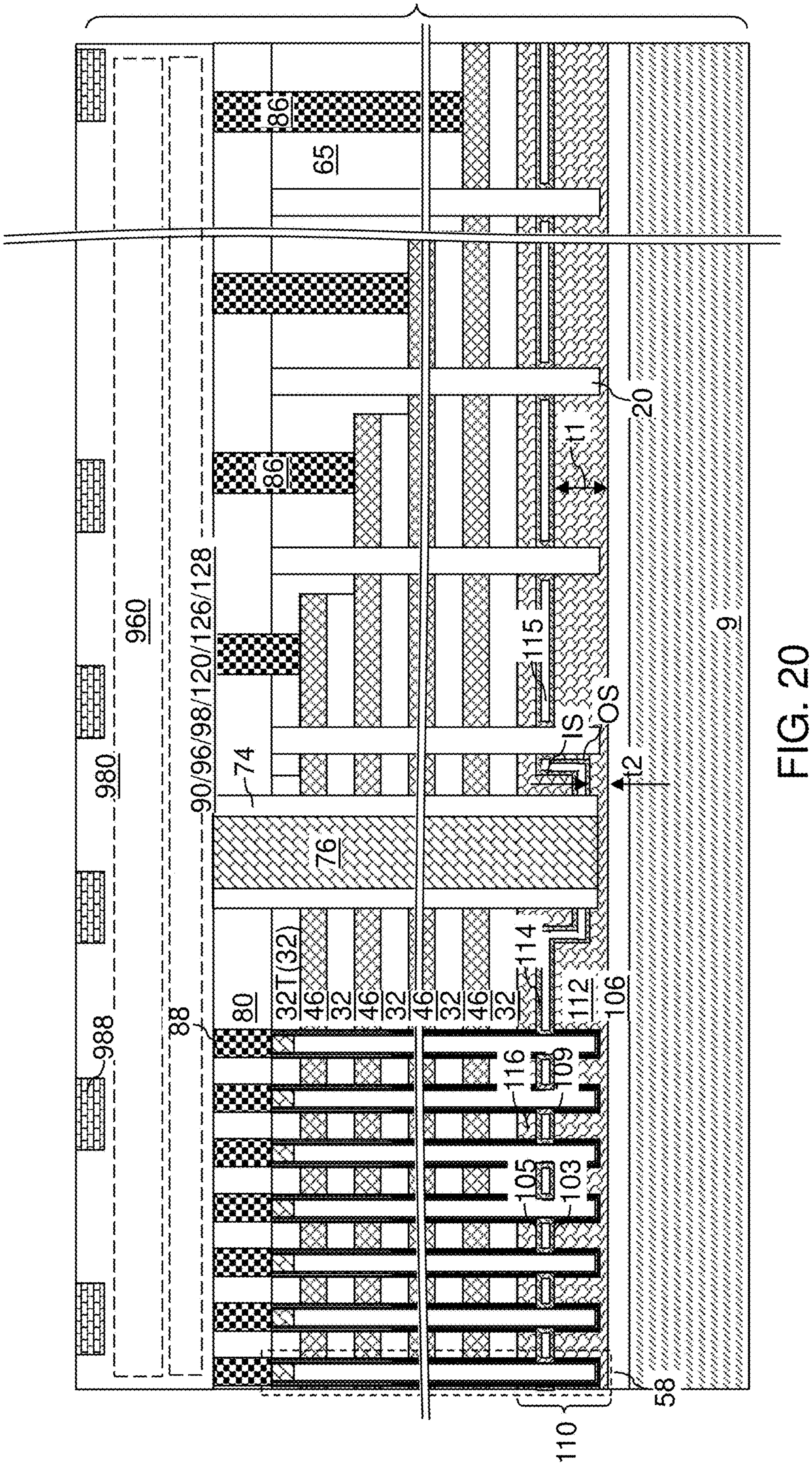
FIG. 20 is a vertical cross-sectional view of the first exemplary structure after formation of a memory die according to the first embodiment of the present disclosure.

Referring to FIG. 20, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding the bit lines 128, which are a subset of the memory-side metal interconnect structures 980.

Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

The memory-side dielectric material layers 960 are formed over the alternating stacks (32, 46). The memory-side metal interconnect structures 980 are embedded in the memory-side dielectric material layers 960. The memory-side bonding pads 988 can be embedded within the memory-side dielectric material layers 960, and specifically, within the topmost layer among the memory-side dielectric material layers 960. The memory-side bonding pads 988 can be electrically connected to the memory-side metal interconnect structures 980.

In one embodiment, the memory die 900 may comprise: a three-dimensional memory array comprising an alternating stack (32, 46) of insulating layers 32 and electrically conductive layers 46, a two-dimensional array of memory openings 49 vertically extending through the alternating stack (32, 46), and a two-dimensional array of memory opening fill structures 58 located in the two-dimensional array of memory openings 49 and comprising a respective vertical stack of memory elements and a respective vertical semiconductor layer 60; a two-dimensional array of drain contact via structures 88 electrically connected to a respective one of the vertical semiconductor layers 60; and a two-dimensional array of layer contact via structures 86 electrically connected to a respective one of the electrically conductive layers 46, a subset of which functions as word lines for the three-dimensional memory array.

In summary, a memory die 900 is provided, which comprises a memory array, memory-side metal interconnect structures 980, and memory-side bonding pads 988 embedded within memory-side dielectric material layers 960. The memory die 900 comprises a memory device, which may comprise a three-dimensional memory array including an alternating stack of insulating layers 32 and electrically conductive layers 46, and further comprises a two-dimensional array of NAND strings (e.g., the memory opening fill structures 58) vertically extending through the alternating stack (32, 46). In one embodiment, the electrically conductive layers 46 comprise word lines of the two-dimensional array of NAND strings. In one embodiment, the memory-side metal interconnect structures 980 comprise the bit lines 128 for the two-dimensional array of NAND strings.

Figure 21:
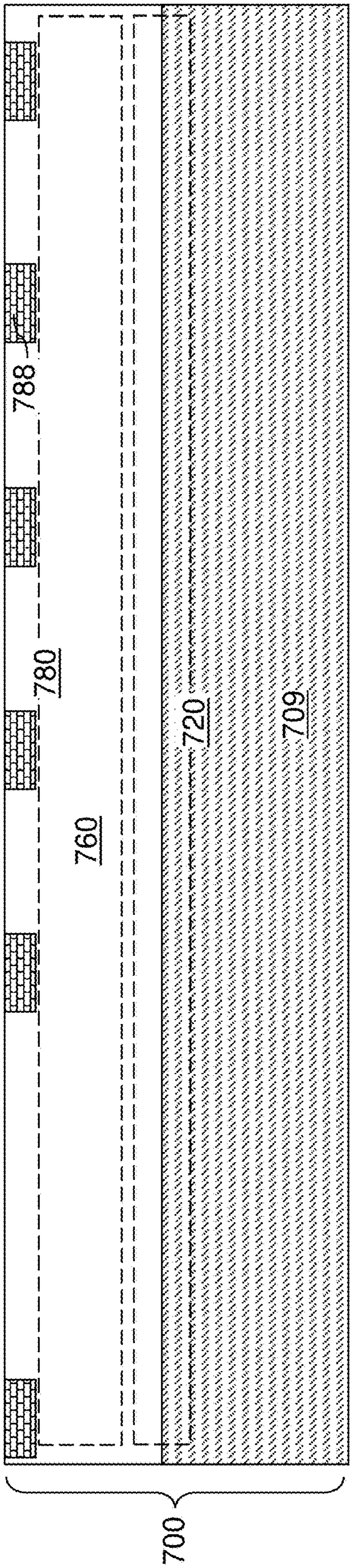
FIG. 21 is a vertical cross-sectional view of a logic die according to the first embodiment of the present disclosure.

Referring to FIG. 21, an optional logic die 700 is provided. If there is no peripheral circuit located on the substrate 8, then the logic die 700 includes the peripheral circuit 720 that is formed on a logic-side substrate 709. According to an aspect of the present disclosure, the peripheral circuit 720 can be configured to control operation of the memory array within the memory die 900. For example, the peripheral circuit 720 may comprise word line driver regions, bit line driver regions, sense amplifier regions, input/output buffer regions, etc. Logic-side metal interconnect structures 780 embedded within logic-side dielectric material layers 760 can be formed over the peripheral circuit 720. The logic die 700 comprises logic-side bonding pads 788 embedded within logic-side dielectric material layers 760.

Figure 22:
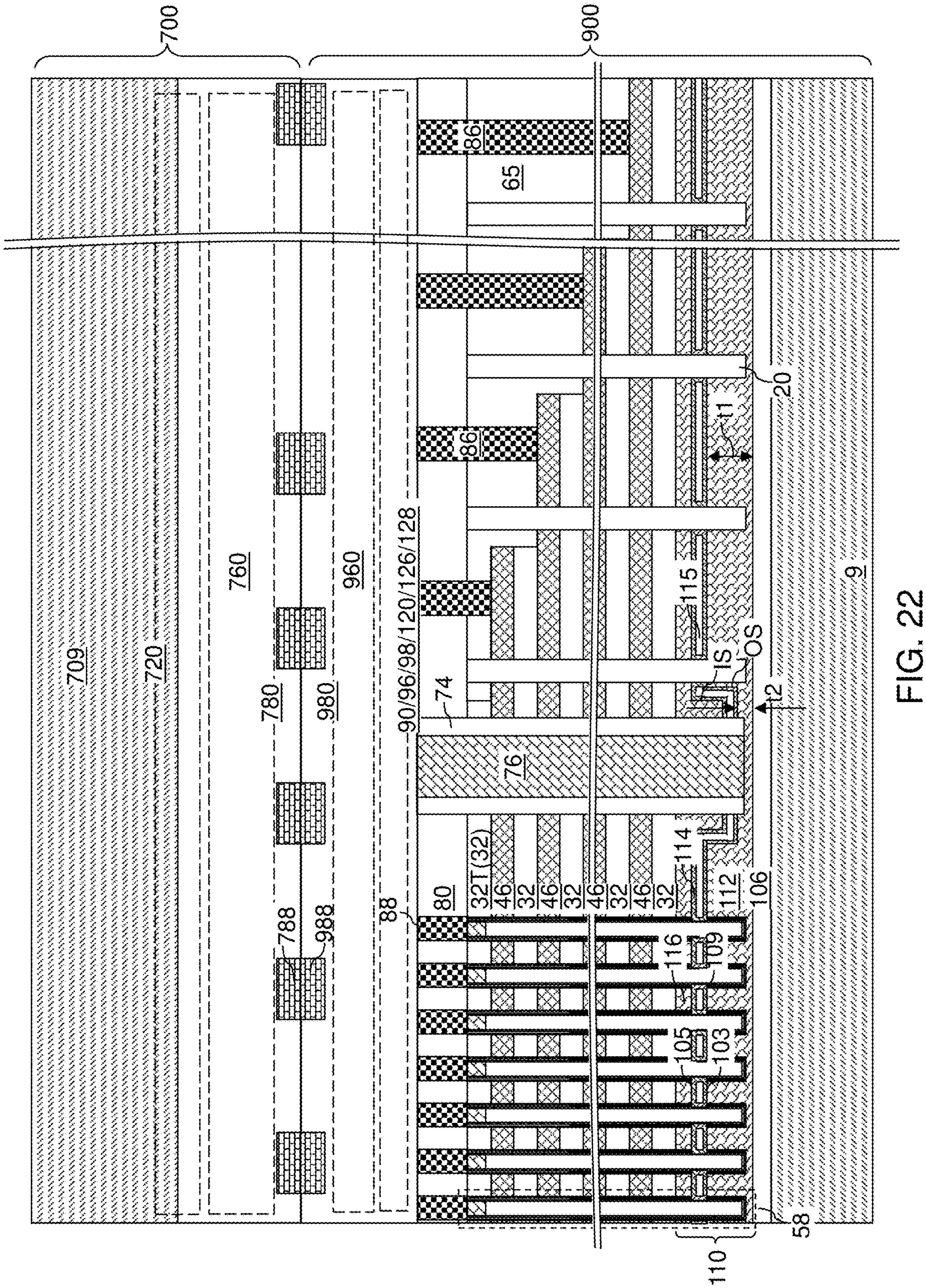
FIG. 22 is a vertical cross-sectional view of the first exemplary structure after formation of a bonded assembly of the memory die and the logic die according to the first embodiment of the present disclosure.

Referring to FIG. 22, a bonded assembly can be formed by bonding the logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Referring collectively to FIGS. 1-22 and according to various embodiments of the present disclosure, a memory device comprises: source-level material layers 110 comprising a lower source-level semiconductor layer 112, an upper source-level semiconductor layer 116 located over the lower source-level semiconductor layer 112, and a source contact layer 114 located between the lower source-level semiconductor layer 112 and the upper source-level semiconductor layer 116. The lower source-level semiconductor layer 112 comprises a first portion 112A having a first thickness t1 and a second portion 112B having a second thickness t2 that is less than the first thickness t1. The memory device also comprises an alternating stack (32, 46) of insulating layers 32 and electrically conductive layers 46 located over the source-level material layers 110; a memory opening 49 vertically extending through the alternating stack (32, 46) and partially through the source-level material layers 110 into the first portion of the lower source-level semiconductor layer 112; and a memory opening fill structure 58 located in the memory opening 49 and comprising a memory film 50 and a vertical semiconductor layer 60 that contacts the source contact layer 114. The source contact layer 104 comprises a first horizontally extending portion 114A overlying the first portion 112A of the lower source-level semiconductor layer 112; a second horizontally-extending portion 114B overlying the second portion 112B of the lower source-level semiconductor layer 112; and a third portion 114C connecting the first horizontally-extending portion 114A and the second horizontally-extending portion 114B.

In one embodiment, the memory device further comprises a lateral isolation trench fill structure (74, 76) having an insulating sidewall (e.g., portion of the insulating spacer 74) that contacts sidewalls of the insulating layers 32 and sidewalls of the electrically conductive layers 46, and laterally spaced from the first portion 112A of the lower source-level semiconductor layer 112. In one embodiment, the lateral isolation trench fill structure (74, 76) contacts a top surface of a third portion 112C of the lower source-level semiconductor layer 112 having a third thickness t3 that is not greater than the second thickness t2. In one embodiment, the third thickness t3 is less than the second thickness t2. In one embodiment, the lateral isolation trench fill structure (74, 76) comprises: a source contact via structure 76 that contacts a surface segment of the third portion 112C of the lower source-level semiconductor layer 112; and an insulating spacer 74 that laterally surrounds the source contact via structure 76. In one embodiment, the source-level material layers 110 comprise an insulating fill layer 115 that is surrounded (e.g., on top, bottom, left and right sides) by the source contact layer 114 and contacts a surface segment of an outer sidewall of the insulating spacer 74.

In one embodiment, the upper source-level semiconductor layer 116 has a greater thickness around the lateral isolation trench fill structure (74, 76) than above the first portion 112A of the lower source-level semiconductor layer 112. In one embodiment, the insulating sidewall (e.g., sidewall of the insulating spacer 74) laterally extends along a first horizontal direction hd1; and a boundary between the first portion 112A and the second portion 112B of the lower source-level semiconductor layer 112 is parallel to the first horizontal direction hd1.

In one embodiment, an entirety of an interface between the upper source-level semiconductor layer 116 and the alternating stack (32, 46) is located within a horizontal plane. In one embodiment, the memory film 50 is in contact with a sidewall of the upper source-level semiconductor layer 116; and the vertical semiconductor layer 60 is laterally spaced from the upper source-level semiconductor layer 116 by the memory film 50.

In one embodiment, the source contact layer 114 comprises: the first horizontally extending portion 114A in contact with the first portion 112A of the lower source-level semiconductor layer 112; a second horizontally-extending portion 114B in contact with the second portion 112B of the lower source-level semiconductor layer 112; and the third portion 114C comprises a vertically-extending portion connecting the first horizontally-extending portion 114A and the second horizontally-extending portion 114B. In one embodiment, the vertically-extending portion 114C of the source contact layer 114 contacts a sidewall of the first portion 112A of the lower source-level semiconductor layer 112.

In one embodiment, the vertical semiconductor layer 60 comprises a channel portion 601 having a doping of a first conductivity type and a source extension region 602 having a doping of a second conductivity type that is an opposite of the first conductivity type; and the source contact layer 114 has a doping of the second conductivity type. In one embodiment, the memory opening fill structure 58 comprises a drain region 63 contacting an end portion of the channel portion 601 of the vertical semiconductor layer 60; a drain contact via structure 88 contacts a top surface of the drain region 63; and each of the electrically conductive layers 46 is contacted by a respective layer contact via structure 86 having a respective top surface located above a horizontal plane including a topmost surface of the alternating stack (32, 46).

Figure 23:
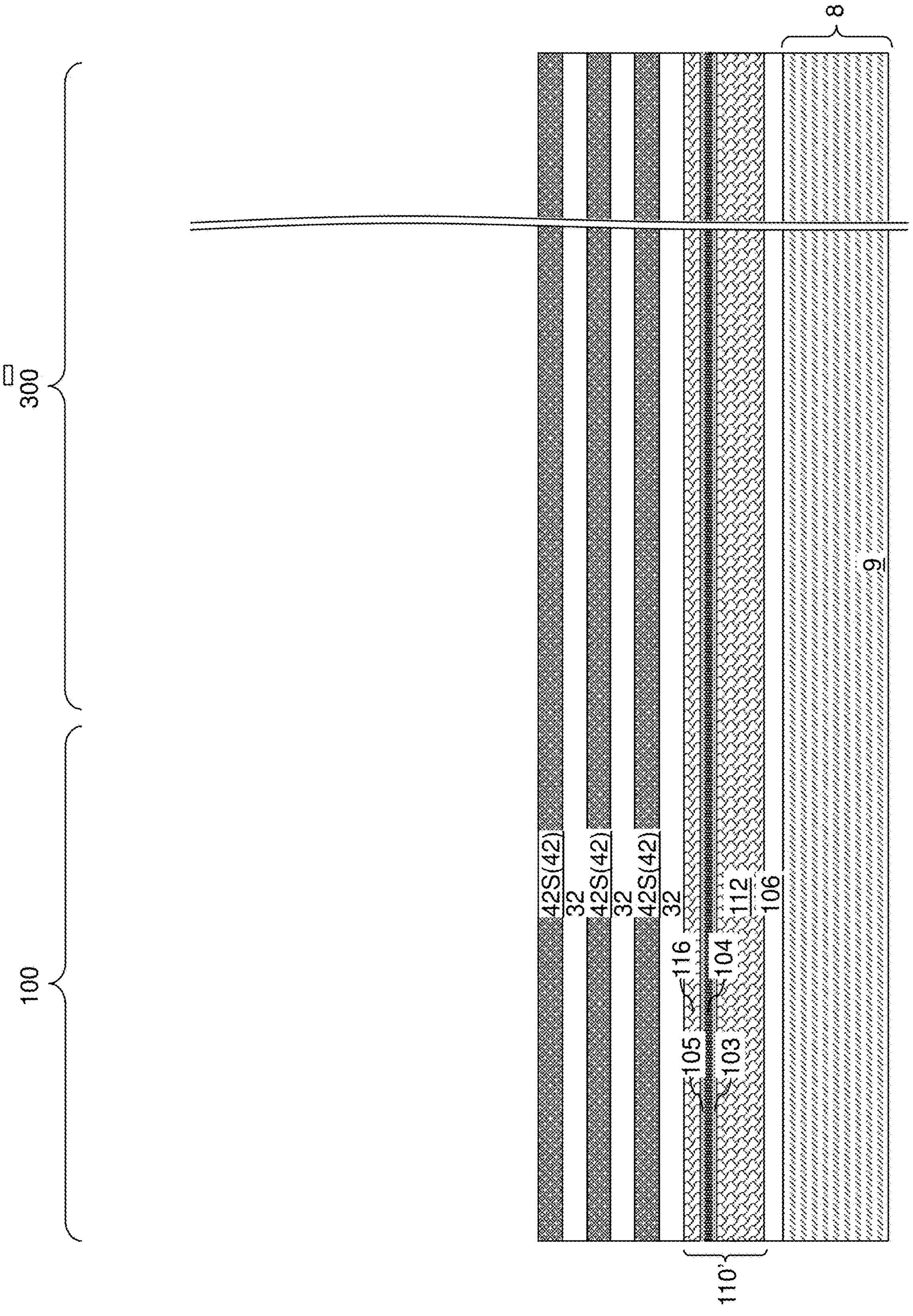
FIG. 23 is a schematic vertical cross-sectional view of a second exemplary structure after formation of in-process source-level material layers and a first alternating stack of first insulating layers and first sacrificial material layers according to a second embodiment of the present disclosure.

Referring to FIG. 23, a second exemplary structure according to a second embodiment of the present disclosure can be derived from the first exemplary structure illustrated in FIG. 1 by omitting the processing steps of FIGS. 2A and 2B, by performing the processing steps described with reference to FIGS. 3 and 4, and by forming a first alternating stack (32, 42S) of first insulating layers 32 and first sacrificial material layers 42S. In this case, each of the lower source-level semiconductor layer 112, the optional lower sacrificial liner 103, the source-level sacrificial layer 104, the optional upper sacrificial liner 105, and the upper source-level semiconductor layer 116 can be deposited as a blanket (unpatterned) material layer having a uniform thickness. Thus, the planarization process described with reference to FIG. 4 may be omitted. The thickness of the upper source-level semiconductor layer 116 may be in a range from 30 nm to 150 nm, such as from 50 nm to 100 nm, although lesser and greater thicknesses may also be employed.

The first sacrificial material layers 42S are subsequently replaced with source-select-level electrically conductive layers, and thus, are also referred to source-select-level sacrificial material layers. In one embodiment, the source-select-level sacrificial material layers 42S are replaced with the bottom source-select-level electrically conductive layers (e.g., SGSB layers), while additional source-select-level electrically conductive layers (e.g., SGS layers) located over the bottom source-select-level electrically conductive layers (SGSB layers).

The first alternating stack of the first insulating layers 32 and the first sacrificial material layers 42S may comprise a single pair of a first insulating layer 32 and a first sacrificial material layer 42S, or may comprise multiple pairs of first insulating layers 32 and first sacrificial material layers 42S. Each first insulating layer 32 within the first alternating stack (32, 42S) may have the same material composition as, and the same thickness range as, an insulating layer 32 described with reference to FIG. 5. Further, each first sacrificial material layer 42S within the first alternating stack (32, 42S) may have the same material composition as, and the same thickness range as, a sacrificial material layer 42 described with reference to FIG. 5.

The total number of pair(s) of a first insulating layer 32 and a first sacrificial material layer 42S may be in a range from 1 to 5, although a greater number of pairs may also be employed. Generally, the total number of the first sacrificial material layer(s) 42S may be the same as the total number of bottom source select levels that are employed to provide bottom source-select-level electrodes.

Figure 24A:
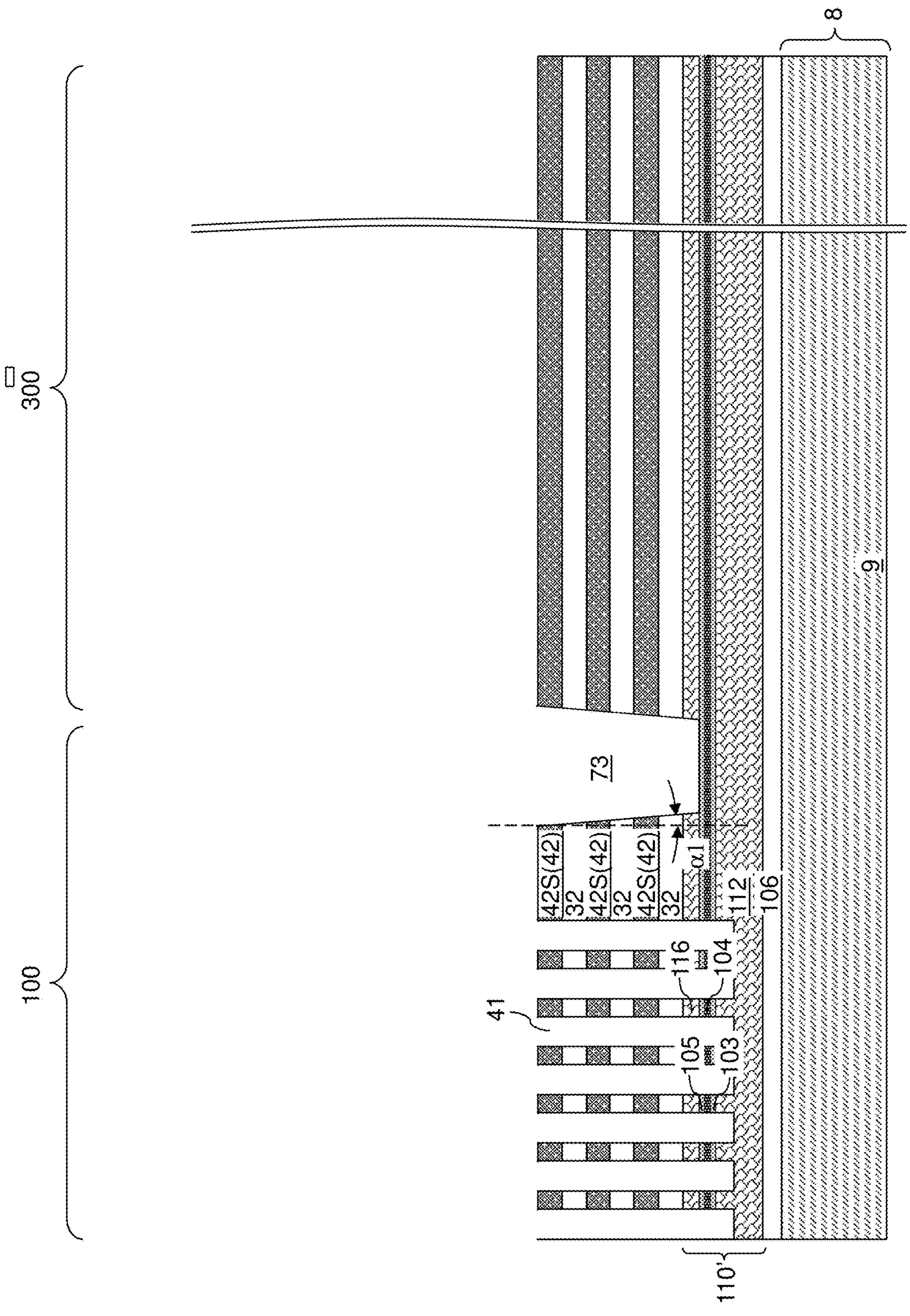
FIG. 24A is a schematic vertical cross-sectional view of the second exemplary structure after formation of discrete openings and line trenches according to the second embodiment of the present disclosure.
Figure 24B:
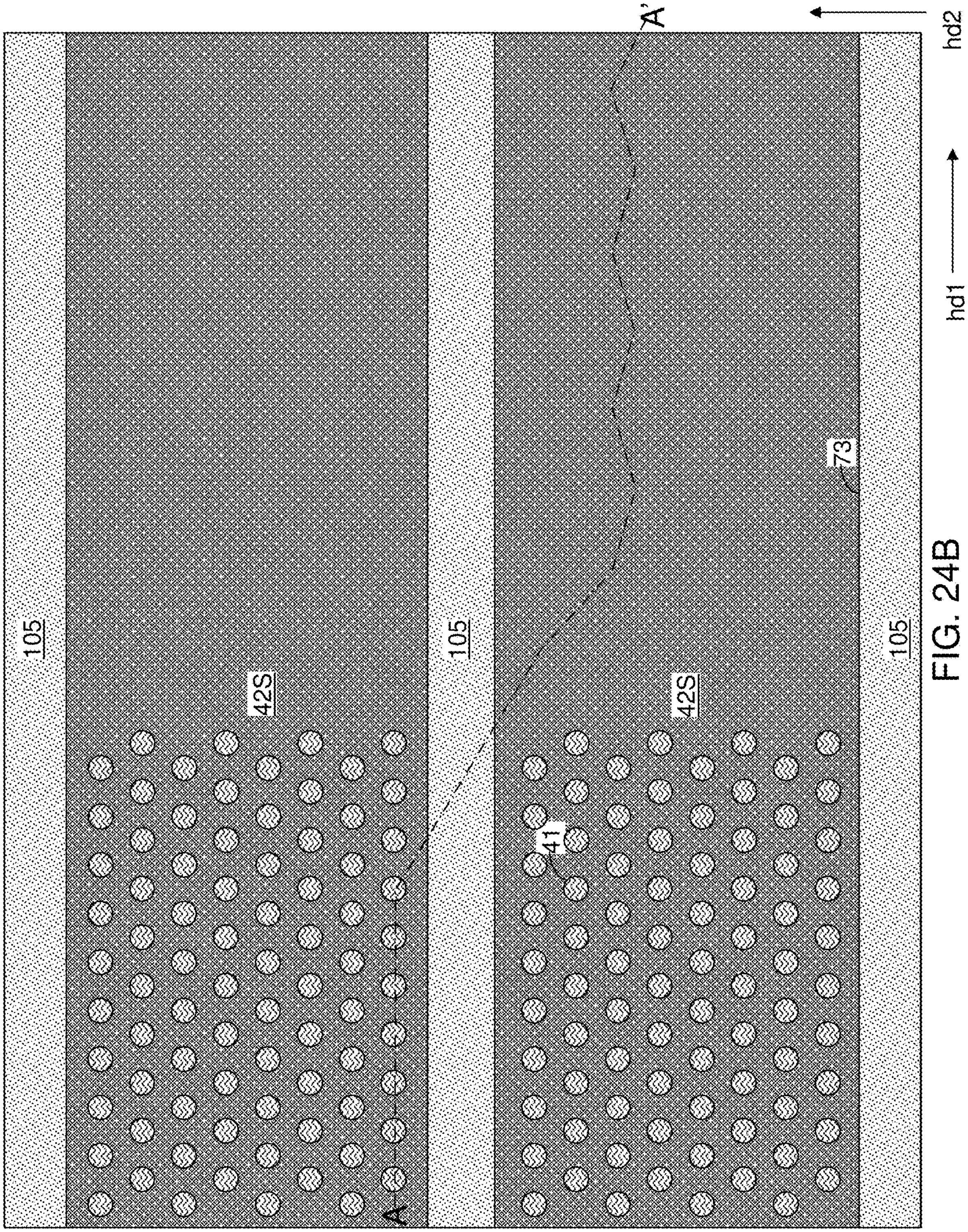
FIG. 24B is a top-down view of the second exemplary structure of FIG. 24A. The hinged vertical cross-sectional plane A-A' is the cut plane of the vertical cross-sectional view of FIG. 24A.

Referring to FIGS. 24A and 24B, a first photoresist layer (not shown) can be applied over the first alternating stack (32, 42S), and can be lithographically patterned to form slit-shaped openings having a same area as the line trenches 5 described with reference to FIGS. 2A and 2B in a plan view. A first anisotropic etch process can be performed to transfer the pattern of the slit-shaped openings in the photoresist layer through the first alternating stack (32, 42S) and the upper source-level semiconductor layer 116. In this case, the upper sacrificial liner 105 may be employed as an etch stop structure.

Line trenches 73 can be formed in volumes from which the materials of the first alternating stack (32, 42S) and the upper source-level semiconductor layer 116 are removed. The line trenches 73 laterally extend along the first horizontal direction hd1, have a uniform width along the second horizontal direction hd2 that is invariant under translation along the first horizontal direction hd1, and are arranged as a two-dimensional periodic array along the second horizontal direction hd2. In one embodiment, the sidewalls of the line trenches 73 may have a first average taper angle $\alpha$1 relative to a vertical direction. The first average taper angle $\alpha$1 is an average of the taper angle of the sidewalls of the line trenches 73, and may be the same as the taper angle of a tilted vertical plane including a straight top edge of a lengthwise sidewall of a line trench and a straight bottom edge of the lengthwise sidewall of the line trench 73. The first average taper angle $\alpha$1 may be in a range from 1 degree to 20 degrees such as from 2 degree to 10 degrees, although lesser and greater angles may also be employed. The first photoresist layer may be removed, for example, by ashing.

A second photoresist layer (not shown) can be applied over the first alternating stack (32, 42S) and in the line trenches 73, and can be lithographically patterned to form discrete openings having generally the same areas as the memory openings 49 described with reference to FIGS. 7A and 7B in the plan view. In one embodiment, the lateral dimensions (such as the diameters) of the discrete openings may be in a range from 102% to 130% of the corresponding dimensions of the memory openings 49 described with reference to FIGS. 7A and 7B. A second anisotropic etch process can be performed to transfer the pattern of the openings in the second photoresist layer through the first alternating stack (32, 42S), the upper source-level semiconductor layer 116, the optional upper sacrificial liner 105, the source-level sacrificial layer 104, and the optional lower sacrificial liner 103, and into an upper portion of the lower source-level semiconductor layer 112. Discrete openings 41 can be formed in volumes from which the materials of the first alternating stack (32, 42S), the upper source-level semiconductor layer 116, the optional upper sacrificial liner 105, the source-level sacrificial layer 104, the optional lower sacrificial liner 103, and the lower source-level semiconductor layer 112 are etched. The discrete openings 41 may comprise vertical or substantially vertical sidewalls. The second photoresist layer can be subsequently removed, for example, by ashing. In an alternative embodiment, the order of steps of forming the discrete openings 41 and the line trenches 73 may be reversed, and the discrete openings 41 may be formed before the line trenches 73.

Figure 25A:
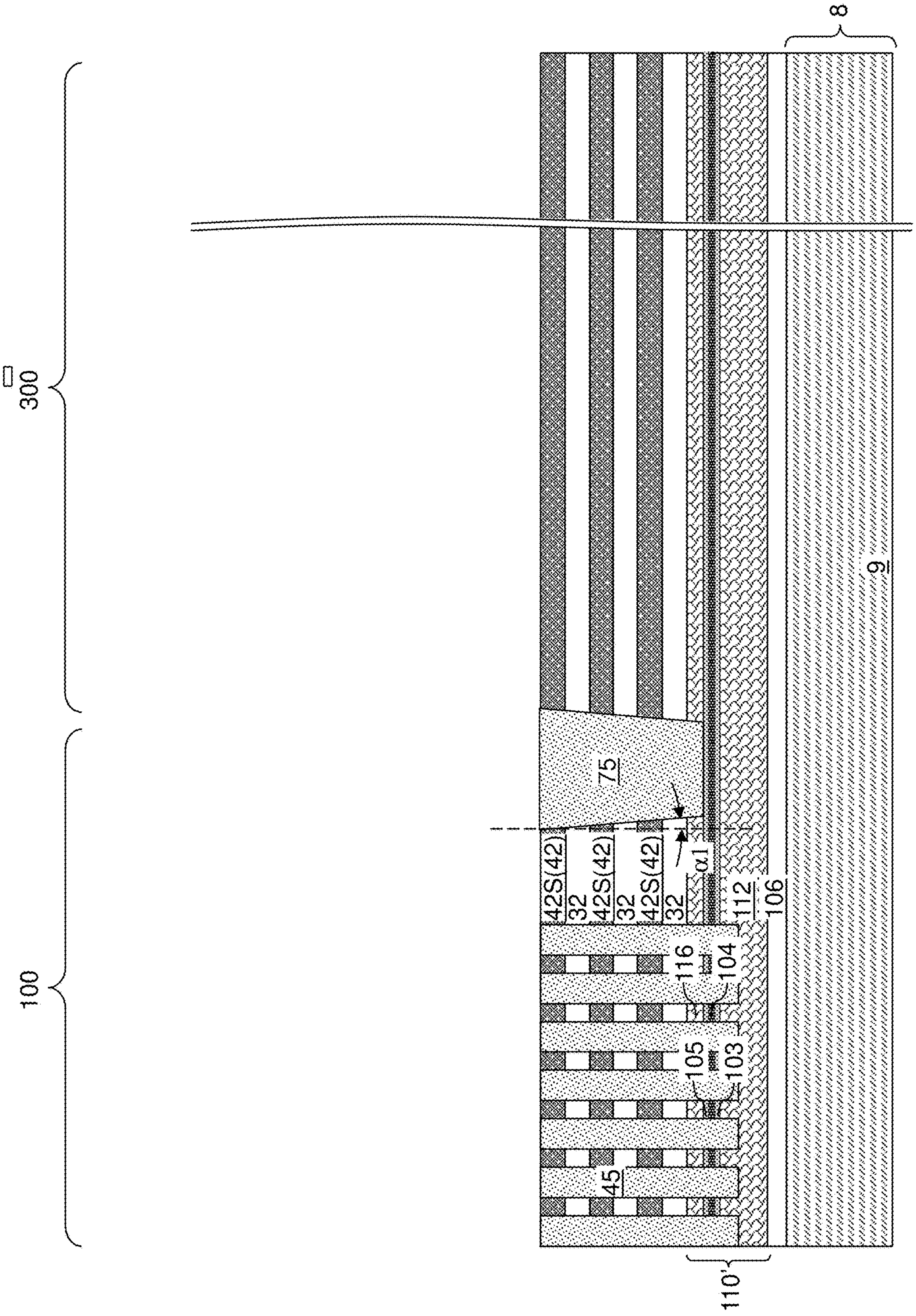
FIG. 25A is a schematic vertical cross-sectional view of the second exemplary structure after formation of sacrificial pillar structures and sacrificial line trench fill structures according to the second embodiment of the present disclosure.
Figure 25B:
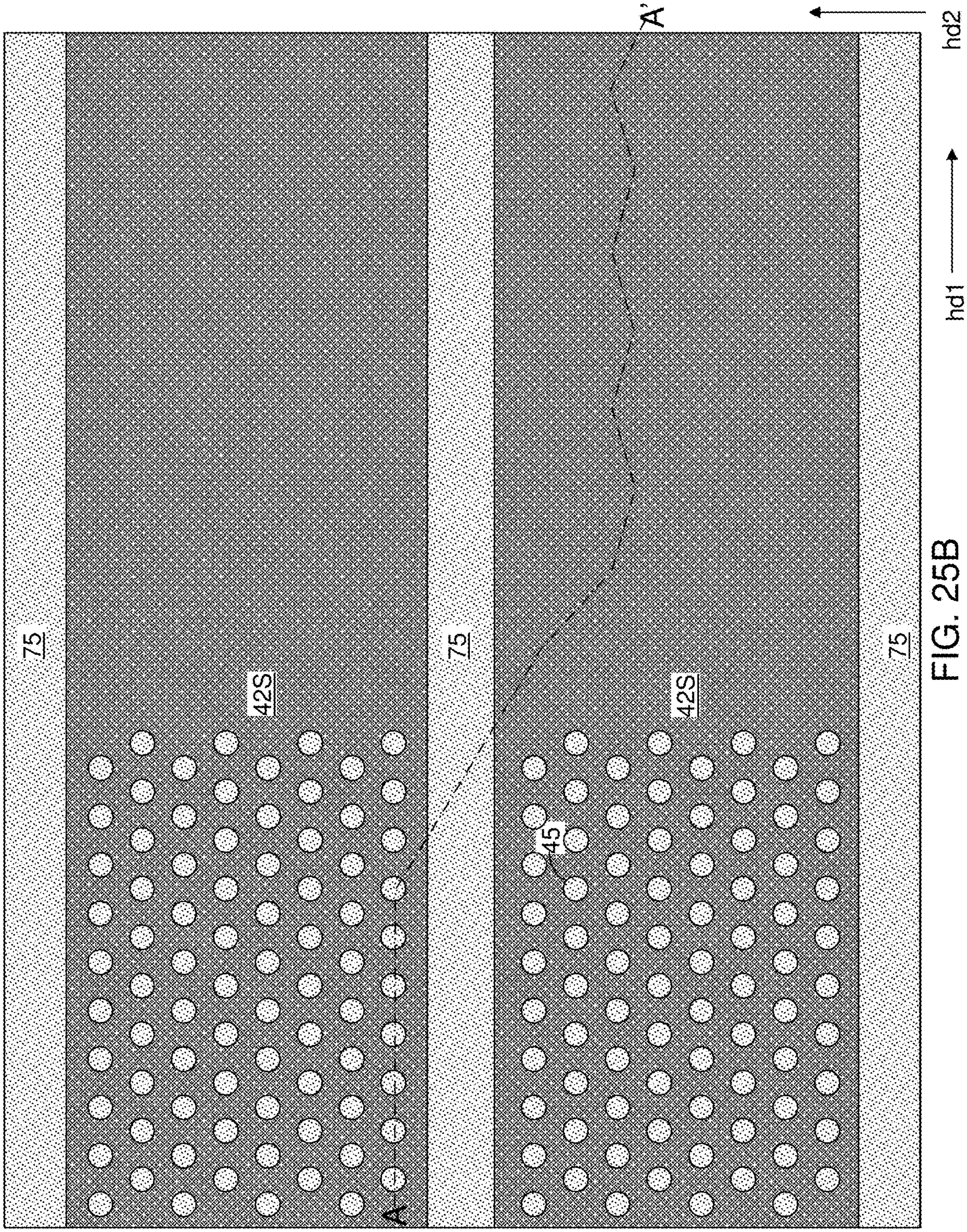
FIG. 25B is a top-down view of the second exemplary structure of FIG. 25A. The hinged vertical cross-sectional plane A-A' is the cut plane of the vertical cross-sectional view of FIG. 25A.

Referring to FIGS. 25A and 25B, a sacrificial fill material can be deposited in the line trenches 73 and the discrete openings 41. The sacrificial fill material comprises a material that may be subsequently removed selective to the materials of the first alternating stack (32, 42S), the upper source-level semiconductor layer 116, the optional upper sacrificial liner 105, the source-level sacrificial layer 104, the optional lower sacrificial liner 103, and the lower source-level semiconductor layer 112. For example, the sacrificial fill material may comprise a carbon-based material such as amorphous carbon or diamond-like carbon (DLC), a polymer material, or organosilicate glass.

Excess portions of the sacrificial fill material may be removed from above the horizontal plane including the top surface of the first alternating stack (32, 42S) by performing a planarization process such as a chemical mechanical polishing process. Each remaining portion of the sacrificial fill material that fills a line trench 73 constitutes a sacrificial line trench fill structure 75. Each remaining portion of the sacrificial fill material that fills a discrete opening 41 constitutes a sacrificial pillar structure 45. Generally, the sacrificial line trench fill structures 75 may be formed in the line trenches 73 and the sacrificial pillar structures 45 may be formed in the discrete opening 41 by depositing a same sacrificial fill material in the line trenches 73 and in the discrete openings 41, respectively. Top surfaces of the sacrificial line trench fill structures 75 and the sacrificial pillar structures 45 may be coplanar with the top surface of the topmost layer within the first alternating stack (32, 42S).

The sidewalls of the sacrificial line trench fill structures 75 may have a first average taper angle $\alpha1$ relative to a vertical direction. The first average taper angle $\alpha1$ is an average of the taper angle of the sidewalls of the sacrificial line trench fill structures 75, and may be the same as the taper angle of a tilted vertical plane including a straight top edge of a lengthwise sidewall of a sacrificial line trench fill structure 75 and a straight bottom edge of the lengthwise sidewall of the sacrificial line trench fill structure 75. The first average taper angle $\alpha1$ may be in a range from 1 degree to 20 degrees such as from 2 degree to 10 degrees, although lesser and greater angles may also be employed.

Figure 26:
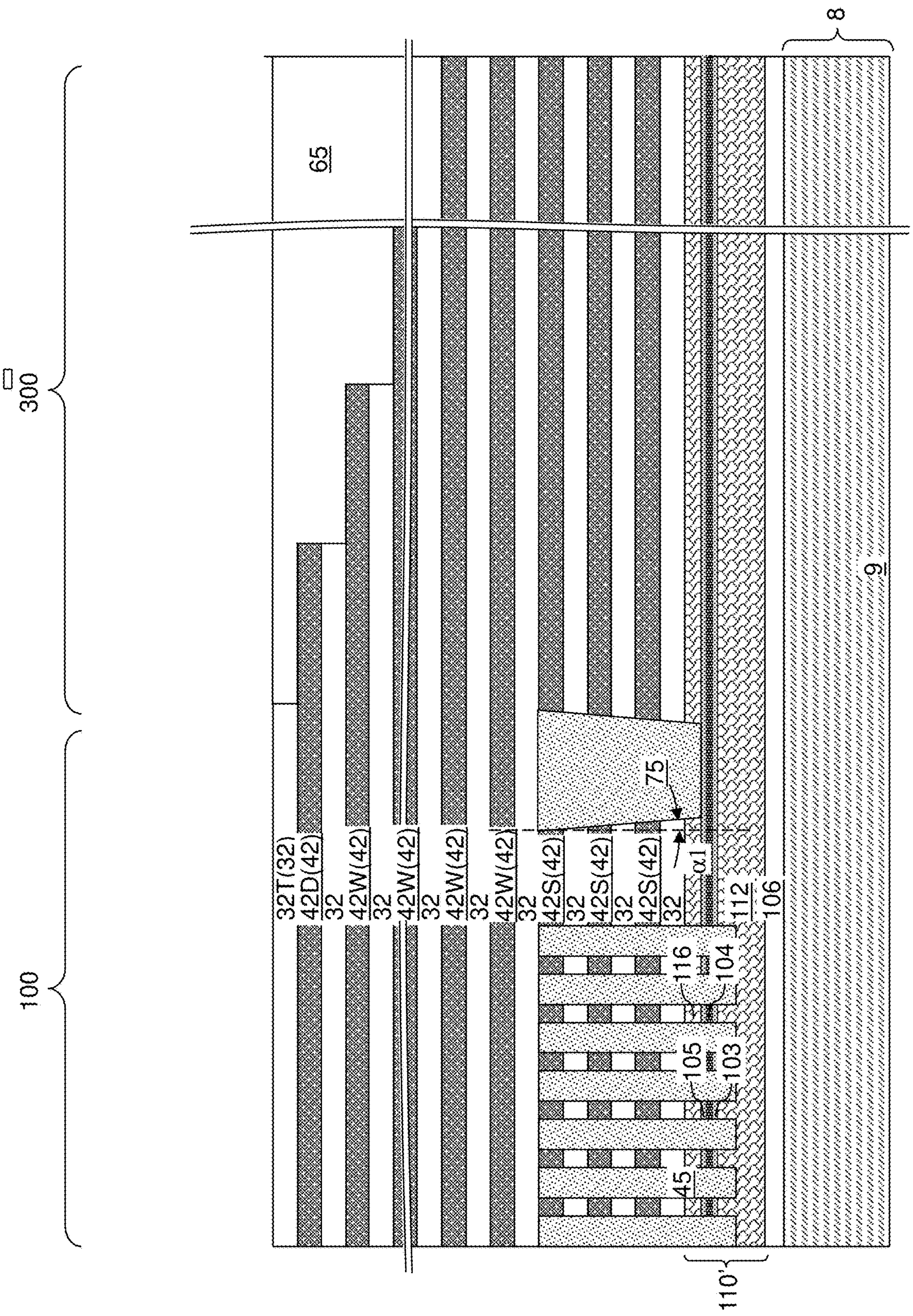
FIG. 26 is a schematic vertical cross-sectional view of the second exemplary structure after formation of a second alternating stack of second insulating layers and second sacrificial material layers and a retro-stepped dielectric material portion according to the second embodiment of the present disclosure.

Referring to FIG. 26, a second alternating stack (32, 42W, 42D) of second insulating layers 32 and second sacrificial material layers (42W, 42D) can be formed over the first alternating stack (32, 42S). The second sacrificial material layers (42W, 42D) comprise word-line-level sacrificial material layers 42W that are subsequently replaced with word-line-level electrically conductive layers that function as word lines, and drain-select-level sacrificial material layers 42D that are subsequently replaced with drain-select-level electrically conductive layers that function as drain select electrodes. Optionally, some of the word-line-level sacrificial material layers 42W may be replaced with dummy word lines or additional source-select-level electrically conductive layers (e.g., SGS layers) instead of word lines.

Each of the second insulating layers 32 may have the same material composition as and the same thickness range as the insulating layers 32 that are described with reference to FIG. 5. Each of the second sacrificial material layers (42W, 42D) may have the same material composition as and the same thickness range as the sacrificial material layers 42 that are described with reference to FIG. 5.

In an alternative embodiment, two separate second alternating stacks of second insulating layers 32 and second sacrificial material layers (42W, 42D) may be formed over the first alternating stack (32, 42S). In this embodiment, additional discrete openings 41 are formed through the bottom second alternating stack and are filled with additional sacrificial material to extend the height of the sacrificial pillar structures 45 through bottom second alternating stack. The top second alternating stack is then formed over the bottom second alternating stack and the sacrificial pillar structures 45.

Subsequently, the processing steps described with reference to FIG. 6 may be performed to form a retro-stepped dielectric material portion 65.

Figure 27:
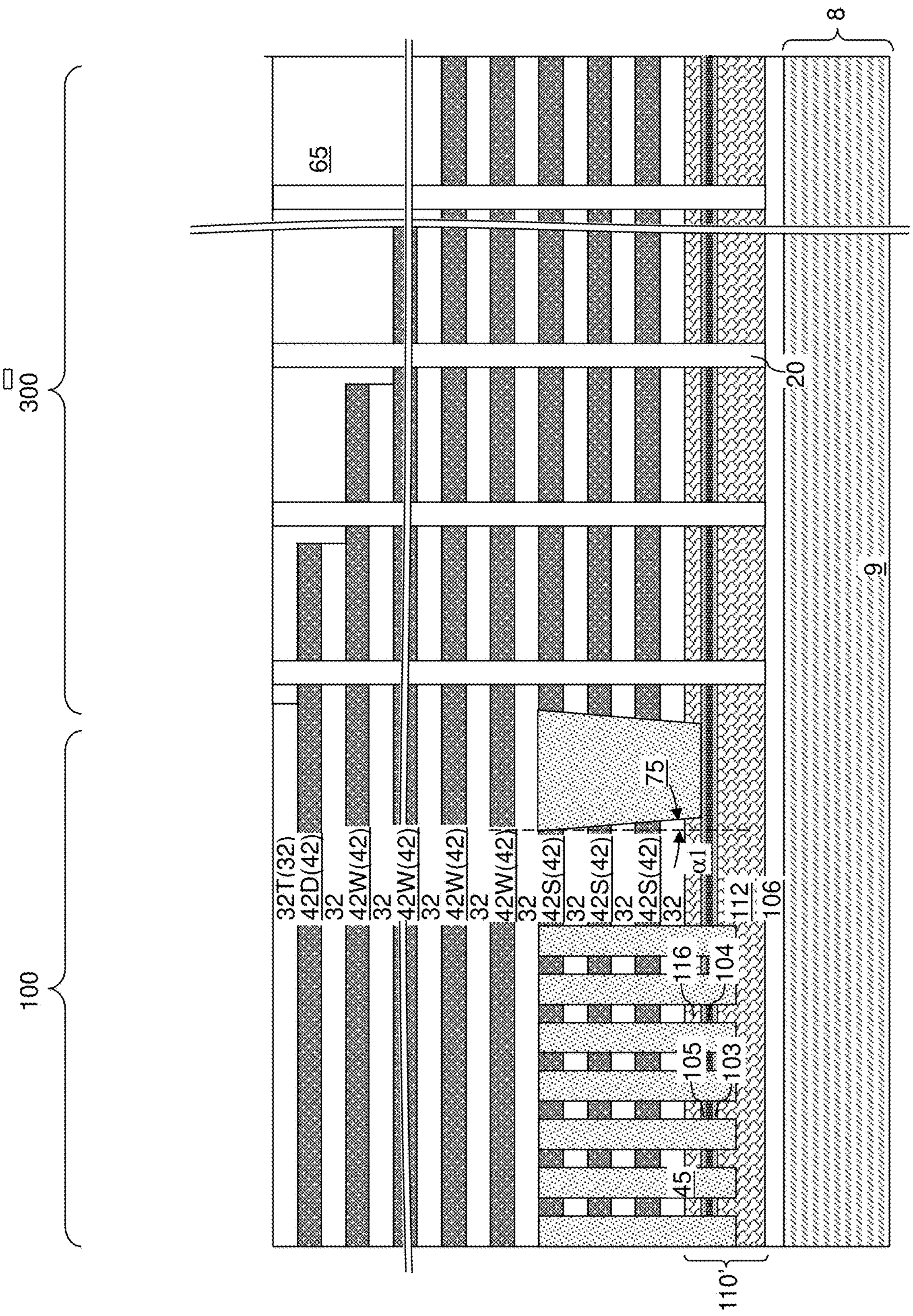
FIG. 27 is a schematic vertical cross-sectional view of the second exemplary structure after formation of support pillar structures according to the second embodiment of the present disclosure.

Referring to FIG. 27, support openings can be formed in the same pattern as described with reference to FIGS. 7A and 7B. A dielectric fill material can be deposited in the support openings, and excess portions of the dielectric fill material may be removed from above the topmost insulating layer 32T. Each remaining portion of the dielectric fill material that fills a respective support opening constitutes a support pillar structure 20.

Figure 28:
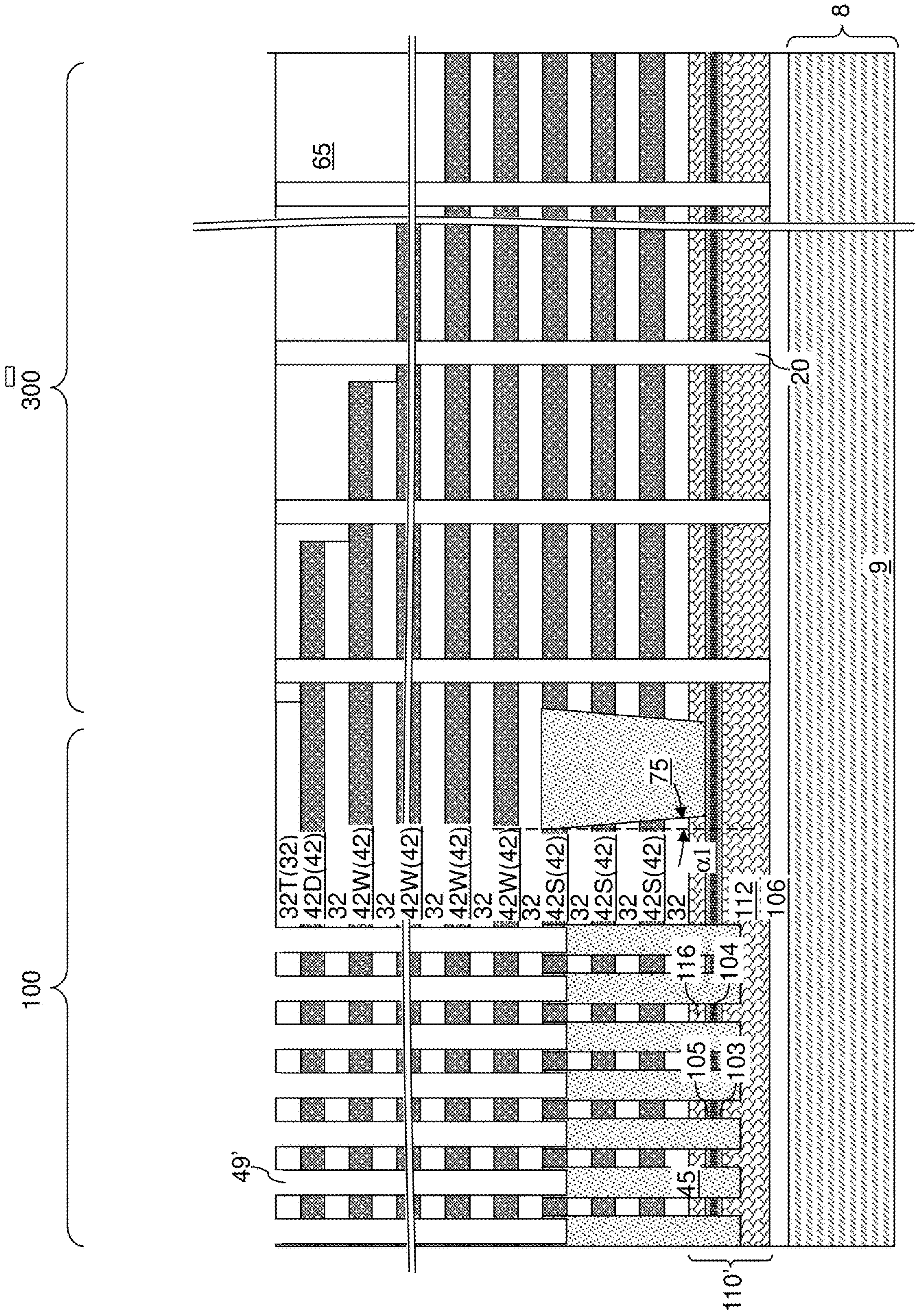
FIG. 28 is a schematic vertical cross-sectional view of the second exemplary structure after formation of in-process memory openings according to the second embodiment of the present disclosure.

Referring to FIG. 28, a photoresist layer (not shown) can be applied over the topmost insulating layer 32T, and can be lithographically patterned to form openings having the same pattern as the memory openings 49 illustrated with reference to FIGS. 7A and 7B. An anisotropic etch process can be performed to transfer the pattern of the openings in the photoresist layer through the second alternating stack (32, 42W, 42D) (or through the top second alternating stack if two second alternating stacks are formed). The sacrificial pillar structures 45 can function as etch stop structures during the anisotropic etch process. In-process memory openings 49' can be formed through the second alternating stack (32, 42W, 42D) (or through the top second alternating stack if two second alternating stacks are formed) over the sacrificial pillar structures 45.

Figure 29:
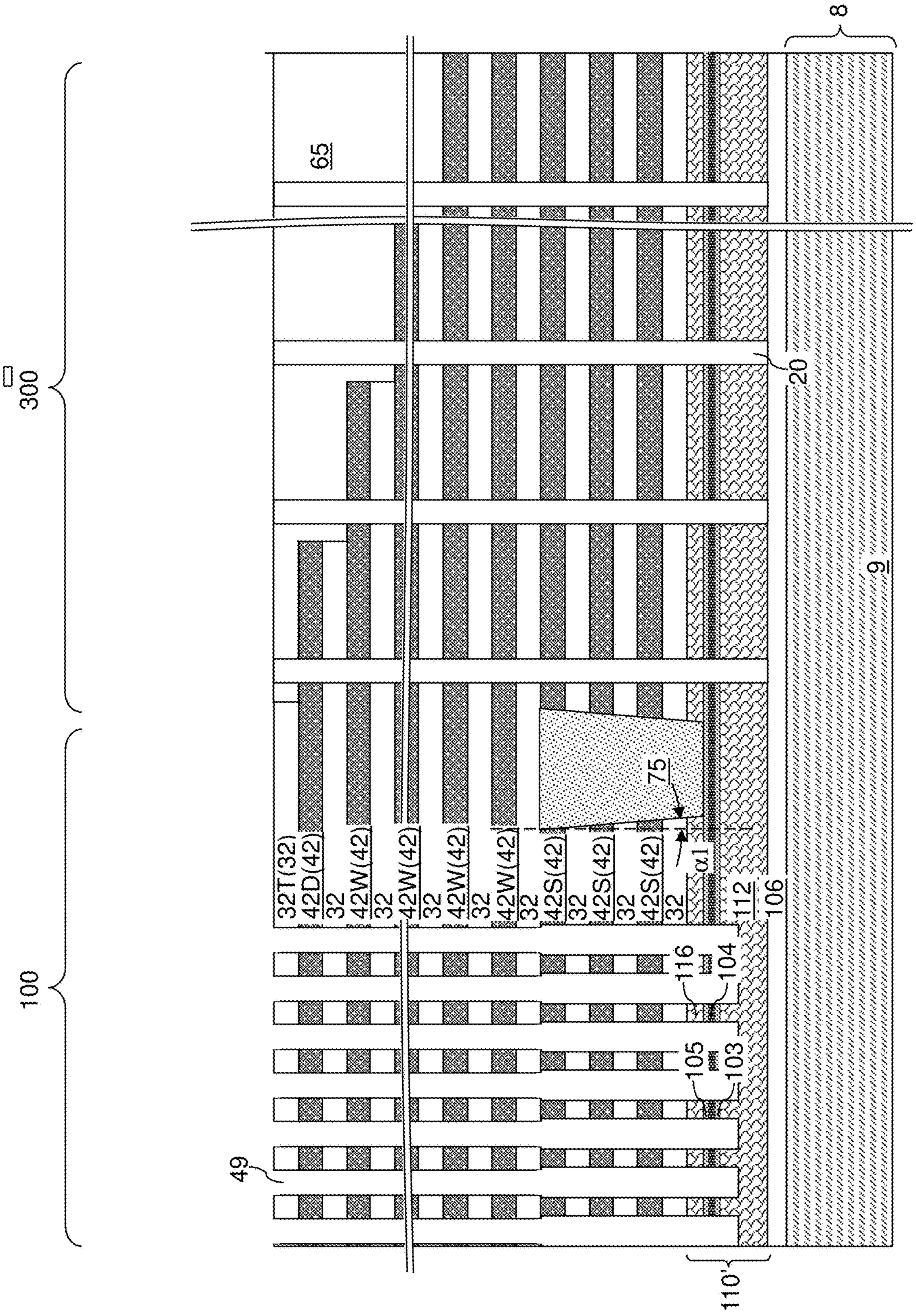
FIG. 29 is a schematic vertical cross-sectional view of the second exemplary structure after formation of memory openings according to the second embodiment of the present disclosure.

Referring to FIG. 29, the sacrificial pillar structures 45 can be removed from underneath the in-process memory openings 49' by performing a selective removal process. In case the sacrificial pillar structures 45 comprise a carbon-based material, such as amorphous carbon, the selective removal process may comprise an ashing process. Alternatively, the selective removal process may comprise a selective etch process. Generally, the sacrificial pillar structures 45 are removed selective to the material of the second alternating stack (32, 42W, 42D), the first alternating stack (32, 42S), the upper source-level semiconductor layer 116, the optional upper sacrificial liner 105, the source-level sacrificial layer 104, and the optional lower sacrificial liner 103, and the lower source-level semiconductor layer 112. Memory openings 49 can be formed by vertically extending the in-process memory openings 49' through removal of the sacrificial pillar structures 45.

Figure 30A:
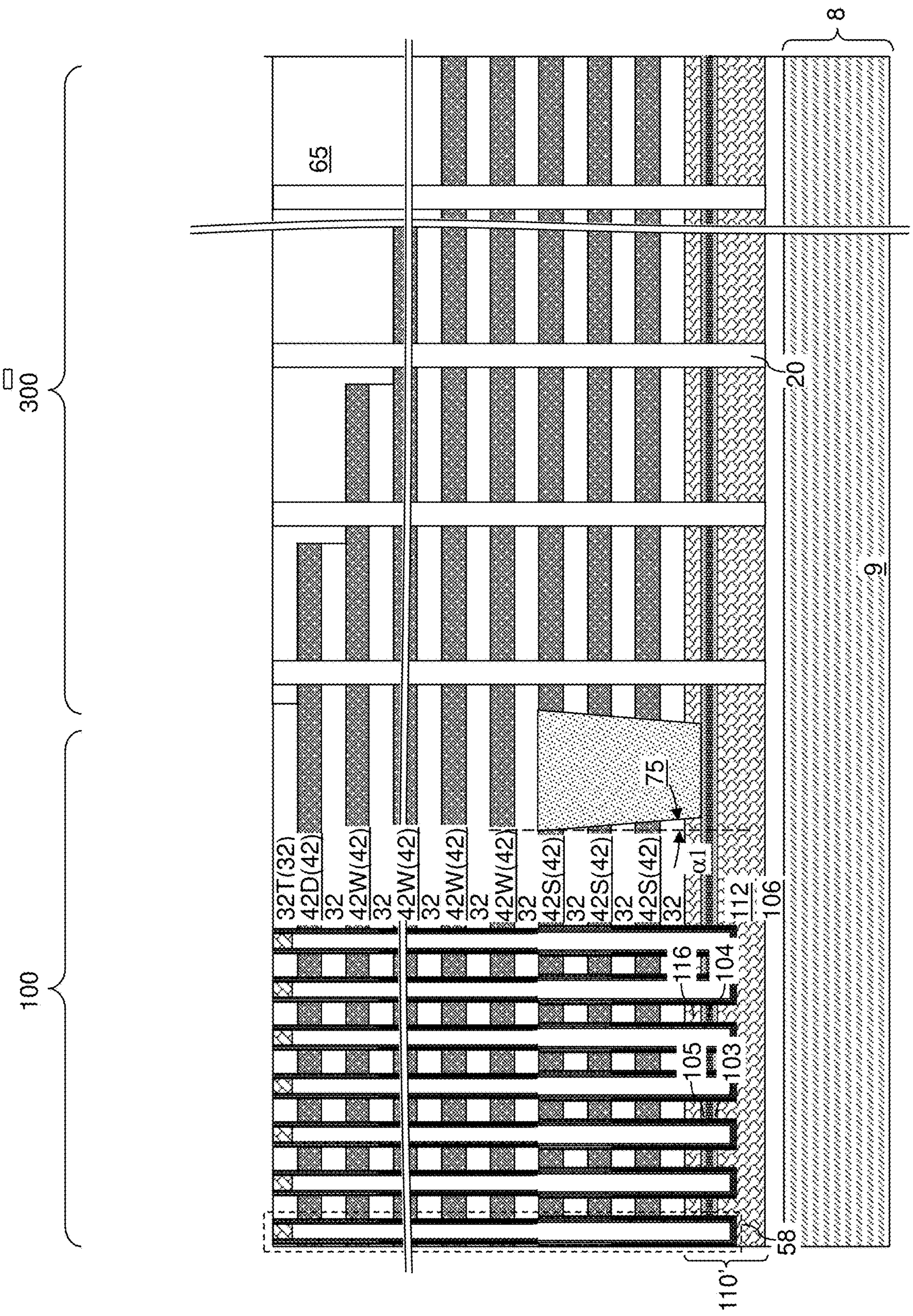
FIG. 30A is a vertical cross-sectional view of the second exemplary structure after formation of memory opening fill structures according to the second embodiment of the present disclosure.
Figure 30B:
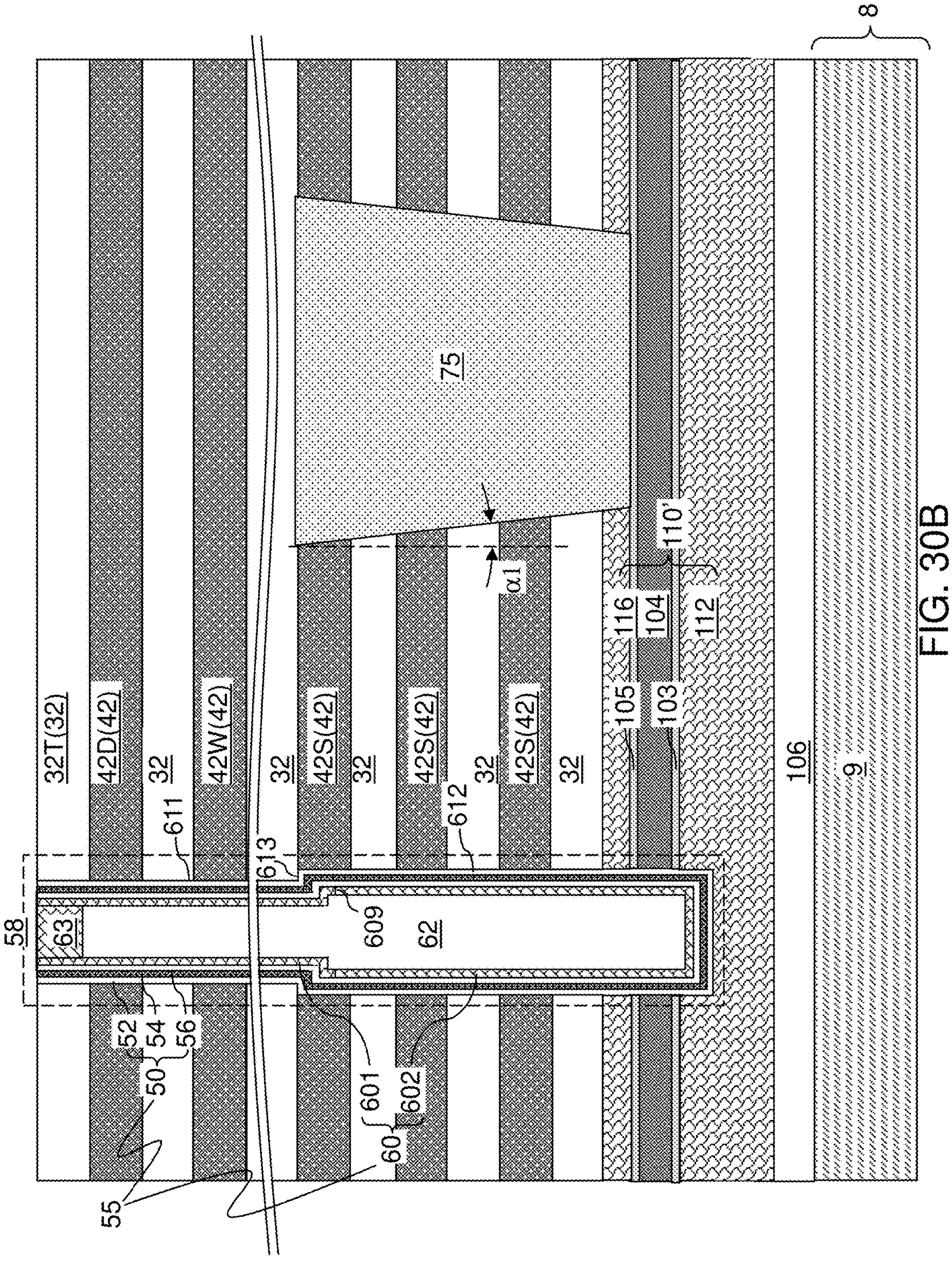
FIG. 30B is a magnified view of a region of the second exemplary structure of FIG. 30A.

Referring to FIGS. 30A and 30B, the processing steps described with reference to FIGS. 9A-9D can be performed to form a memory opening fill structure 58 within each memory opening 49. Generally, each memory opening fill structure 58 may comprise a memory film 50 and a vertical semiconductor layer 60 that vertically extend through the second alternating stack (32, 42W, 42D), the first alternating stack (32, 42S), the upper source-level semiconductor layer 116, the optional upper sacrificial liner 105, the source-level sacrificial layer 104, and the optional lower sacrificial liner 103, and into an upper portion of the lower source-level semiconductor layer 112.

In one embodiment, a bottom portion of each in-process memory opening 49' may have a lesser lateral extent than a top portion of an underlying sacrificial pillar structure 45 prior to removal of the sacrificial pillar structures 45. In this case, a lower portion of a memory opening 49 that is laterally surrounded by the first alternating stack (32, 42S) may be wider than an upper portion of the memory opening 49 that is laterally surrounded by the second alternating stack (32, 42W, 42D).

In one embodiment, a memory opening fill structure 58 may comprise a stepped surface that vertically extends from a bottommost surface to a topmost surface of the memory opening fill structure 58. In one embodiment, the stepped surface may comprise: an upper surface segment 611 that contacts the first subset of the insulating layers 32 and the electrically conductive layers 46 within the alternating stack (32, 46); a lower surface segment 612 that contacts the second subset of the insulating layers 32 and the electrically conductive layers 46 within the alternating stack (32, 46); and an annular surface segment 613 that is adjoined to the upper surface segment 611 and to the lower surface segment 612. In one embodiment, the annular surface segment 613 is located in a horizontal plane including the interface between the first alternating stack (32, 42S) and the second alternating stack (32, 42W, 42D). In one embodiment, the annular surface segment 613 contacts an annular bottom surface segment of a bottommost insulating layer 32 within the second alternating stack (32, 42W, 42D).

Figure 31:
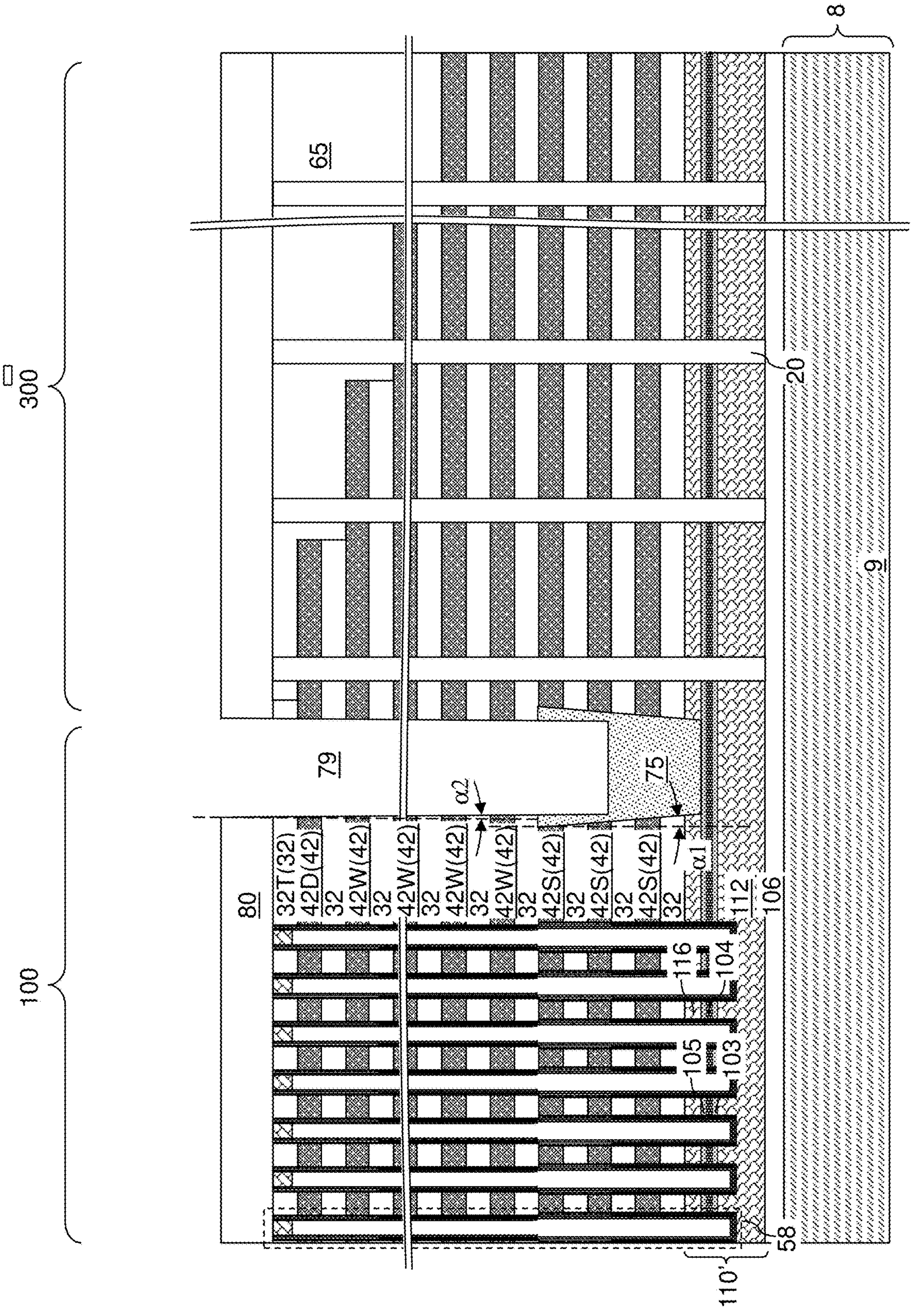
FIG. 31 is a vertical cross-sectional view of the second exemplary structure after formation of lateral isolation trenches according to the second embodiment of the present disclosure.

Referring to FIG. 31, the processing steps described with reference to FIGS. 11A and 11B may be performed to form a contact-level dielectric layer 80, and to form lateral isolation trenches 79 through the contact-level dielectric layer 80 and the second alternating stack (32, 42W, 42D). The sacrificial line trench fill structures 75 can be employed as etch stop structures for the anisotropic etch process that forms the lateral isolation trenches 79. Each lateral isolation trench 79 can be formed through the second alternating stack (32, 42W, 42D) such that a surface of a sacrificial line trench fill structure 75 is exposed underneath the lateral isolation trench 79. An upper portion of each sacrificial line trench fill structure 75 may be collaterally etched during formation of the lateral isolation trenches 79.

The sidewalls of the lateral isolation trenches 79 located between the top surface of the contact-level dielectric layer 80 and the bottommost surface of the second alternating stack (32, 42W, 42D) may have a second average taper angle $\alpha 2$ relative to a vertical direction. The second average taper angle $\alpha 2$ is an average of the taper angle of the sidewalls of the lateral isolation trenches 79 between the top surface of the contact-level dielectric layer 80 and the bottommost surface of the second alternating stack (32, 42W, 42D). In one embodiment, the second average taper angle $\alpha 2$ may be the same as the taper angle of a tilted vertical plane including a straight top edge of a lengthwise sidewall of a lateral isolation trench 79 and a straight bottom edge of the lengthwise sidewall of the lateral isolation trench 79. The second average taper angle $\alpha 2$ may be in a range from 0 degree to 10 degrees such as from 0.1 degree to 5 degrees, although lesser and greater angles may also be employed. In one embodiment, the second average taper angle $\alpha 2$ is smaller than the first average taper angle $\alpha 1$, and the second average taper angle $\alpha 2$ may be zero in some embodiments.

Figure 32:
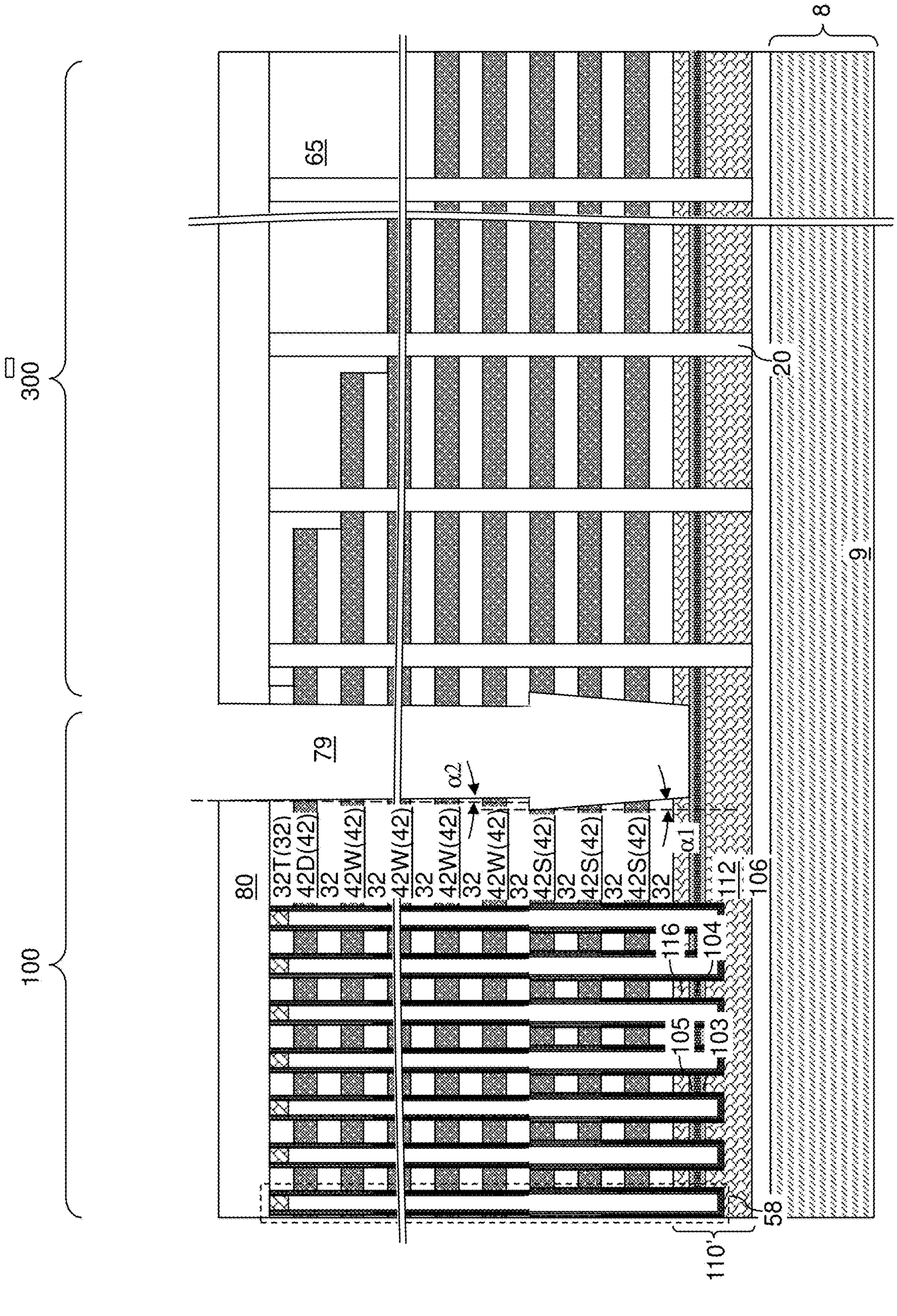
FIG. 32 is a vertical cross-sectional view of the second exemplary structure after vertically extending the lateral isolation trenches by removing the sacrificial line trench fill structures according to the second embodiment of the present disclosure.

Referring to FIG. 32, the sacrificial line trench fill structures 75 can be removed from underneath the lateral isolation trenches 79 by performing a selective removal process. In case the sacrificial line trench fill structures 75 comprise a carbon-based material, such as amorphous carbon, the selective removal process may comprise an ashing process. Alternatively, the selective removal process may comprise a selective etch process.

In summary, the sacrificial line trench fill structures 75 are removed selective to the material of the second alternating stack (32, 42W, 42D), the first alternating stack (32, 42S), the upper source-level semiconductor layer 116, the optional upper sacrificial liner 105, the source-level sacrificial layer 104, and the optional lower sacrificial liner 103, and the lower source-level semiconductor layer 112. Thus, the lateral isolation trenches 79 are vertically extended by removing the sacrificial line trench fill structures 75.

Figure 33:
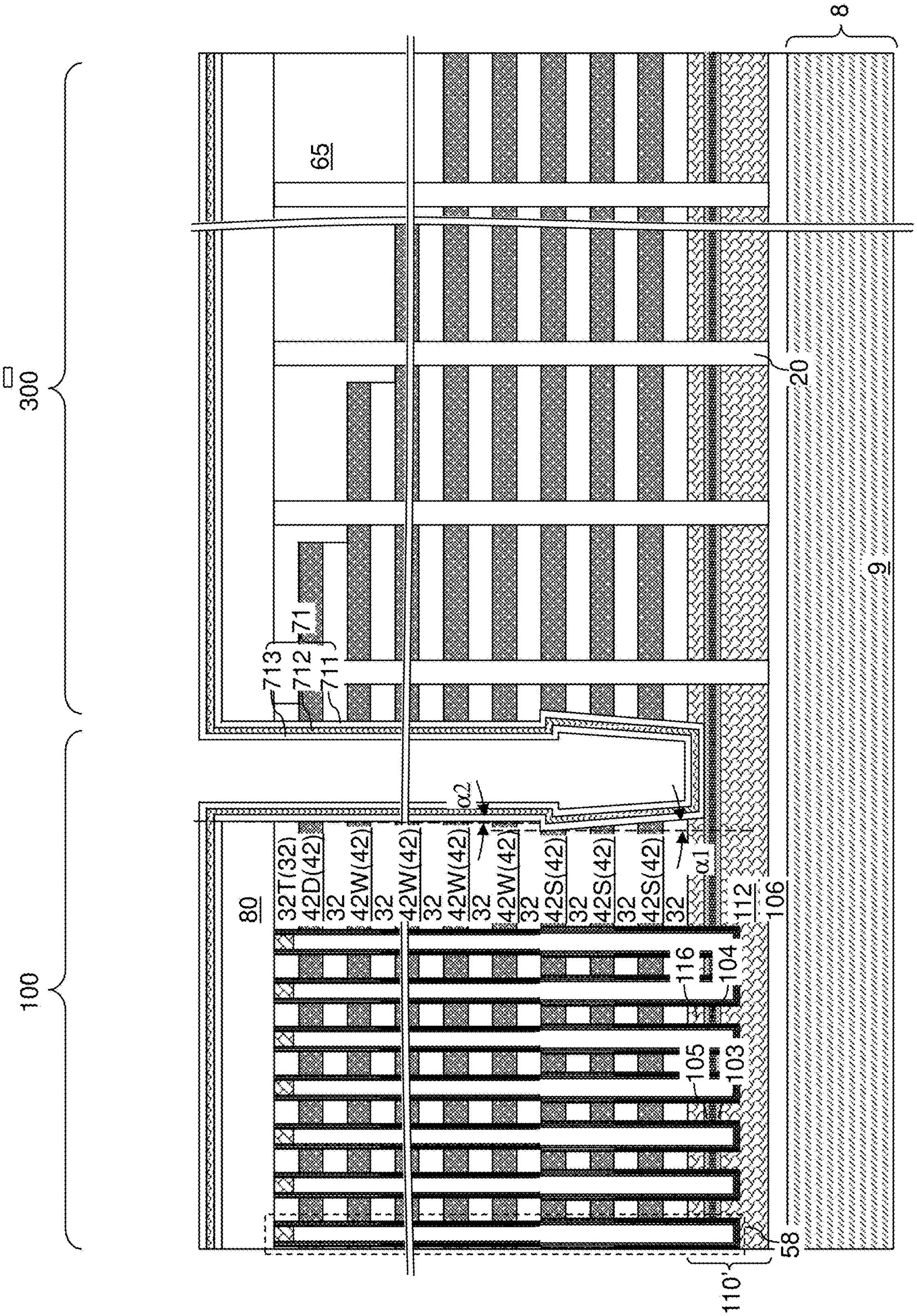
FIG. 33 is a vertical cross-sectional view of the second exemplary structure after formation of sacrificial spacer layers according to the second embodiment of the present disclosure.

Referring to FIG. 33, the processing steps described with reference to FIG. 12 can be performed to form the sacrificial spacer layers 71 in the lateral isolation trenches 79.

Figure 34:
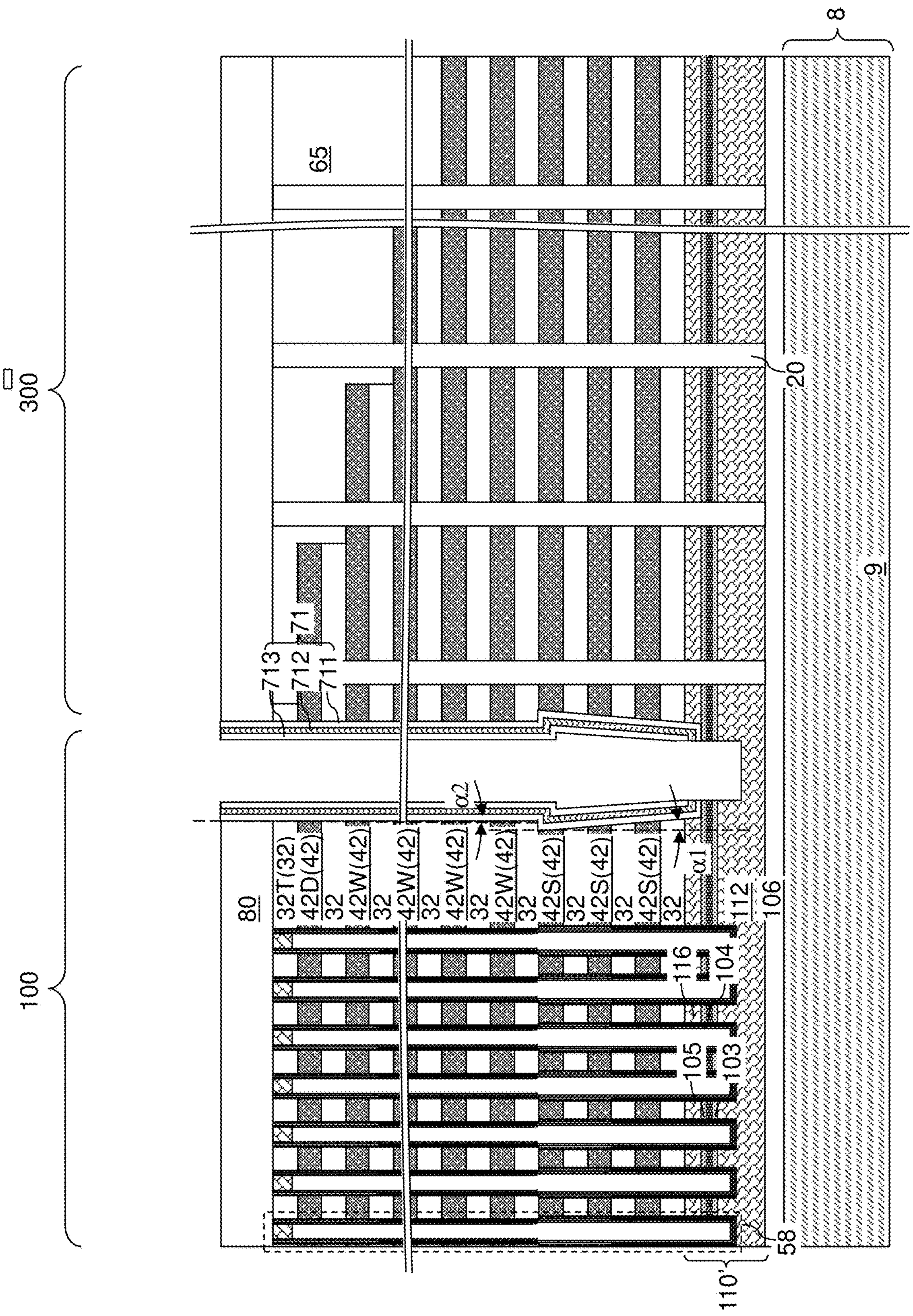
FIG. 34 is a vertical cross-sectional view of the second exemplary structure after removal of horizontally-extending portions of the sacrificial spacer layers according to the second embodiment of the present disclosure.

Referring to FIG. 34, the processing steps described with reference to FIG. 13 can be performed to remove horizontally-extending potions of the sacrificial spacer layers 71, and to vertically extend the cavity within each lateral isolation trench 79 through the optional upper sacrificial liner 105, the source-level sacrificial layer 104, and the optional lower sacrificial liner 103, and into an upper portion of the lower source-level semiconductor layer 112.

Figure 35:
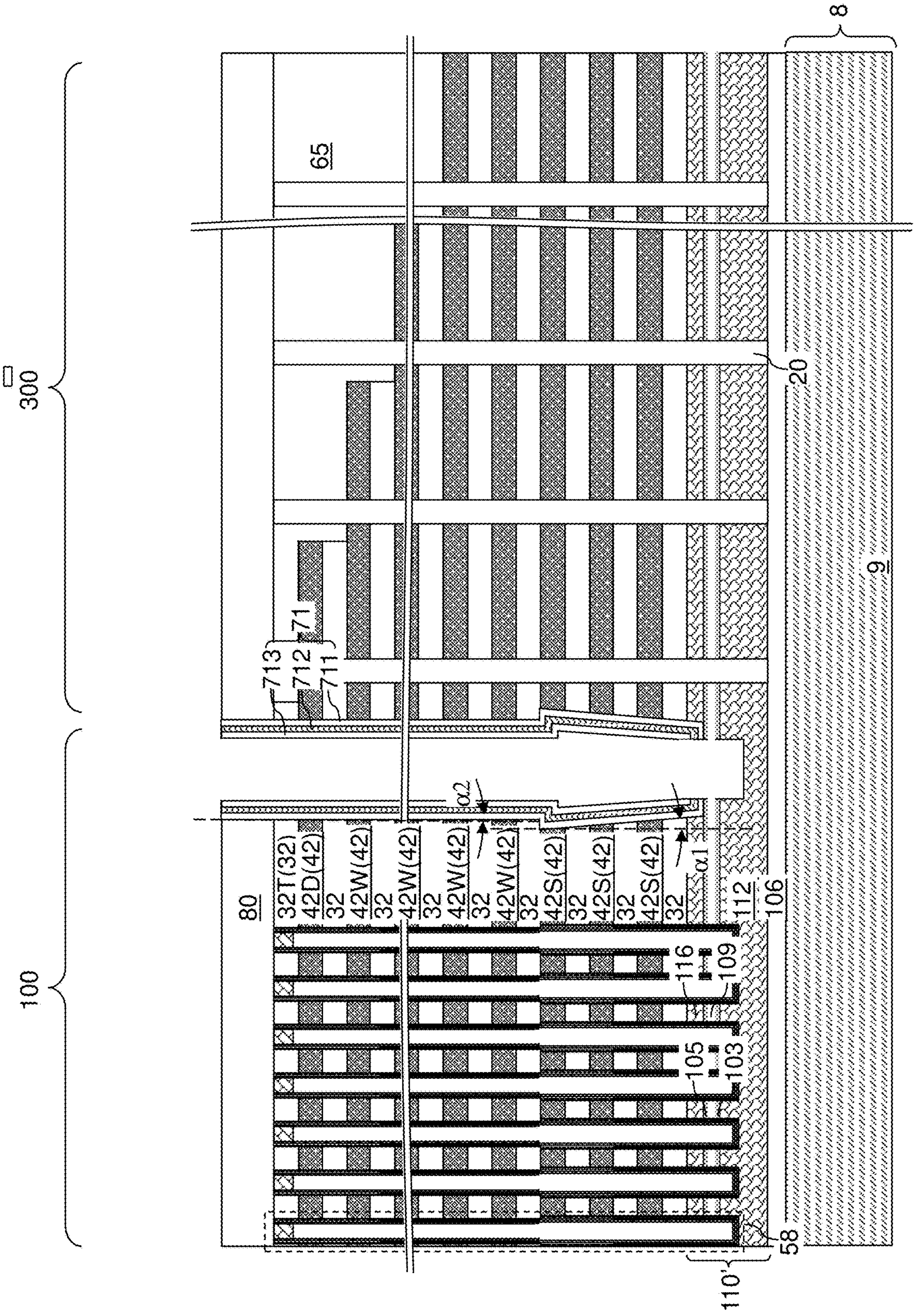
FIG. 35 is a vertical cross-sectional view of the second exemplary structure after formation of a source cavity according to the second embodiment of the present disclosure.

Referring to FIG. 35, the processing steps described with reference to FIGS. 14A and 14B may be optionally performed. Subsequently, the processing steps described with reference to FIGS. 15A and 15B may be performed to form the source cavity 109. Cylindrical surface segments of outer sidewalls of the memory films 50 can be physically exposed to the source cavity 109.

Figure 36:
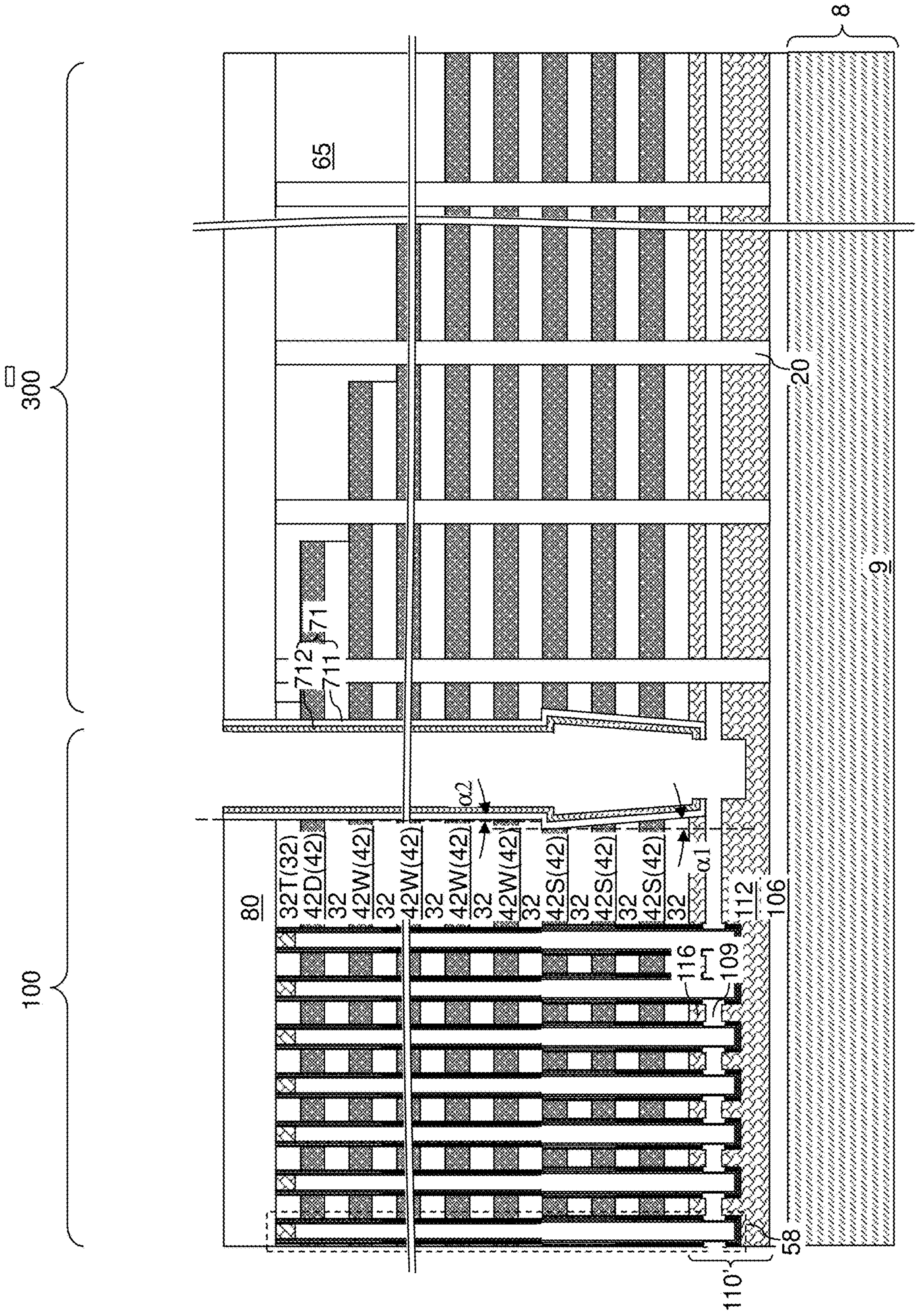
FIG. 36 is a vertical cross-sectional view of the second exemplary structure after physically exposing surface segments of the vertical semiconductor layers according to the second embodiment of the present disclosure.

Referring to FIG. 36, the processing steps described with reference to FIG. 16A can be performed to sequentially etch the various component layers of the memory films 50 from outside to inside, and to physically expose cylindrical surfaces of the vertical semiconductor layers 60 at the level of the source cavity 109. The upper sacrificial liner 105 (if present) and the lower sacrificial liner 103 (if present) may be collaterally etched during removal of the portions of the memory films 50 located at the level of the source cavity 109.

Figure 37:
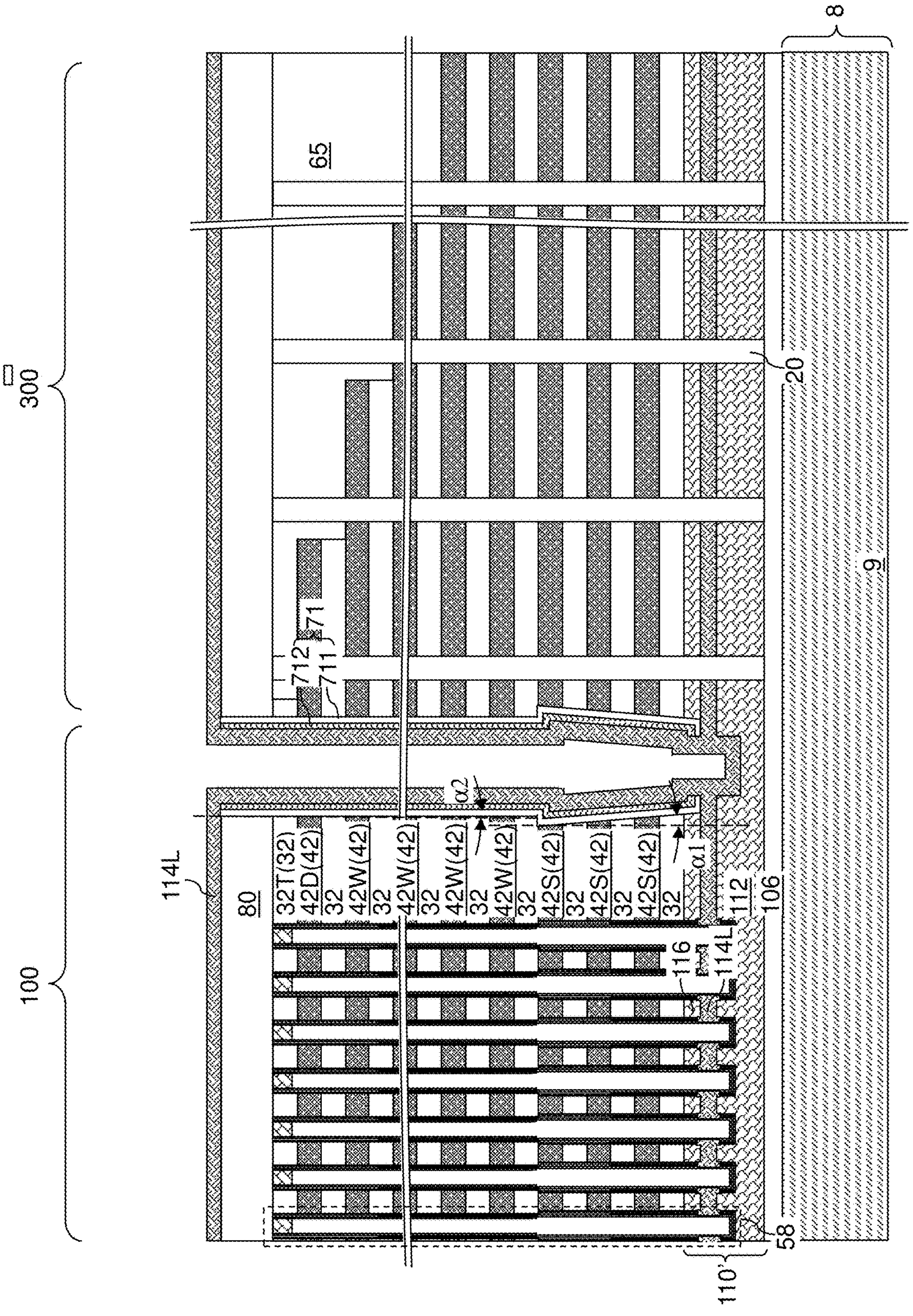
FIG. 37 is a vertical cross-sectional view of the second exemplary structure after deposition of a source contact material layer according to the second embodiment of the present disclosure.

Referring to FIG. 37, the processing steps described with reference to FIG. 16B may be performed to form a source contact material layer 114L. The source contact material layer 114L may optionally fill the entire volume of the source cavity 109. In case the source contact material layer 114L does not fill the entire volume of the source cavity 109, an insulating fill material layer (115 shown in FIG. 16C) may be deposited in any remaining volume 109V of the source cavity 109 as described with reference to FIG. 16C.

Figure 38A:
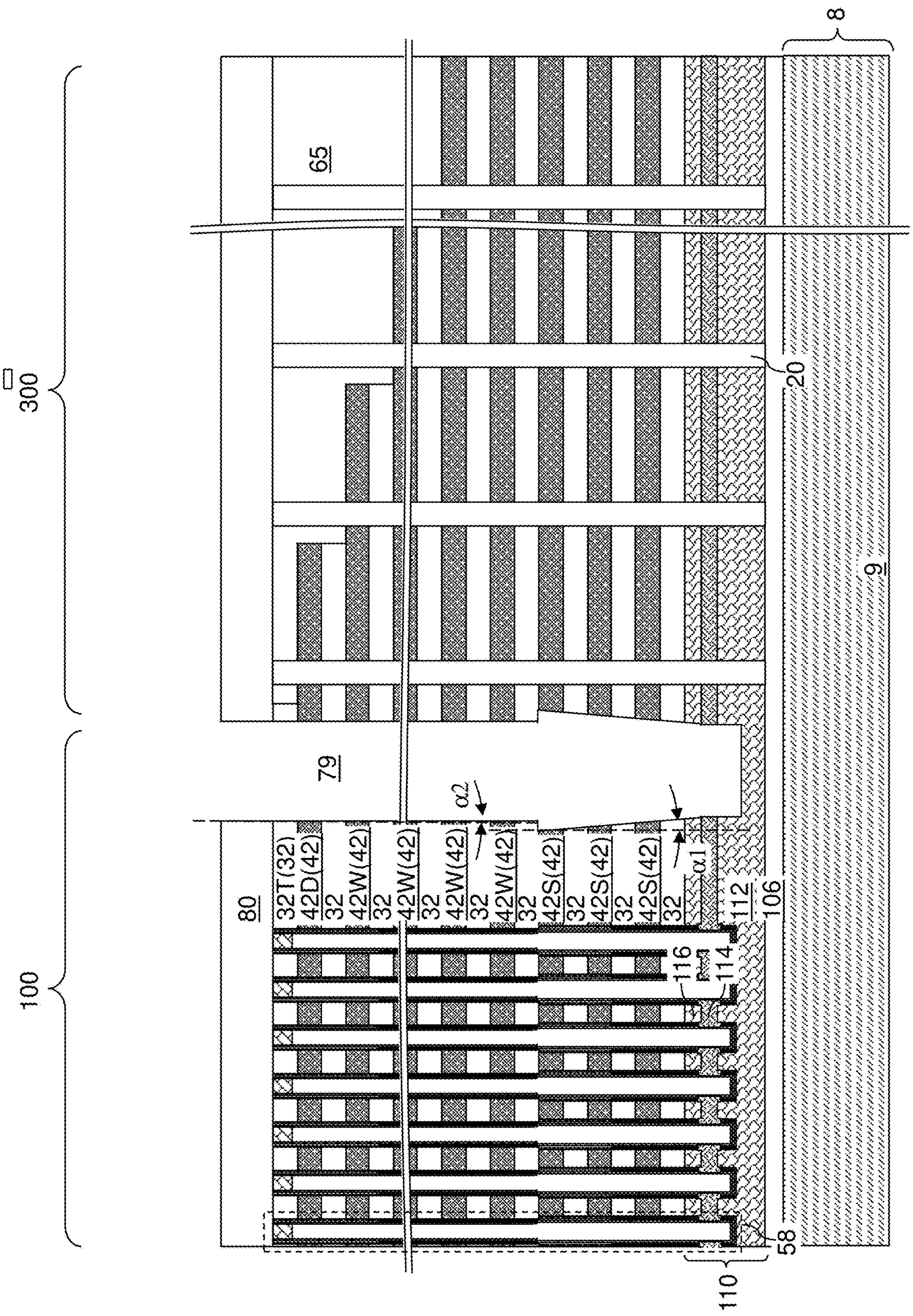
FIG. 38A is a vertical cross-sectional view of the second exemplary structure after removing material portions from inside the lateral isolation trenches and from above the contact-level dielectric layer according to the second embodiment of the present disclosure.

Referring to FIG. 38A, the processing steps described with reference to FIG. 16D can be performed to remove potions of the insulating fill material layer (if employed), the source contact material layer 114L, and the sacrificial spacer layers 71 from within the volumes of the lateral isolation trenches 79 and from above the top surface of the contact-level dielectric layer 80. Each remaining portion of the source contact material layer 114L constitutes the source contact layer 114.

In summary, a portion of the memory film 50 can be removed after removing the source-level sacrificial layer 104 to physically expose a vertical semiconductor layer 60, and a source contact layer 114 is formed directly on the vertical semiconductor layer 60. Thus, the source-level sacrificial layer 104 is replaced with at least a source contact layer 114 by providing an etchant that etches the source-level sacrificial layer 104 through a lateral isolation trench 79 and by providing a reactant that deposits the source contact layer 114 through the lateral isolation trench 79. A source-level material layer 110 is formed, which comprises, from bottom to top, a lower source-level semiconductor layer 112, a source contact layer 114, and an upper source-level semiconductor layer 116.

Figure 38B:
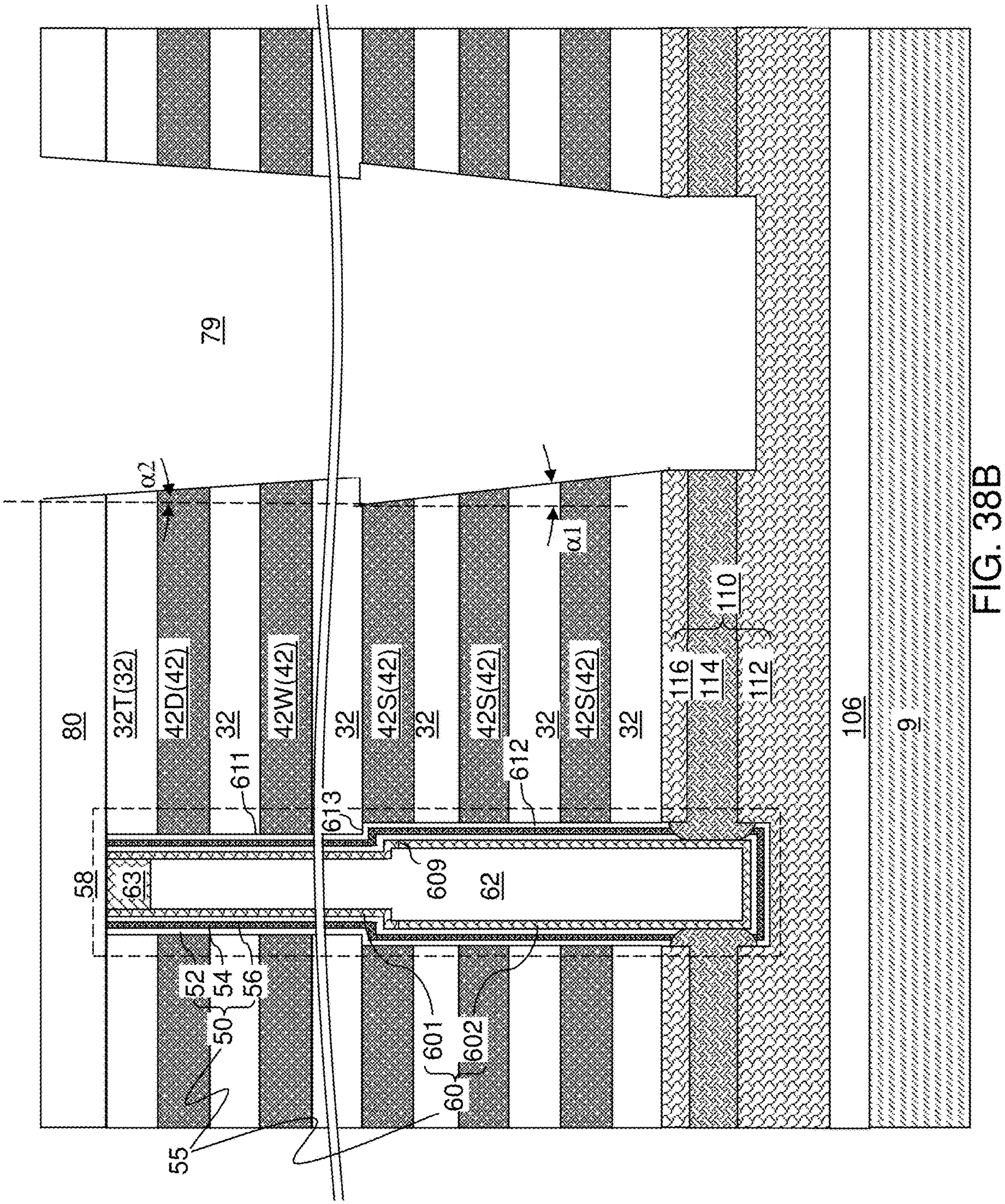
FIGS. 38B-38D are magnified views of various configurations of the second exemplary structure after an anneal process that shifts a p-n junction according to the second embodiment of the present disclosure.
Figure 38C:
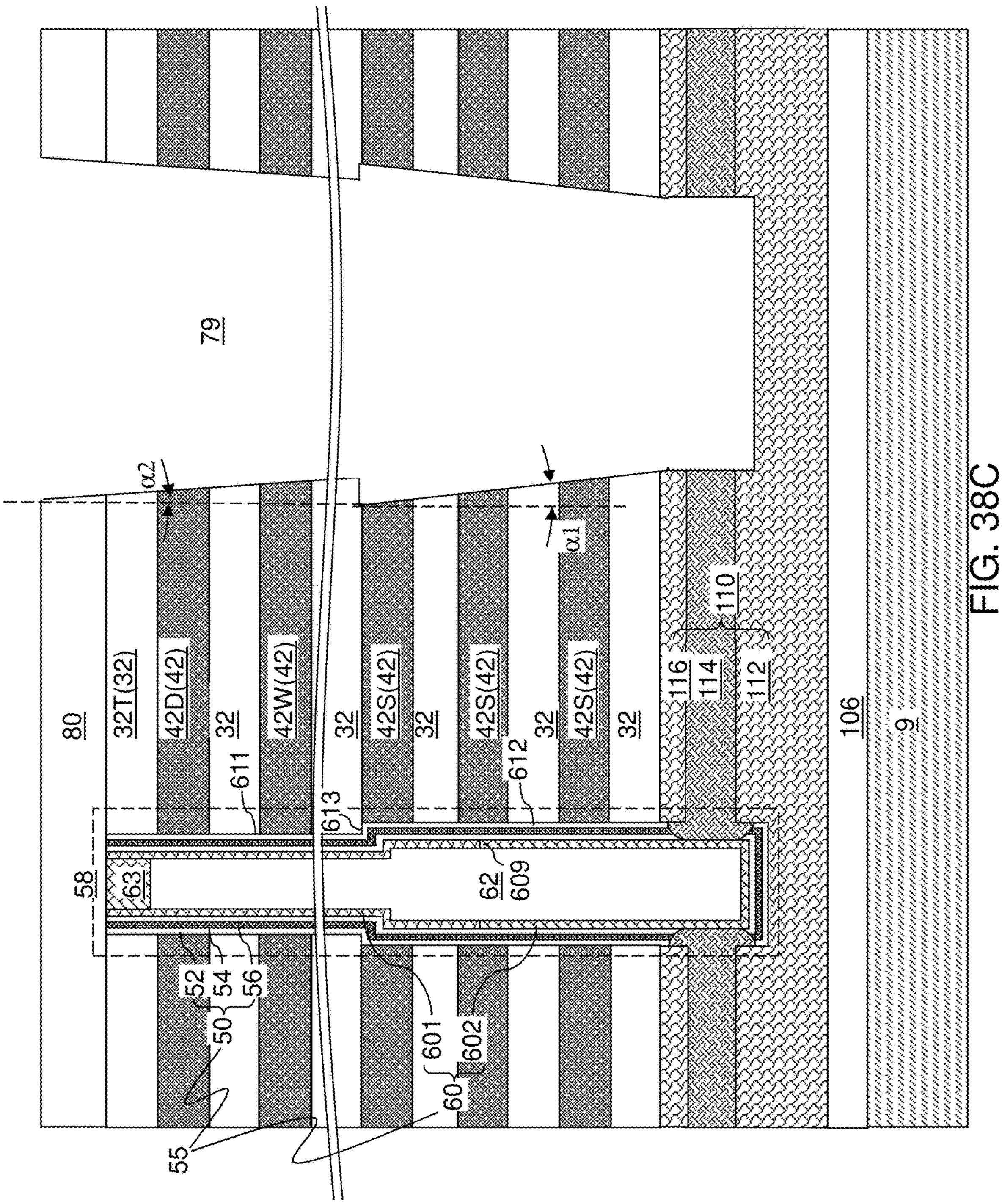
Figure 38D:
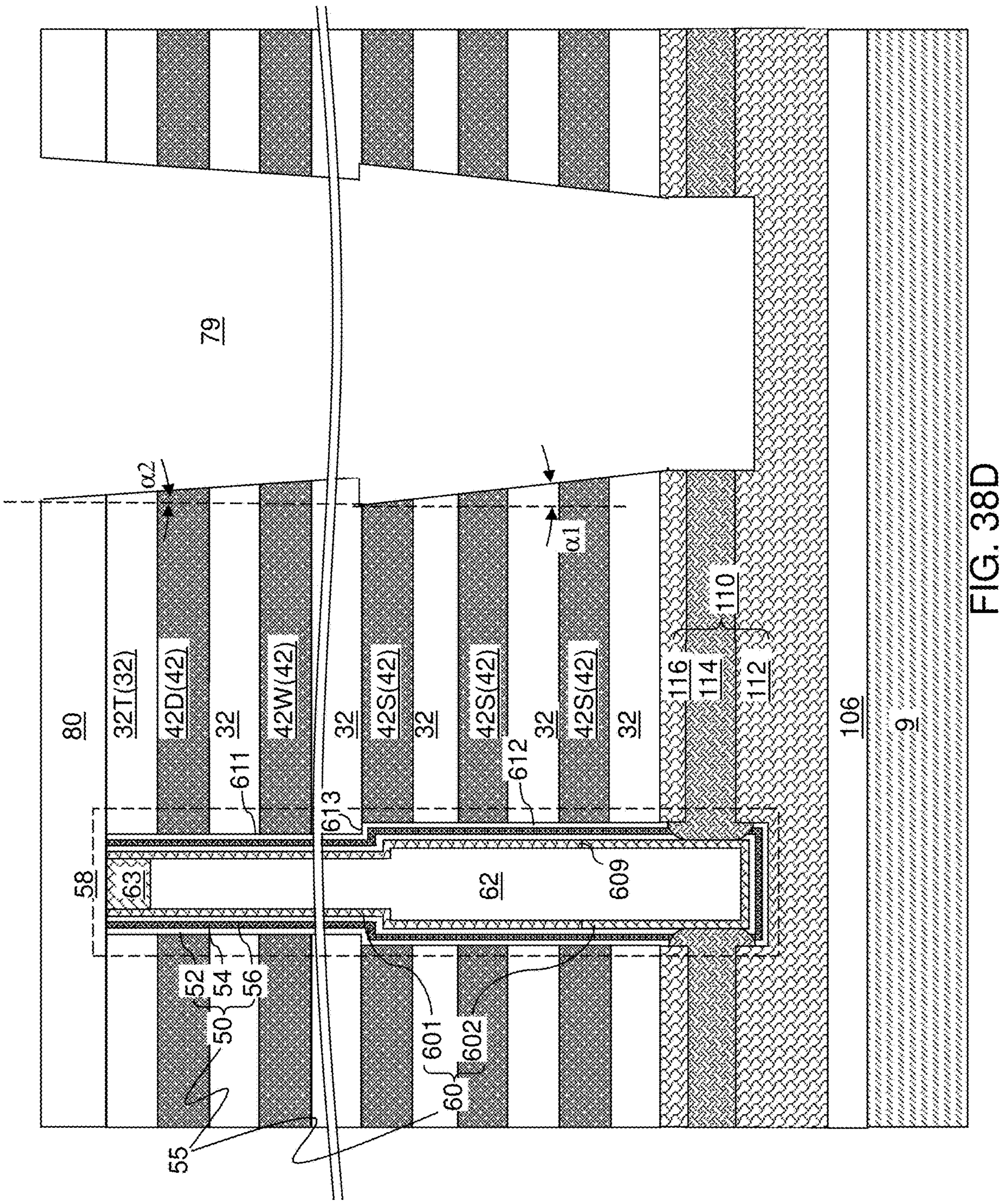

Referring to FIGS. 38B-38D, an anneal process can be performed to diffuse dopants of the second conductivity type from the source contact layer 114 upward into a bottom end portion of each vertical semiconductor layer 60. The vertical semiconductor layer 60 comprises a first-conductivity-type semiconductor channel 601 and a second-conductivity-type source extension region 602 with a p-n junction 609 between them.

Specifically, the p-n junction 609 is formed above the horizontal plane including the bottommost surface of the first alternating stack (32, 42S) of the first insulating layers 32 and the first sacrificial material layers 42S, and below the horizontal plane including the topmost surface of the first alternating stack (32, 42S) of the first insulating layers 32 and the first sacrificial material layers 42S. In one embodiment, the p-n junctions 609 may be formed at a level of a topmost sacrificial material layer 42S within the first alternating stack of insulating layers 32 and first sacrificial material layers 42S as illustrated in FIG. 38B. In another embodiment, the p-n junctions 609 may be formed below the level of a topmost sacrificial material layer 42S within the first alternating stack of insulating layers 32 and first sacrificial material layers 42S and above the level of a bottommost sacrificial material layer 42S within the first alternating stack of insulating layers 32 and first sacrificial material layers 42S as illustrated in FIG. 38C. In yet another embodiment, the p-n junctions 609 may be formed at a level of a bottommost sacrificial material layer 42S within the first alternating stack of insulating layers 32 and first sacrificial material layers 42S as illustrated in FIG. 38D.

Figure 39:
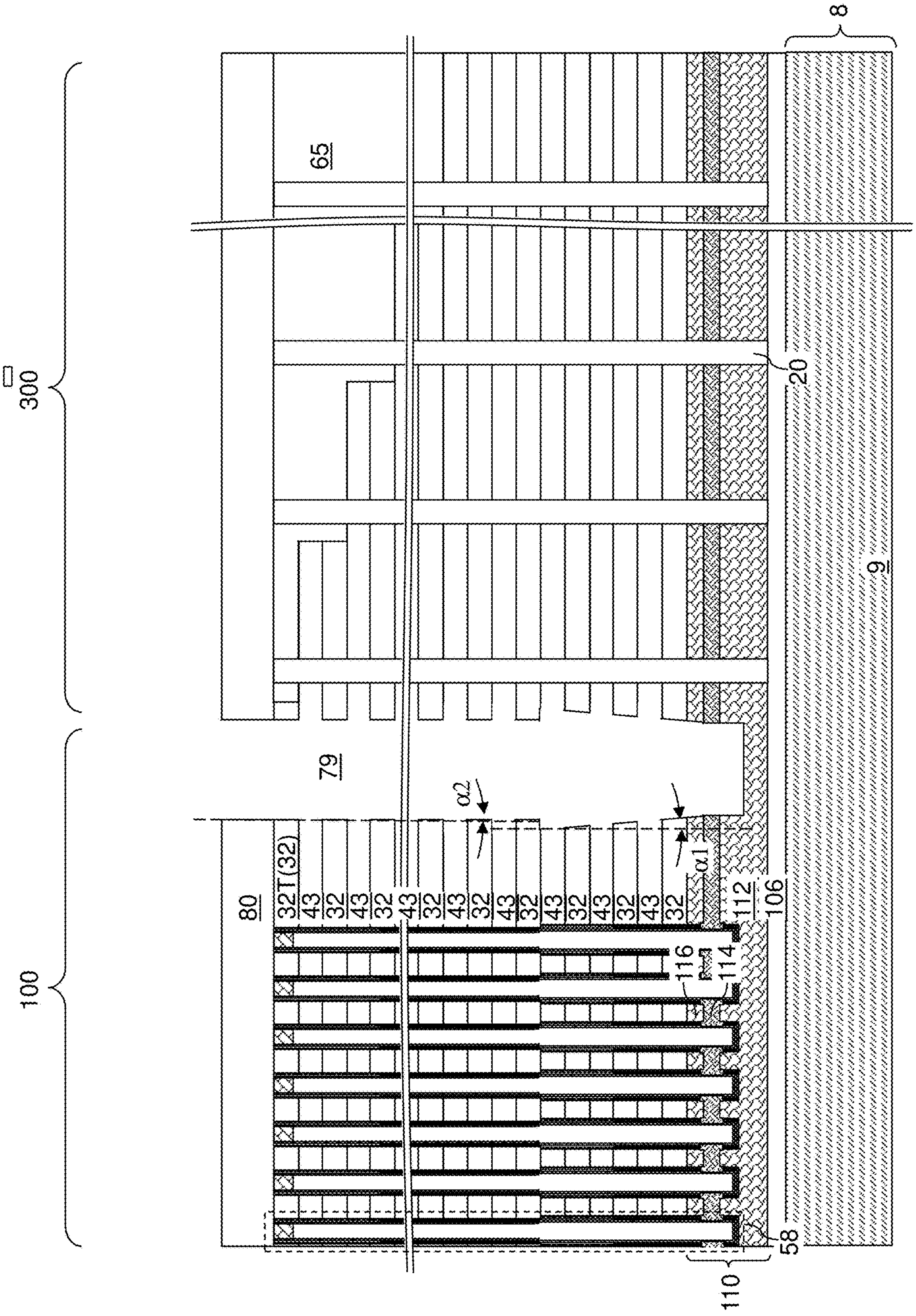
FIG. 39 is a vertical cross-sectional view of the second exemplary structure after formation of laterally-extending cavities according to the second embodiment of the present disclosure.

Referring to FIG. 39, the processing steps described with reference to FIG. 16E may be performed to remove the various sacrificial material layers (42S, 42W, 42D) selective to the insulating layers 32, the source-level material layers 110, the memory opening fill structures 58, and the retro-stepped dielectric material portion 65. Laterally-extending cavities 43 can be formed in volumes from which the various sacrificial material layers (42S, 42W, 42D) are removed.

Referring to FIGS. 40A-40D, the processing steps described with reference to FIG. 16F can be performed to optionally form backside blocking dielectric layers (not illustrated) and to form various electrically conductive layers 46 in the laterally-extending cavities 43. The various electrically conductive layers 46 comprise source-select-level electrically conductive layers 46S (e.g., the SGSB bottom source-select-level electrically conductive layers) that are formed in volumes from which the first sacrificial material layers 42S (i.e., the source-select-level sacrificial material layers) are removed, at least one drain-select-level electrically conductive layer 46D that is formed in volumes from which at least one drain-select-level sacrificial material layer 42D is removed, and word-line-level electrically conductive layers 46W that are formed in volumes from which word-line-level sacrificial material layers 42W are removed. The word-line-level electrically conductive layers 46W comprise word lines and optionally also comprise dummy word lines and additional source-select-level electrically conductive layers (e.g., the SGS layers).

In summary, the first sacrificial material layers 42S and the second sacrificial material layers (42W, 42D) are replaced with first electrically conductive layers (which are the source-select-level electrically conductive layers 46S) and second electrically conductive layers (which include the word-line-level electrically conductive layers 46W and the at least one drain-select-level electrically conductive layer 46D), respectively. An alternating stack (32, 42) of insulating layers 32 and electrically conductive layers 46 is thus formed between each laterally neighboring pair of lateral isolation trenches 79. Each alternating stack (32, 46) of insulating layers 32 and electrically conductive layers 46 can be formed on top of the source-level material layers 110.

Each alternating stack (32, 46) of insulating layers 32 and electrically conductive layers 46 comprises a first subset of the alternating stack (32, 46) that is located above the horizontal plane including the annular surface segment 613 of the stepped sidewalls of the memory opening fill structures 58, and further comprises a second subset of the alternating stack (32, 46) that is located below the horizontal plane including the annular surface segment 613 of the stepped sidewalls of the memory opening fill structures 58. The first subset comprises the word-line-level electrically conductive layers 46W and the at least one drain-select-level electrically conductive layer 46D. The second subset comprises each of the bottom source-select-level electrically conductive layers 46S.

Figure 40A:
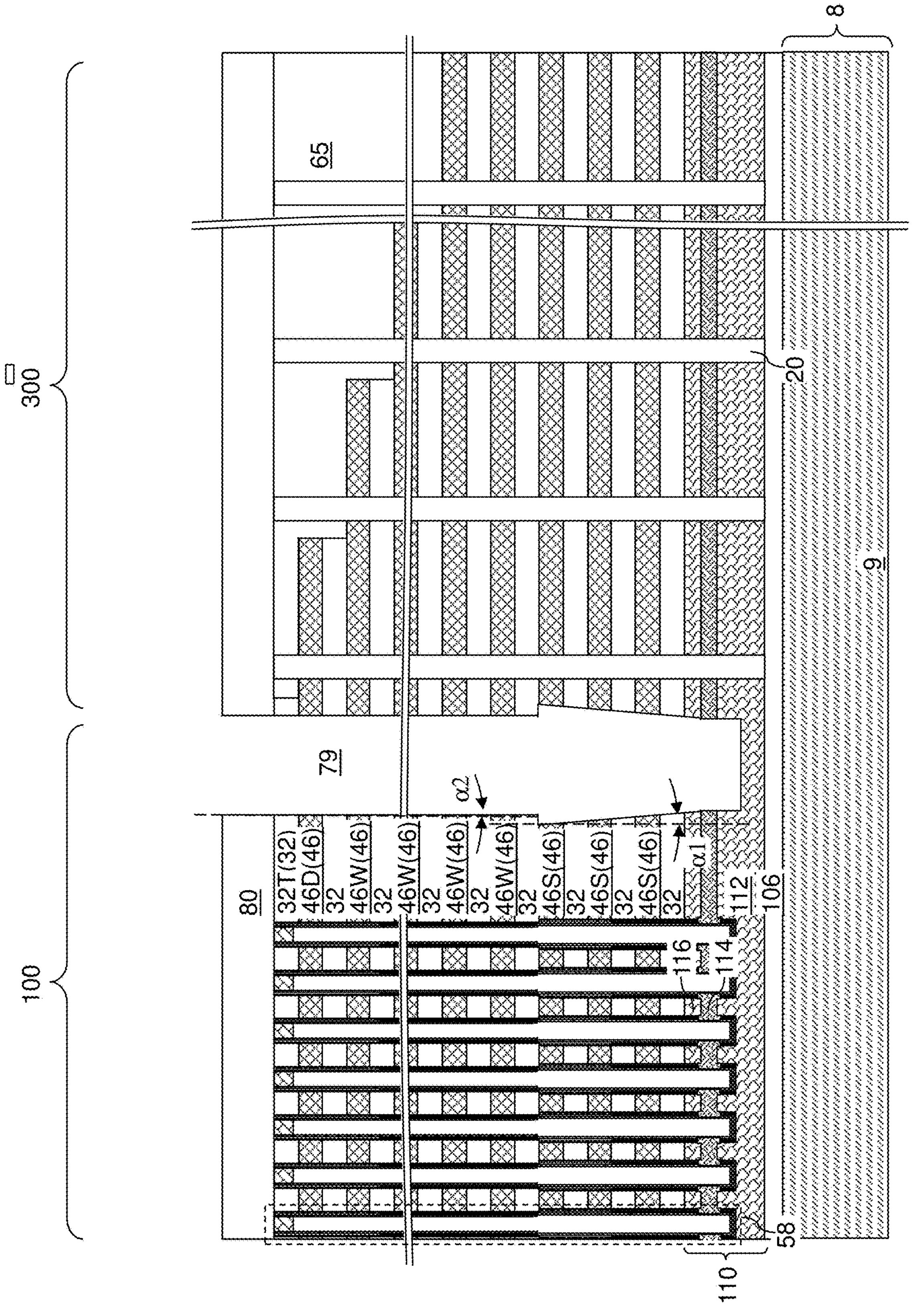
FIG. 40A is a vertical cross-sectional view of the second exemplary structure after formation of electrically conductive layers according to the second embodiment of the present disclosure.
Figure 40B:
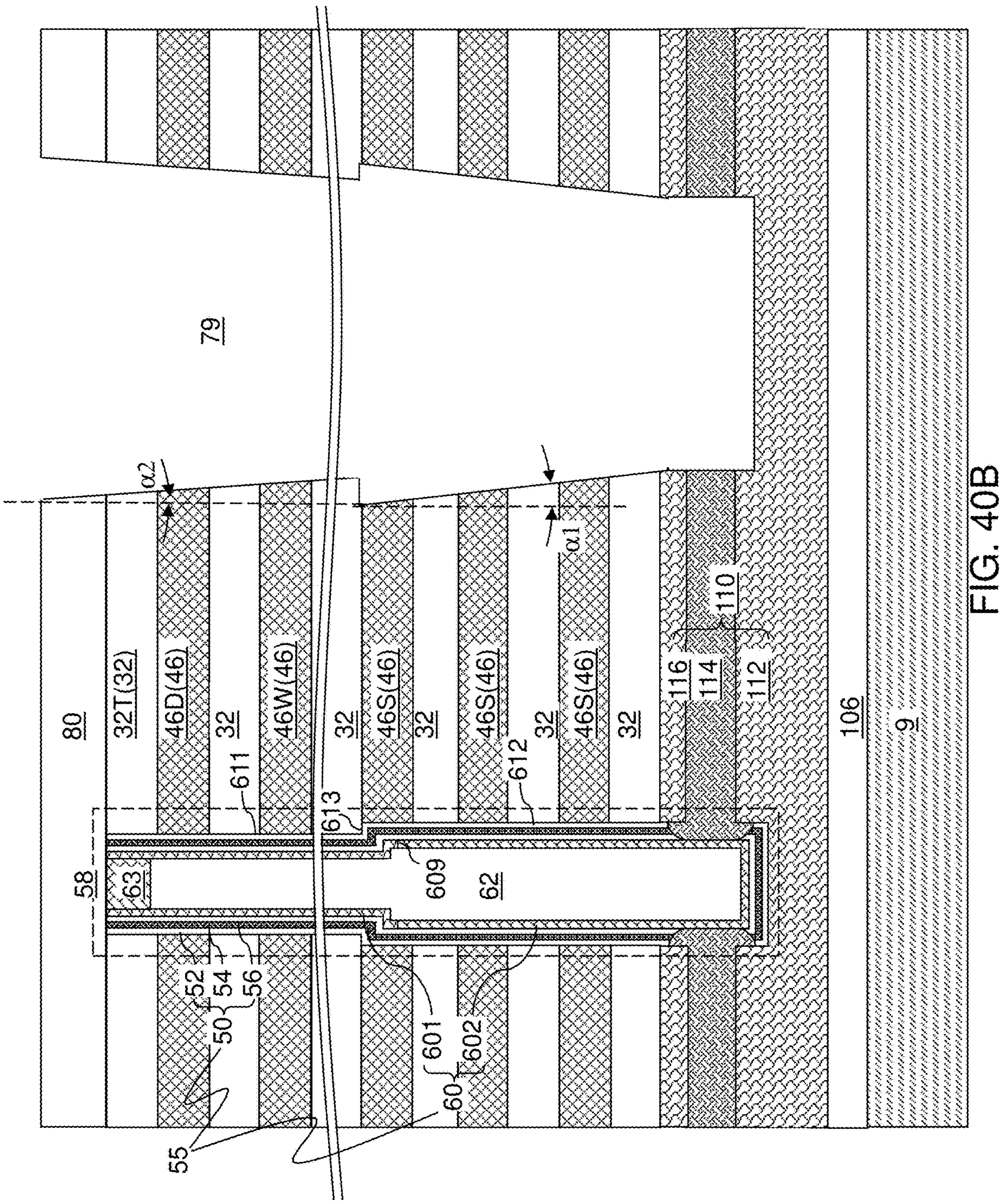
FIGS. 40B-40D are magnified views of various configurations of the second exemplary structure after the processing steps of FIG. 40A according to the second embodiment of the present disclosure.
Figure 40C:
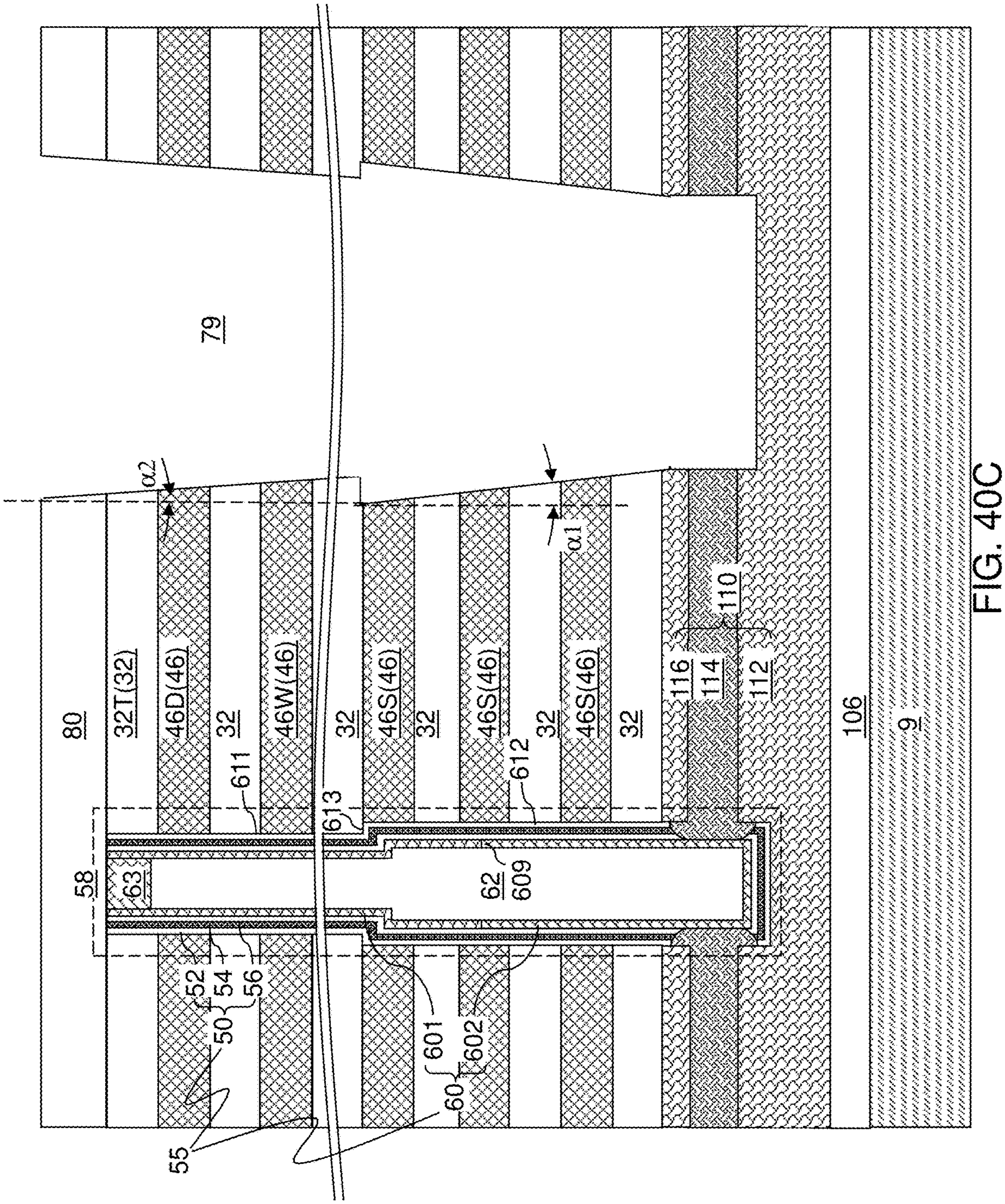
Figure 40D:
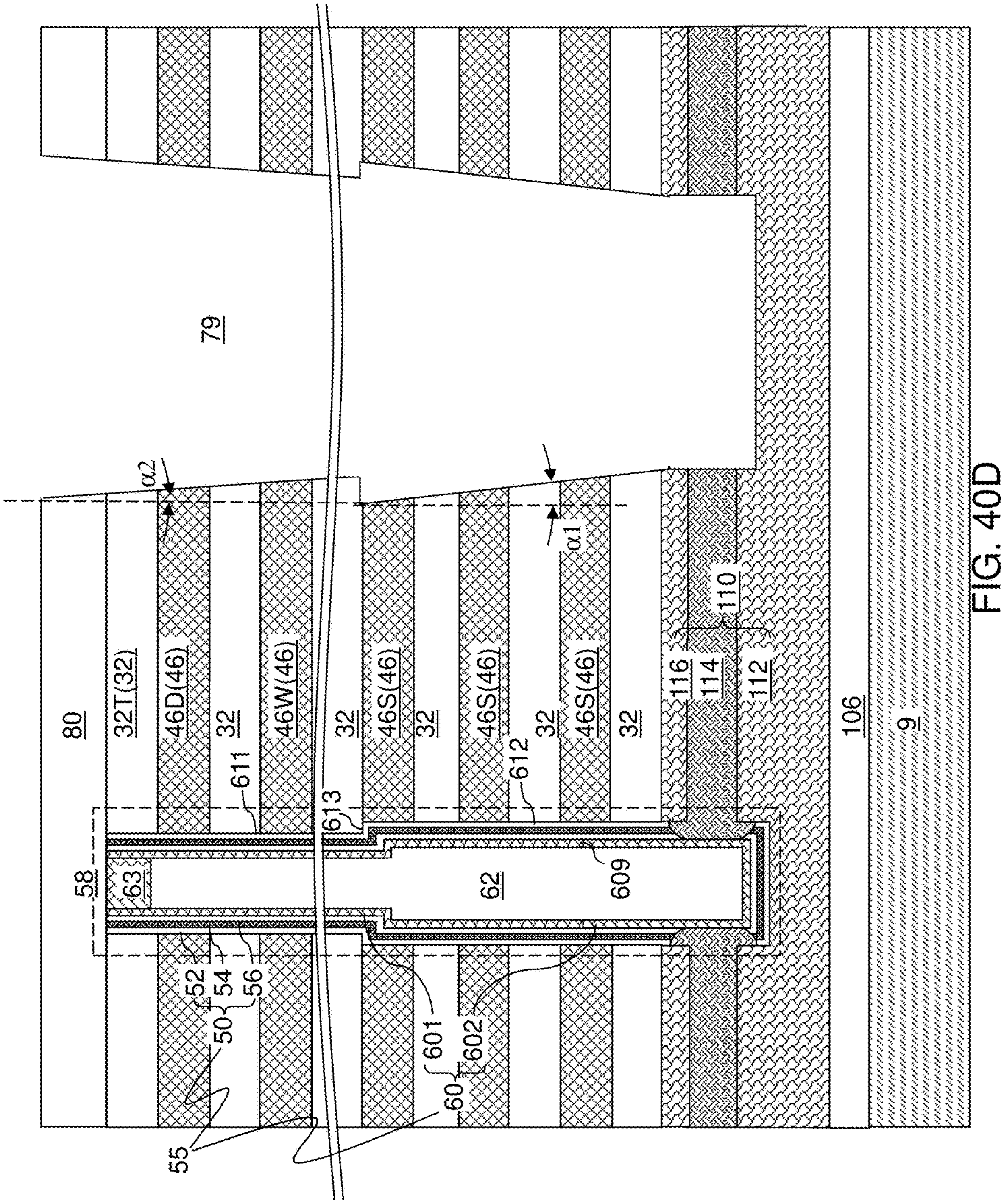

In one embodiment, the p-n junctions 609 may be formed at a level of a topmost source-select-level electrically conductive layer 46S within the second subset of layers of the alternating stack (32, 46) as illustrated in FIG. 40B. In another embodiment, the p-n junctions 609 may be formed below the level of the topmost source-select-level electrically conductive layer 46S within the second subset of layers of the alternating stack (32, 46) and above the level of a bottommost source-select-level electrically conductive layer 46S within the second subset of layers of the alternating stack (32, 46) as illustrated in FIG. 40C. In yet another embodiment, the p-n junctions 609 may be formed at a level of a bottommost source-select-level electrically conductive layer 46S within the second subset of layers of the alternating stack (32, 46) as illustrated in FIG. 40D.

Figure 41:
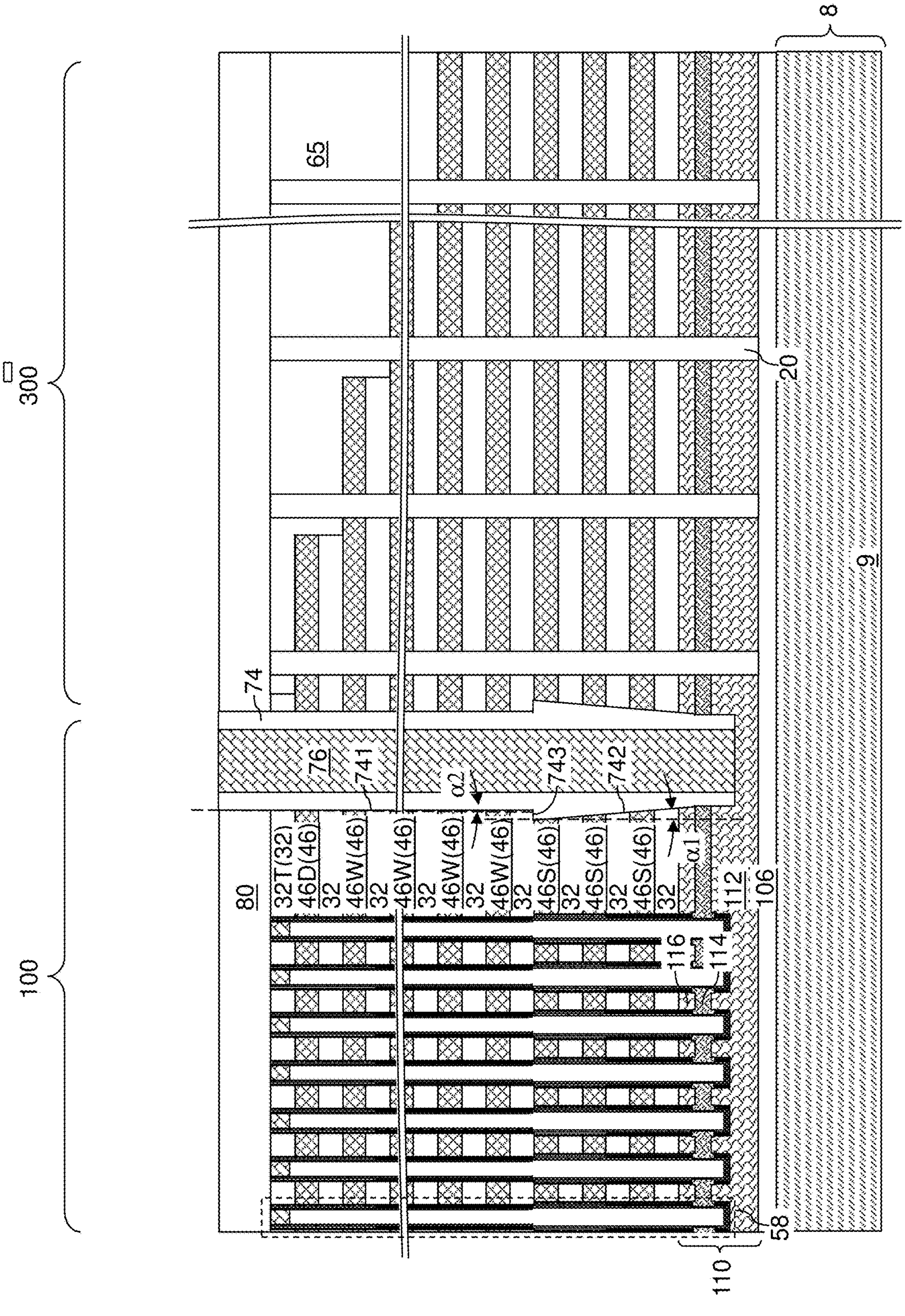
FIG. 41 is a vertical cross-sectional view of the second exemplary structure after formation of lateral isolation trench fill structures and contact via structures according to the second embodiment of the present disclosure.

Referring to FIG. 41, an insulating material, such as silicon oxide, can be conformally deposited in the peripheral portions of the lateral isolation trenches 79 and above the contact-level dielectric layer 80. An anisotropic etch process can be performed to remove horizontally-extending portions of the deposited insulating material. Each remaining vertically-extending portion of the deposited insulating material constitutes an insulating spacer 74.

At least one conductive material can be deposited in remaining volumes of the lateral isolation trenches 79. Excess portions of the at least one conductive material can be removed from above the horizontal plane including the top surface of the contact-level dielectric layer 80 by a planarization process such as a chemical mechanical polishing process. Each remaining portion of the at least one conductive material constitutes a contact via structure, which is herein referred to as a source contact via structure 76. Each source contact via structure 76 can contact the lower source-level semiconductor layer 112. Thus, an insulating spacer 74 is formed in a peripheral region of a lateral isolation trench 79. A source contact via structure 76 is then formed in a volume that is laterally surrounded by the insulating spacer 74 on a surface of the lower source-level semiconductor layer 112.

In one embodiment, the lateral isolation trench fill structure (74, 76) may include an insulating material portion (such as an insulating spacer 74) having a stepped sidewall that contacts an alternating stack (32, 46). For example, as shown in FIG. 41, each insulating spacer 74 may comprise a stepped outer sidewall (741, 742, 743) and a straight inner sidewall that contacts a source contact via structure 76. The stepped sidewall comprises an upper sidewall segment 741 that vertically extends through a first subset of the insulating layers 32 and the electrically conductive layers 46 within the alternating stack (32, 46), a lower sidewall segment 742 that contacts a second subset of the insulating layers 32 and the electrically conductive layers 46 within the alternating stack (32, 46), and a horizontally-extending surface segment 743 that is adjoined to the upper sidewall segment 741 and to the lower sidewall segment 742.

In one embodiment, the lateral isolation trench fill structure (74, 76) vertically extends through the upper source-level semiconductor layer 116 and the source contact layer 114. In one embodiment, the lateral isolation trench fill structure (74, 76) contacts a vertically-recessed surface of the lower source-level semiconductor layer 112. In one embodiment, the insulating material portion (such as the insulating spacer 74) contacts a horizontal surface segment of a bottommost insulating layer 32 within the first subset. In one embodiment, the insulating material potion (such as the insulating spacer 74) contacts each of the insulating layers 32 within the alternating stack (32, 46) and each of the electrically conductive layers 46 within the alternating stack (32, 46).

In one embodiment, the lower sidewall segment 742 has a first average taper angle $\alpha 1$ relative to a vertical direction, and the upper sidewall segment 741 is vertical or has a second average taper angle $\alpha 2$ relative to the vertical direction that is less than the first average taper angle $\alpha 1$. In one embodiment, the insulating material portion comprises an insulating spacer 74 that vertically extends from a top surface of the lateral isolation trench fill structure (74, 76) to a recessed surface of the lower source-level semiconductor layer 112. In one embodiment, the lateral isolation trench fill structure (74, 76) further comprises a source contact via structure 76 in contact with a recessed surface of the lower source-level semiconductor layer 112. In an embodiment, the insulating spacer 74 comprises a straight inner sidewall that is free of any step and vertically extends at least from a horizontal plane including a topmost surface of the alternating stack (32, 46) and at least to a horizontal plane including a top surface of the upper source-level semiconductor layer 116.

In one embodiment, the stepped outer sidewall laterally extends straight along a first horizontal direction hd1; and a contact area between the source contact via structure 76 and the recessed surface of the lower source-level semiconductor layer 112 laterally extends along the first horizontal direction hd1 and has a uniform width along a second horizontal direction hd2 that is perpendicular to the first horizontal direction hd1.

Figure 42:
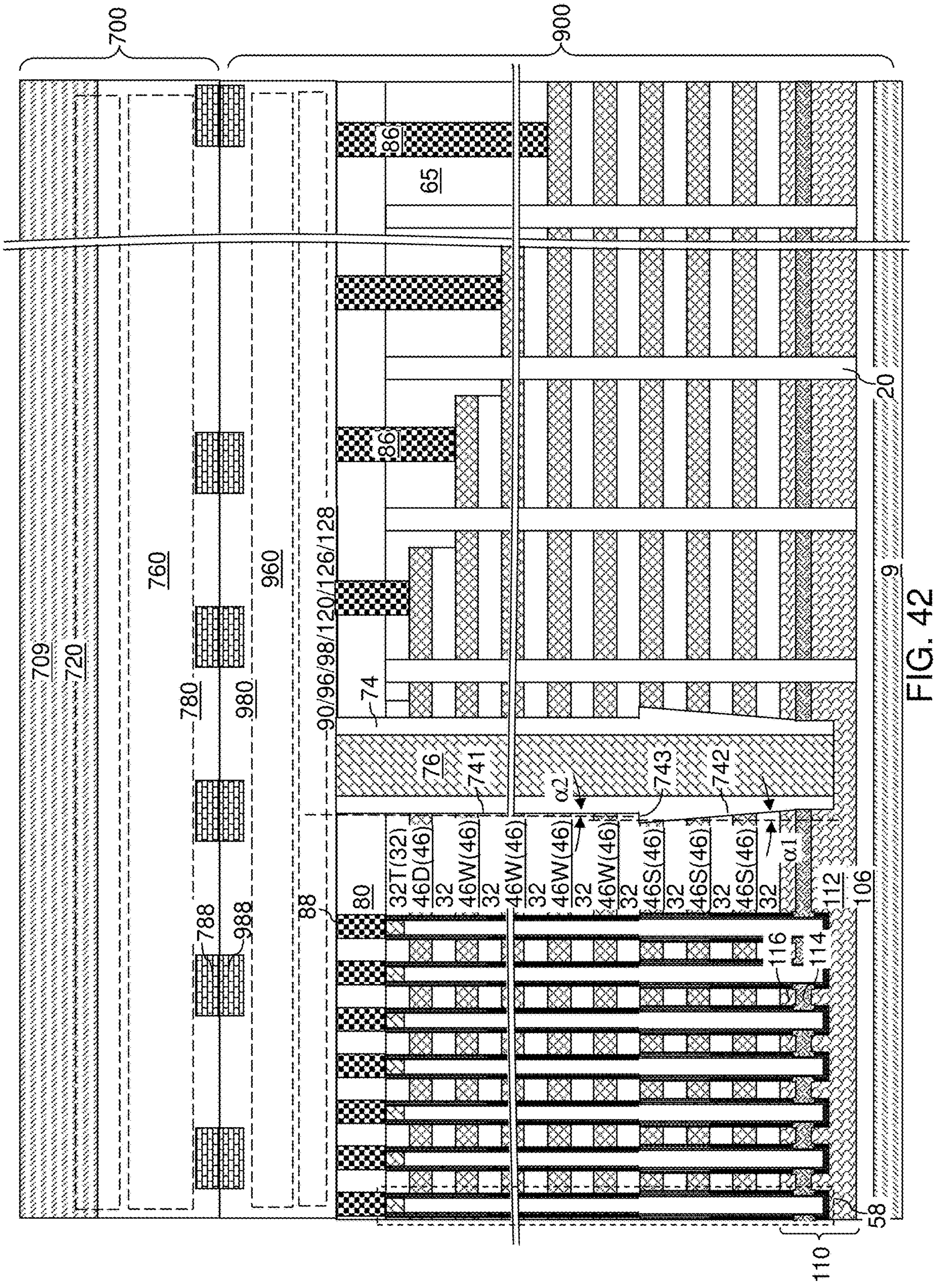
FIG. 42 is a vertical cross-sectional view of the second exemplary structure after formation of a bonded assembly of the memory die and the logic die according to the second embodiment of the present disclosure.

Referring to FIG. 42, the processing steps described with reference to FIGS. 18A-22 can be performed to provide the memory die 900, to provide the optional logic die 700 if there is no peripheral circuit 720 located on the substrate 8, and to bond the memory die 900 and the logic die 700. A bonded assembly of the memory die 900 and the logic die 700 is thus formed.

Figure 43A:
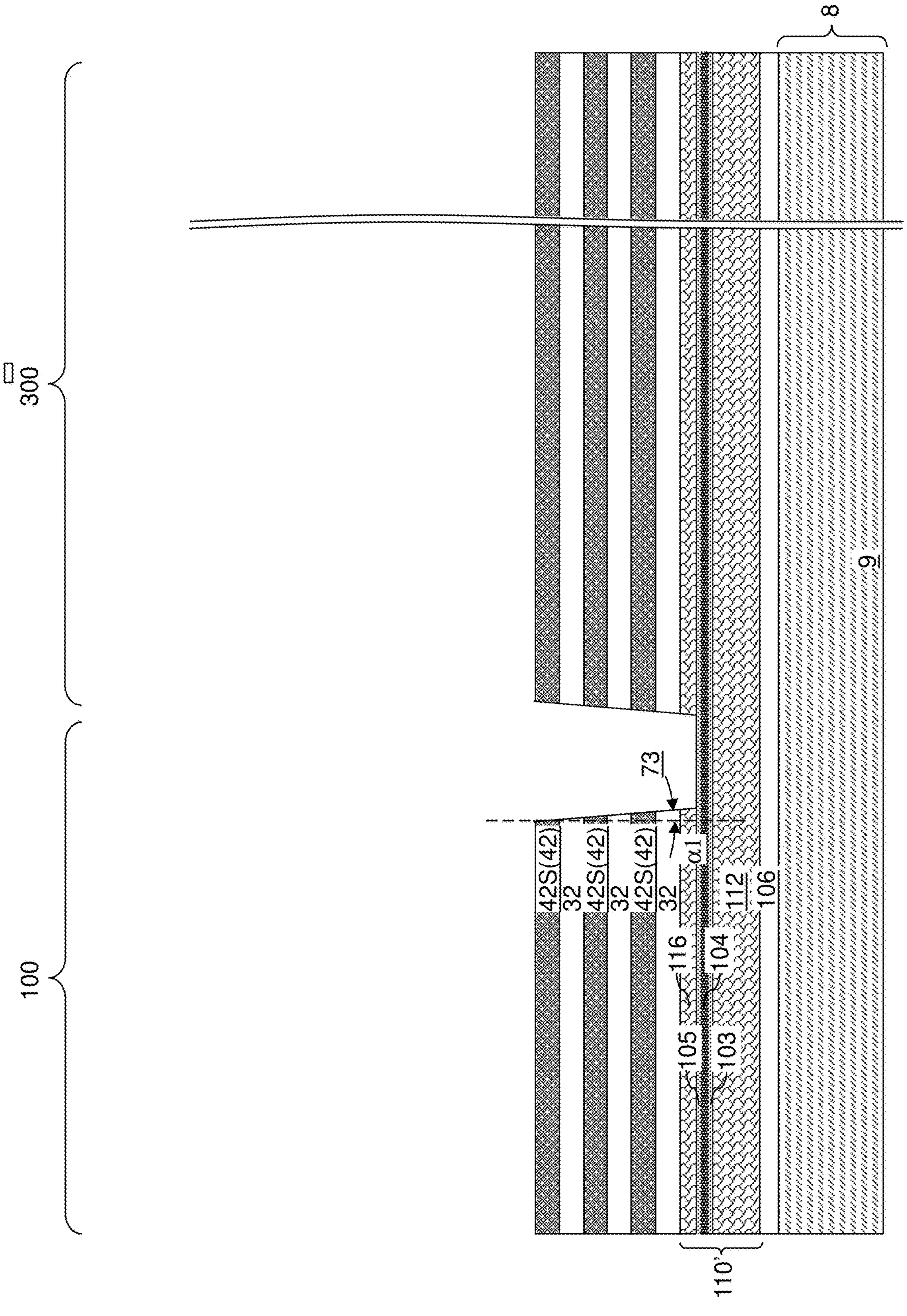
FIG. 43A is a schematic vertical cross-sectional view of a third exemplary structure after formation of line trenches according to a third embodiment of the present disclosure.
Figure 43B:
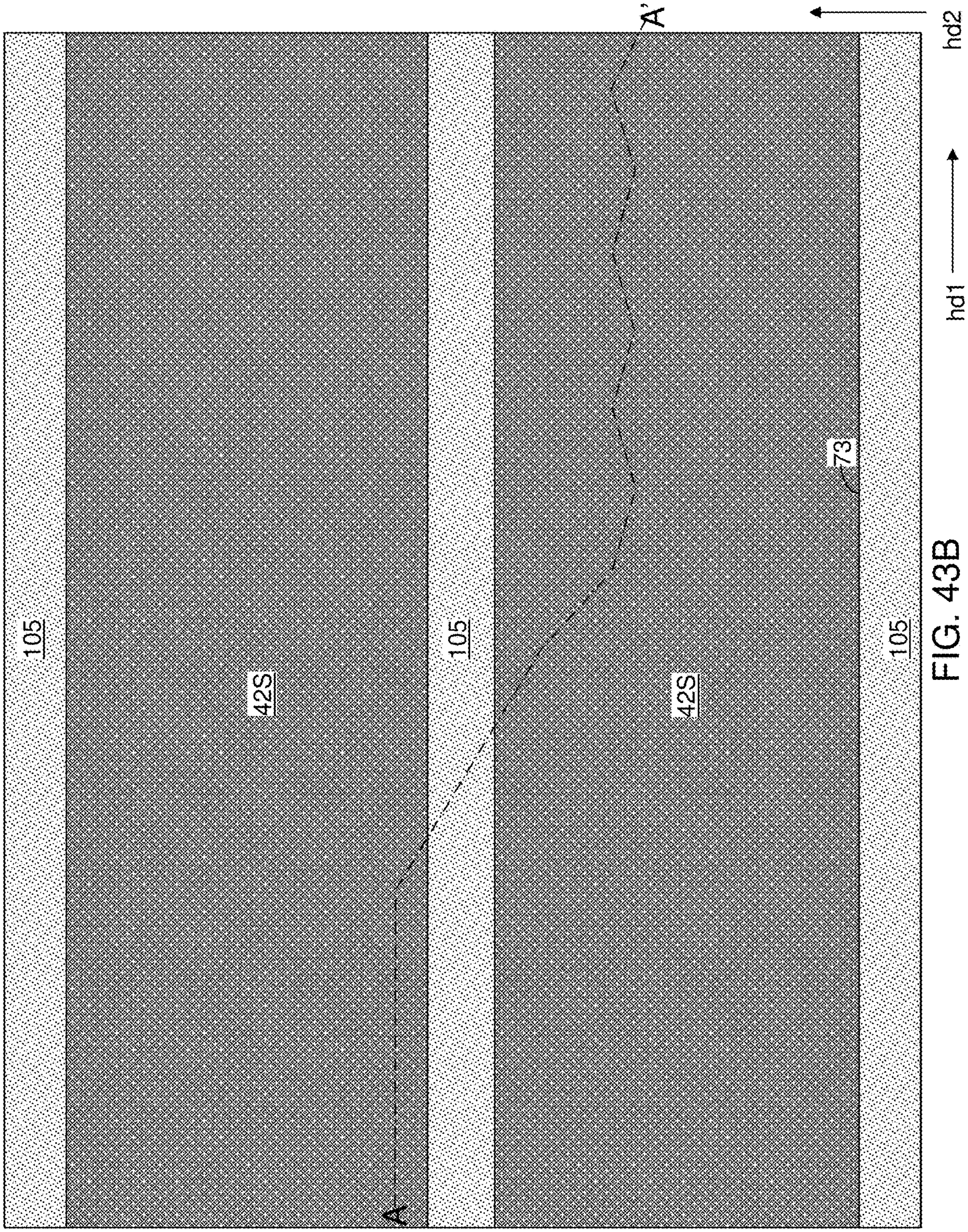
FIG. 43B is a top-down view of the third exemplary structure of FIG. 43A. The hinged vertical cross-sectional plane A-A' is the cut plane of the vertical cross-sectional view of FIG. 43A.

Referring to FIGS. 43A and 43B, a third exemplary structure according to a third embodiment of the present disclosure can be derived from the second exemplary structure illustrated in FIG. 23 by performing the processing steps for forming the line trenches 73 as described with reference to FIGS. 24A and 24B without performing the processing steps for forming the discrete openings 41.

Figure 44A:
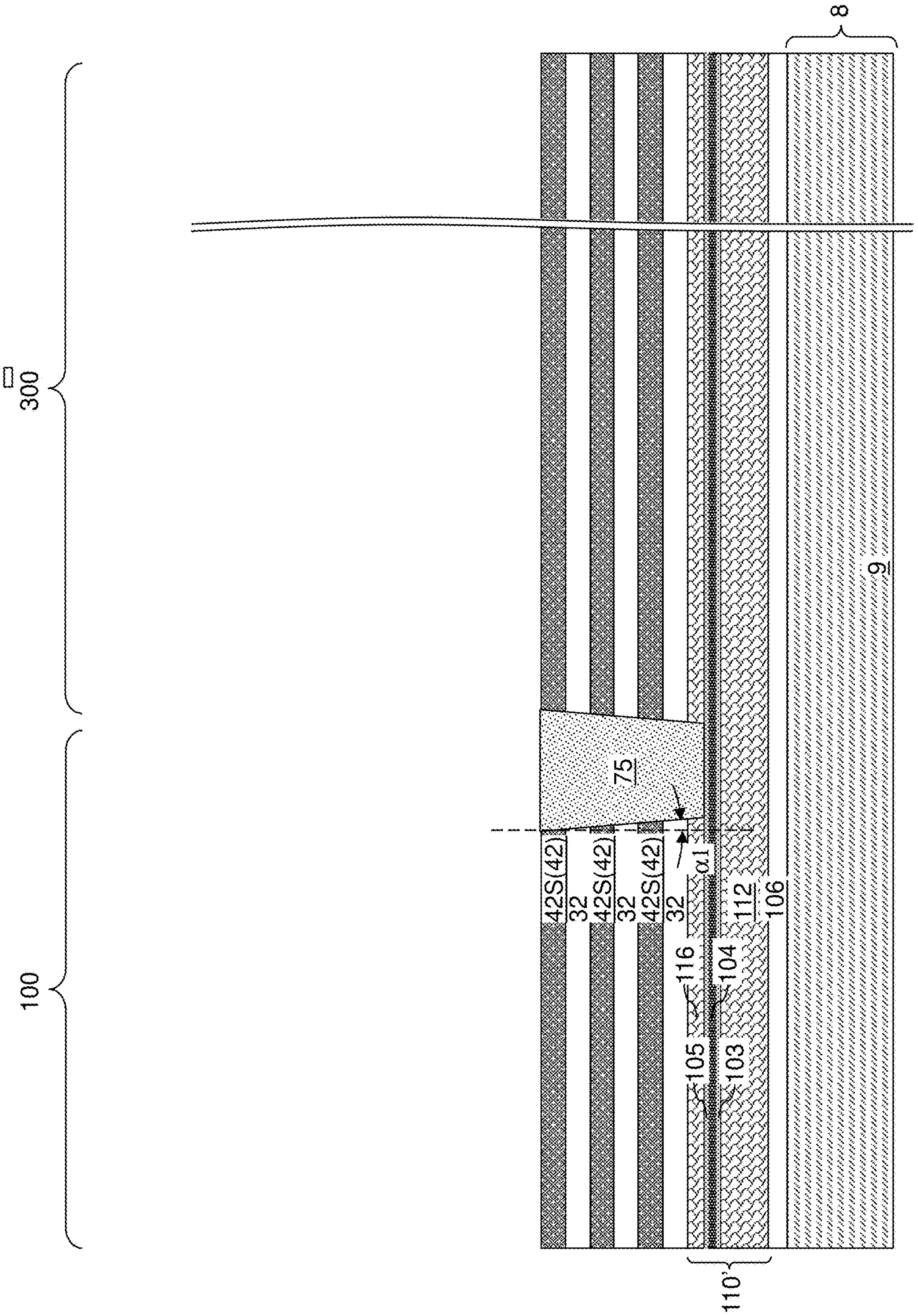
FIG. 44A is a schematic vertical cross-sectional view of the third exemplary structure after formation of sacrificial line trench fill structures according to the third embodiment of the present disclosure.
Figure 44B:
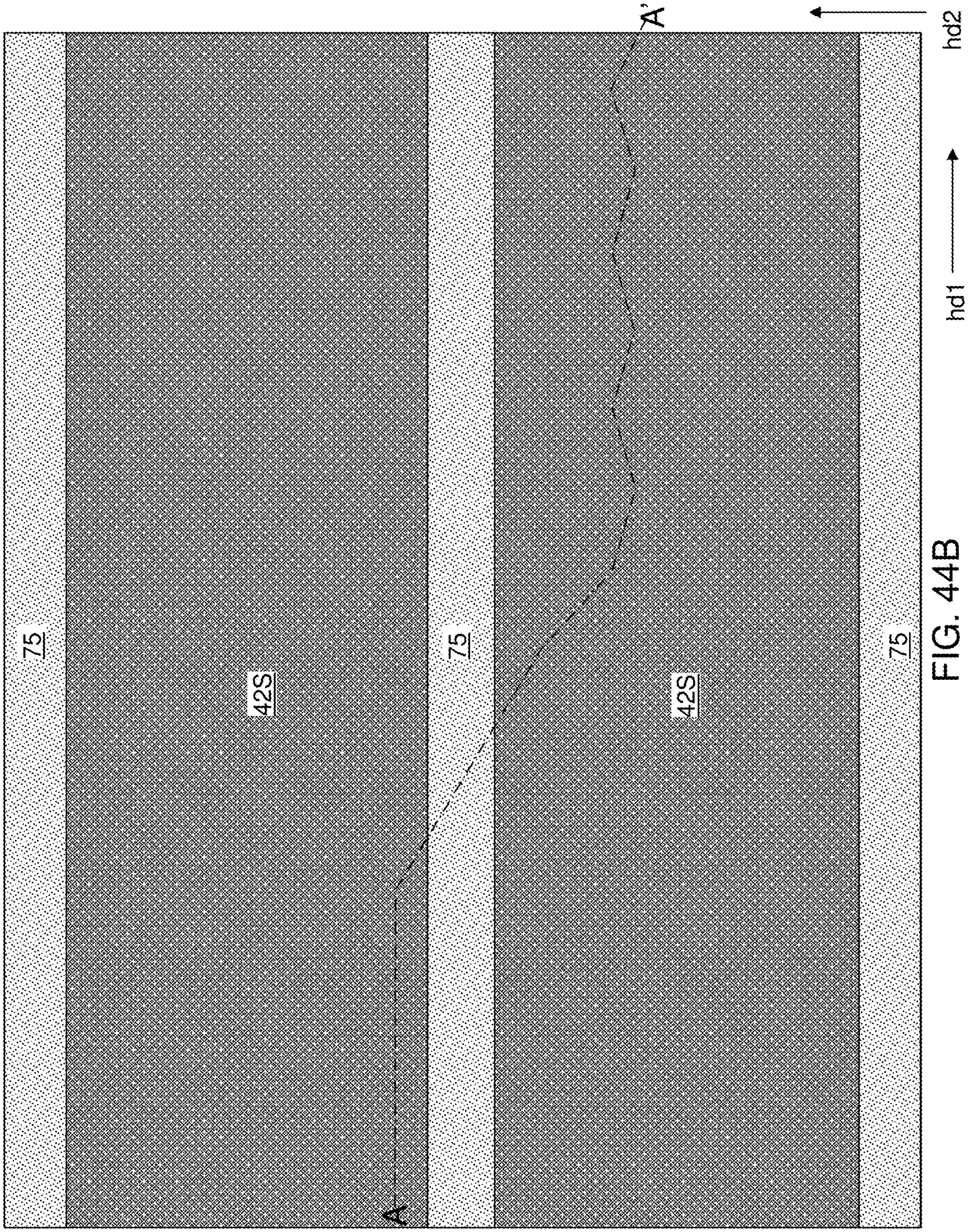
FIG. 44B is a top-down view of the third exemplary structure of FIG. 44A. The hinged vertical cross-sectional plane A-A' is the cut plane of the vertical cross-sectional view of FIG. 44A.

Referring to FIGS. 44A and 44B, the processing steps described with reference to FIGS. 25A and 25B can be performed to form sacrificial line trench fill structures 75. Since the discrete openings are not formed at the processing steps of FIGS. 43A and 43B, sacrificial pillar structures 45 are not formed in the third exemplary structure.

The sidewalls of the sacrificial line trench fill structures 75 may have a first average taper angle $\alpha 1$ relative to a vertical direction. The first average taper angle $\alpha 1$ is an average of the taper angle of the sidewalls of the sacrificial line trench fill structures 75, and may be the same as the taper angle of a tilted vertical plane including a straight top edge of a lengthwise sidewall of a sacrificial line trench fill structure 75 and a straight bottom edge of the lengthwise sidewall of the sacrificial line trench fill structure 75. The first average taper angle $\alpha 1$ may be in a range from 1 degree to 20 degrees such as from 2 degree to 10 degrees, although lesser and greater angles may also be employed.

Figure 45:
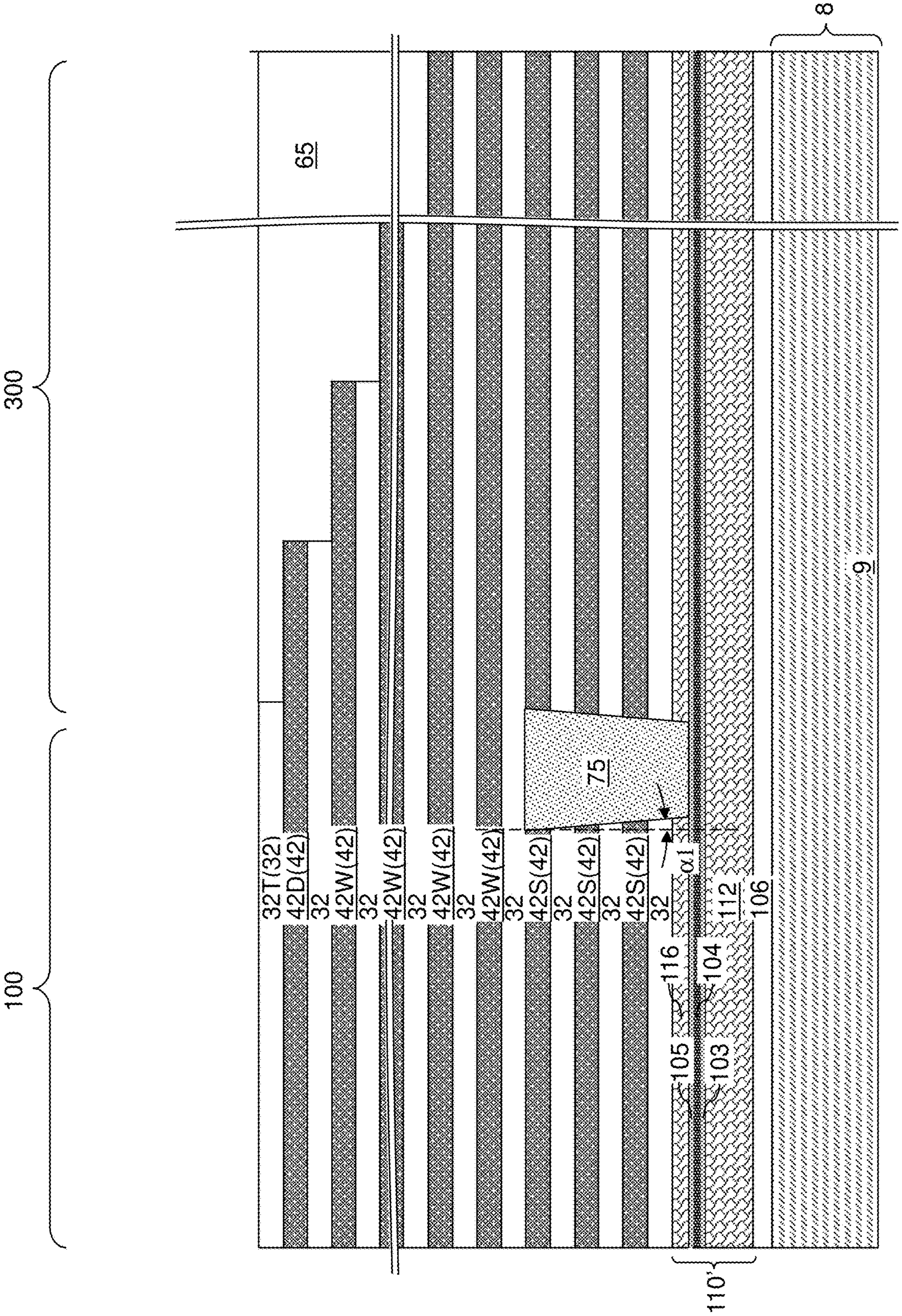
FIG. 45 is a schematic vertical cross-sectional view of the third exemplary structure after formation of a second alternating stack of second insulating layers and second sacrificial material layers and a retro-stepped dielectric material portion according to the third embodiment of the present disclosure.

Referring to FIG. 45, the processing steps described with reference to FIG. 26 can be performed to form the second alternating stack of second insulating layers 32 and second sacrificial material layers (42W, 42D) and a retro-stepped dielectric material portion 65.

Figure 46:
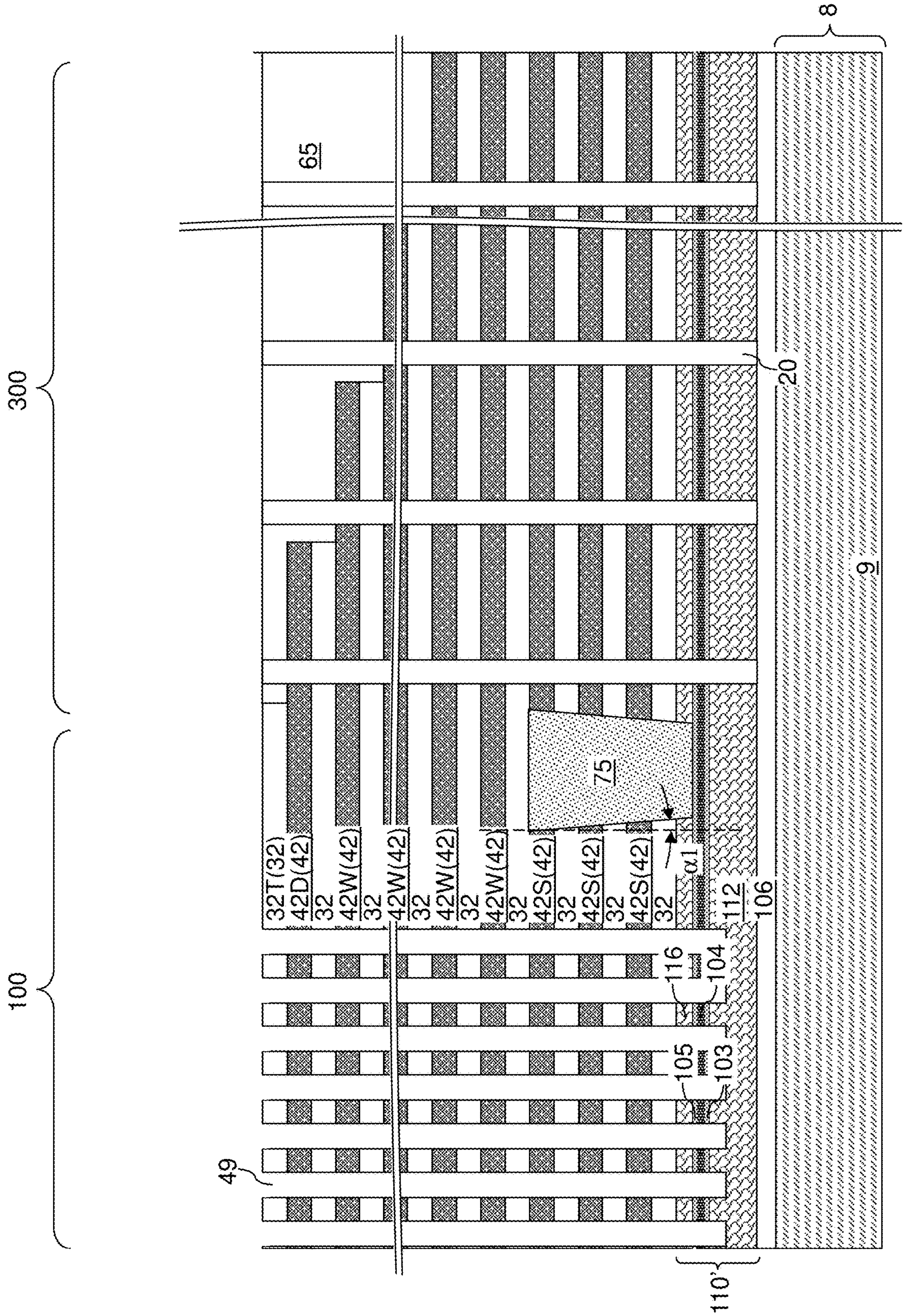
FIG. 46 is a schematic vertical cross-sectional view of the third exemplary structure after formation of memory openings and support pillar structures according to the third embodiment of the present disclosure.

Referring to FIG. 46, the processing steps described with reference to FIG. 27 may be performed to form support pillar structures 20. Subsequently, the processing steps described with reference to FIG. 28 can be performed with a modification in the duration of the anisotropic etch process to form memory openings 49. In the third embodiment, the memory openings 49 as formed by the anisotropic etch process can vertically extend through each layer in the second alternating stack (32, 42W, 42D), each layer in the first alternating stack (32, 42S), the upper source-level semiconductor layer 116, the optional upper sacrificial liner 105, the source-level sacrificial layer 104, and the optional lower sacrificial liner 103, and can vertically extend into an upper portion of the lower source-level semiconductor layer 112.

Figure 47:
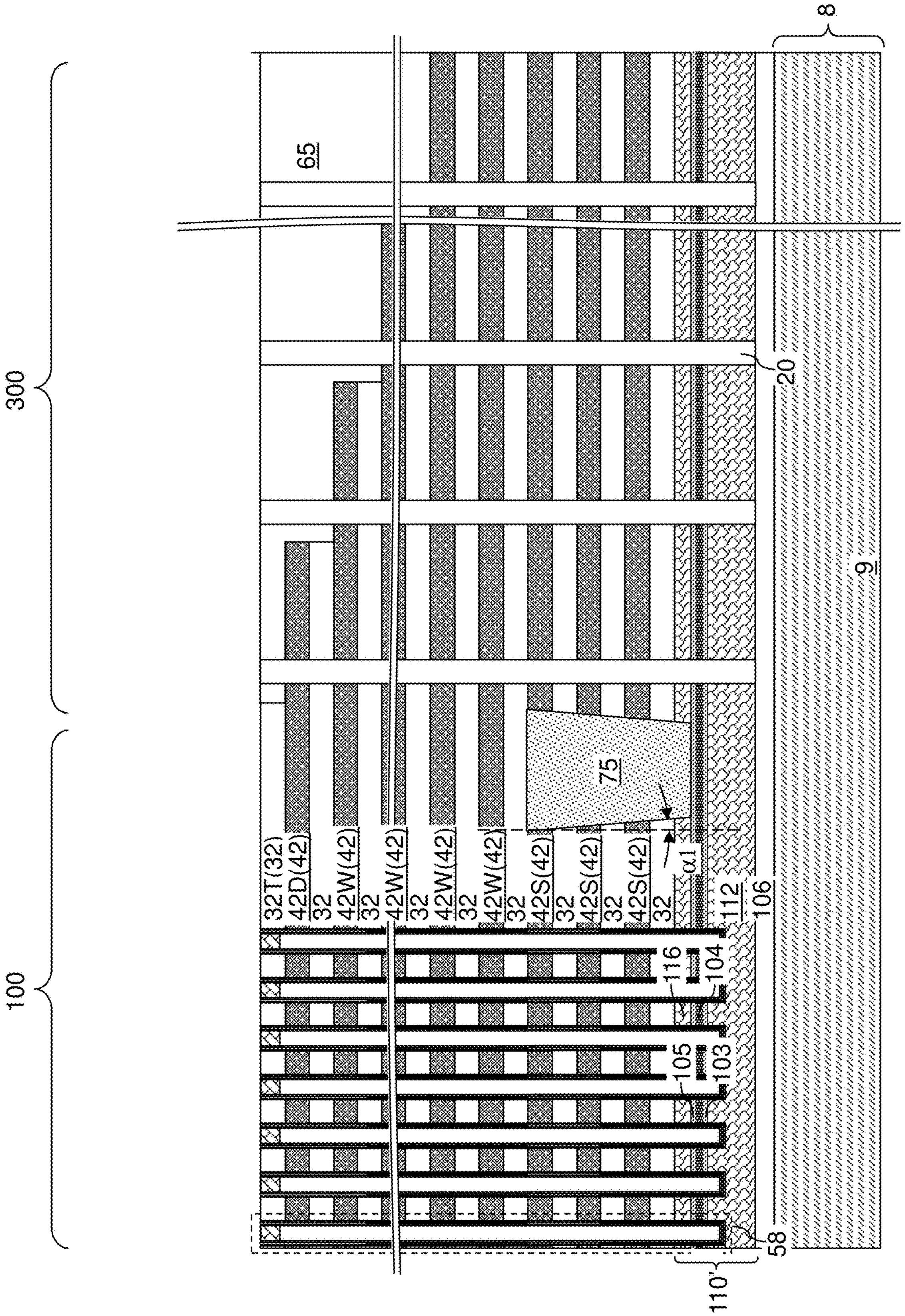
FIG. 47 is a vertical cross-sectional view of the third exemplary structure after formation of memory opening fill structures according to the third embodiment of the present disclosure.

Referring to FIG. 47, the processing steps described with reference to FIGS. 9A-9D can be performed to form a memory opening fill structure 58 within each memory opening 49. Generally, each memory opening fill structure 58 may comprise a memory film 50 and a vertical semiconductor layer 60 that vertically extend through the second alternating stack (32, 42W, 42D), the first alternating stack (32, 42S), the upper source-level semiconductor layer 116, the optional upper sacrificial liner 105, the source-level sacrificial layer 104, and the optional lower sacrificial liner 103, and into an upper portion of the lower source-level semiconductor layer 112.

Figure 48:
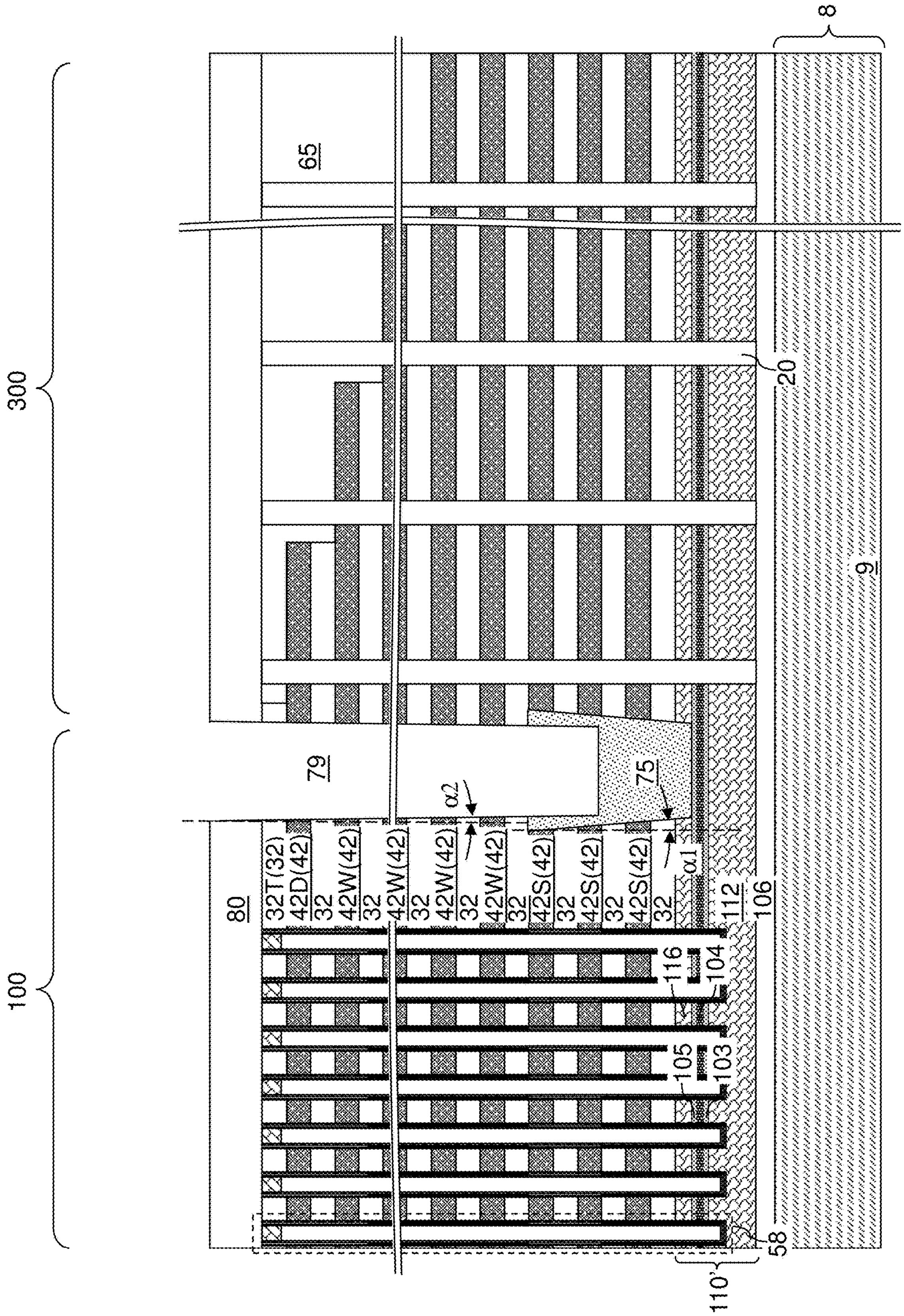
FIG. 48 is a vertical cross-sectional view of the third exemplary structure after formation of lateral isolation trenches according to the third embodiment of the present disclosure.

Referring to FIG. 48, the processing steps described with reference to FIG. 31 may be performed to form a contact-level dielectric layer 80, and to form lateral isolation trenches 79 through the contact-level dielectric layer 80 and the second alternating stack (32, 42W, 42D). The sacrificial line trench fill structures 75 can be employed as etch stop structures for the anisotropic etch process that forms the lateral isolation trenches 79. Each lateral isolation trench 79 can be formed through the second alternating stack (32, 42) such that a surface of a sacrificial line trench fill structure 75 is exposed underneath the lateral isolation trench 79. An upper portion of each sacrificial line trench fill structure 75 may be collaterally etched during formation of the lateral isolation trenches 79.

The sidewalls of the lateral isolation trenches 79 located between the top surface of the contact-level dielectric layer 80 and the bottommost surface of the second alternating stack (32, 42W, 42D) may have a second average taper angle α2 relative to a vertical direction. The second average taper angle α2 is an average of the taper angle of the sidewalls of the lateral isolation trenches 79 between the top surface of the contact-level dielectric layer 80 and the bottommost surface of the second alternating stack (32, 42W, 42D). In one embodiment, the second average taper angle α2 may be the same as the taper angle of a tilted vertical plane including a straight top edge of a lengthwise sidewall of a lateral isolation trench 79 and a straight bottom edge of the lengthwise sidewall of the lateral isolation trench 79. The second average taper angle α2 may be in a range from 0 degree to 10 degrees such as from 0.1 degree to 5 degrees, although lesser and greater angles may also be employed. Generally, the second average taper angle α2 is smaller than the first average taper angle α1, and may be zero in some embodiments.

Referring to FIGS. 49A-49D, an insulating material, such as silicon oxide, can be conformally deposited in the peripheral portions of the lateral isolation trenches 79 and above the contact-level dielectric layer 80. An anisotropic etch process can be performed to remove horizontally-extending portions of the deposited insulating material. Each remaining vertically-extending portion of the deposited insulating material constitutes an insulating spacer 74.

At least one conductive material, such as at least one metallic material, can be deposited in remaining volumes of the lateral isolation trenches 79. Excess portions of the at least one conductive material can be removed from above the horizontal plane including the top surface of the contact-level dielectric layer 80 by a planarization process such as a chemical mechanical polishing process. Each remaining portion of the at least one conductive material constitutes the source contact via structure 76. Each source contact via structure 76 can contact a top surface of the lower source-level semiconductor layer 112.

As in the second embodiment, each insulating spacer 74 may comprise the above described stepped outer sidewall (741, 742, 743) and a straight inner sidewall that contacts a source contact via structure 76.

Figure 49A:
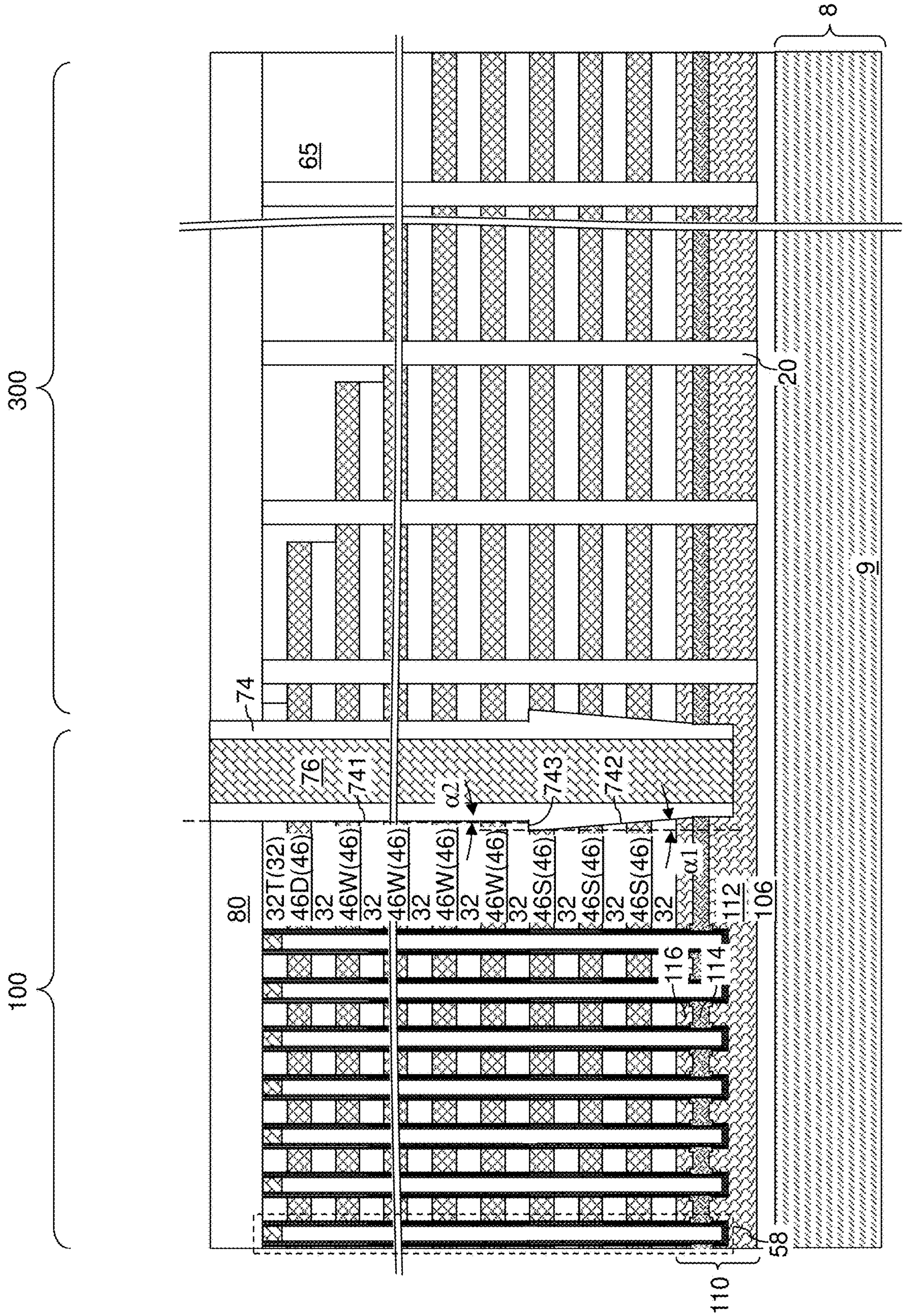
FIG. 49A is a vertical cross-sectional view of the third exemplary structure after formation of lateral isolation trench fill structures and contact via structures according to the third embodiment of the present disclosure.
Figure 49B:
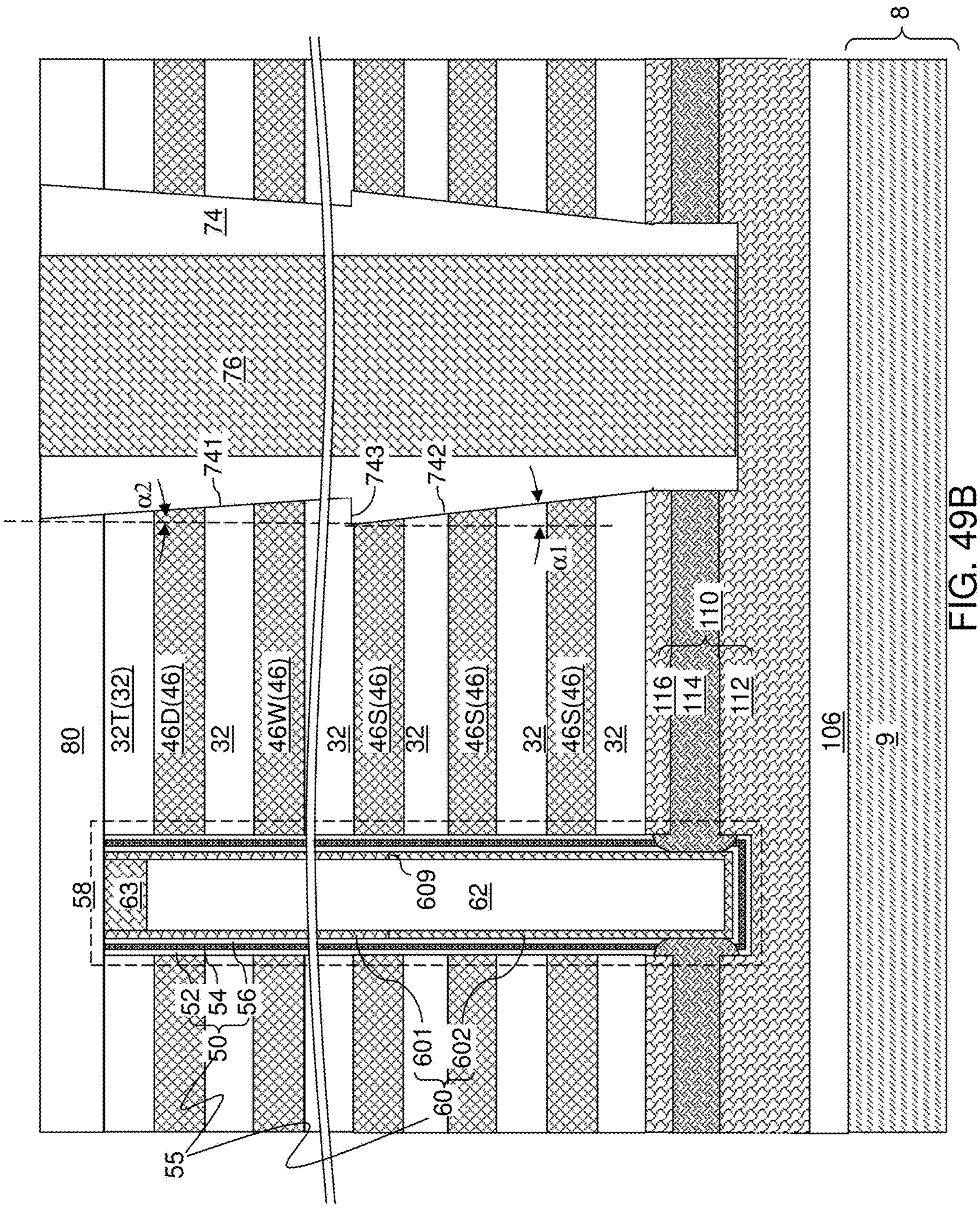
FIGS. 49B-49D are vertical cross-sectional views of a region of various configurations of the third exemplary structure after the processing steps of FIG. 49A.
Figure 49C:
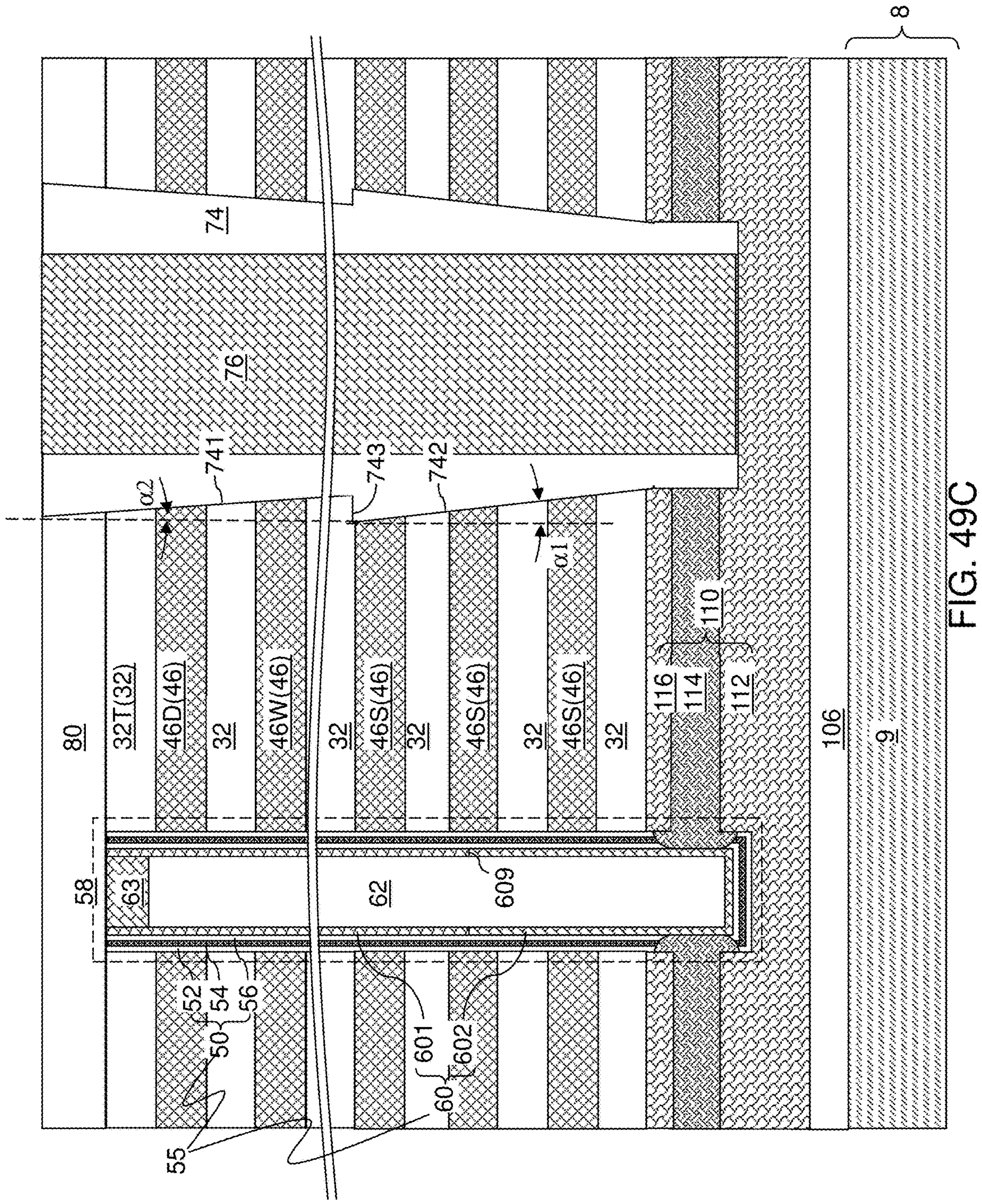
Figure 49D:
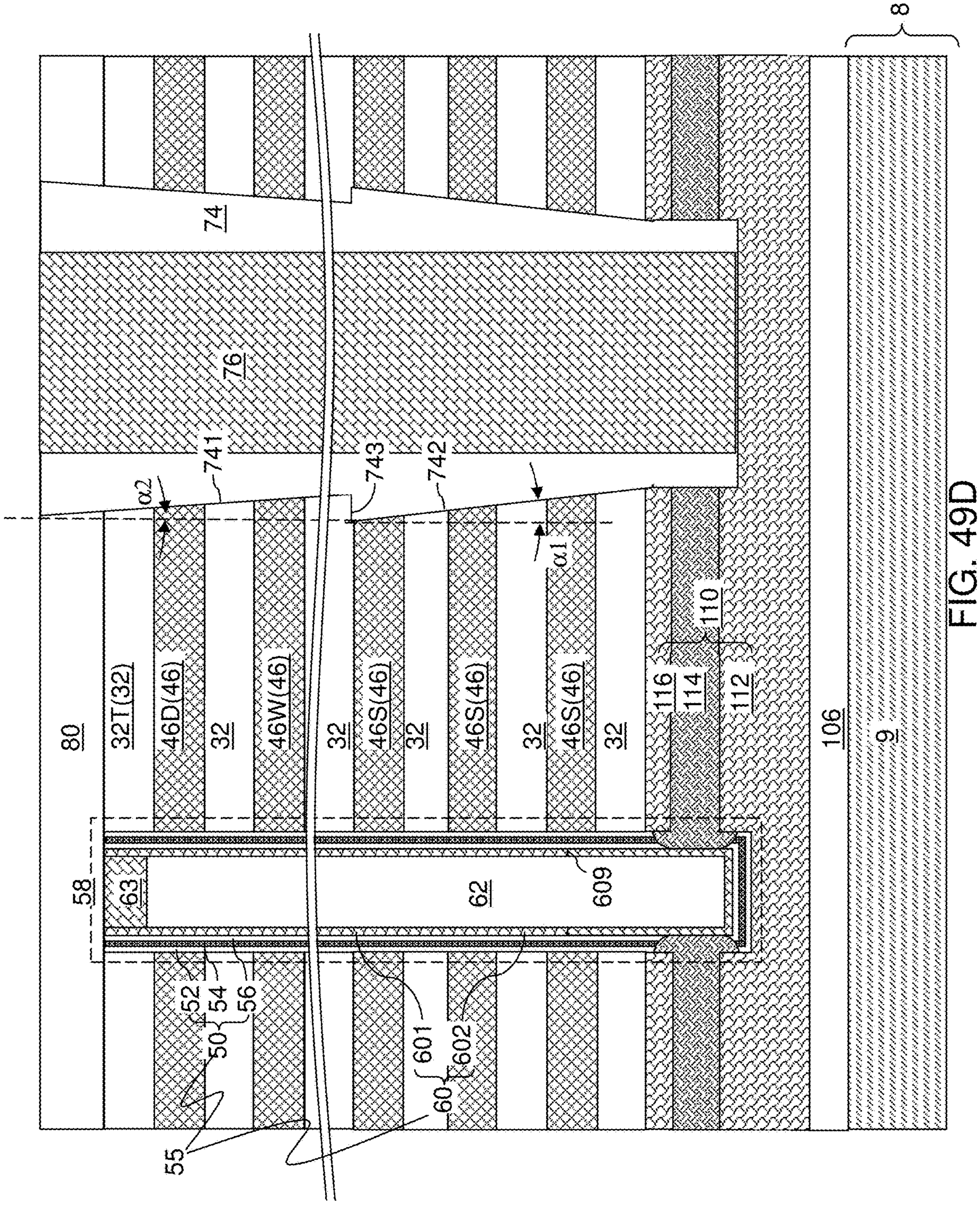

In one embodiment, the p-n junctions 609 may be formed at a level of a topmost source-select-level electrically conductive layer 46S within the second subset of layers of the alternating stack (32, 46) as illustrated in FIG. 49B. In another embodiment, the p-n junctions 609 may be formed below the level of the topmost source-select-level electrically conductive layer 46S within the second subset of layers of the alternating stack (32, 46) and above the level of a bottommost source-select-level electrically conductive layer 46S within the second subset of layers of the alternating stack (32, 46) as illustrated in FIG. 49C. In yet another embodiment, the p-n junctions 609 may be formed at a level of a bottommost source-select-level electrically conductive layer 46S within the second subset of layers of the alternating stack (32, 46) as illustrated in FIG. 49D.

Figure 50:
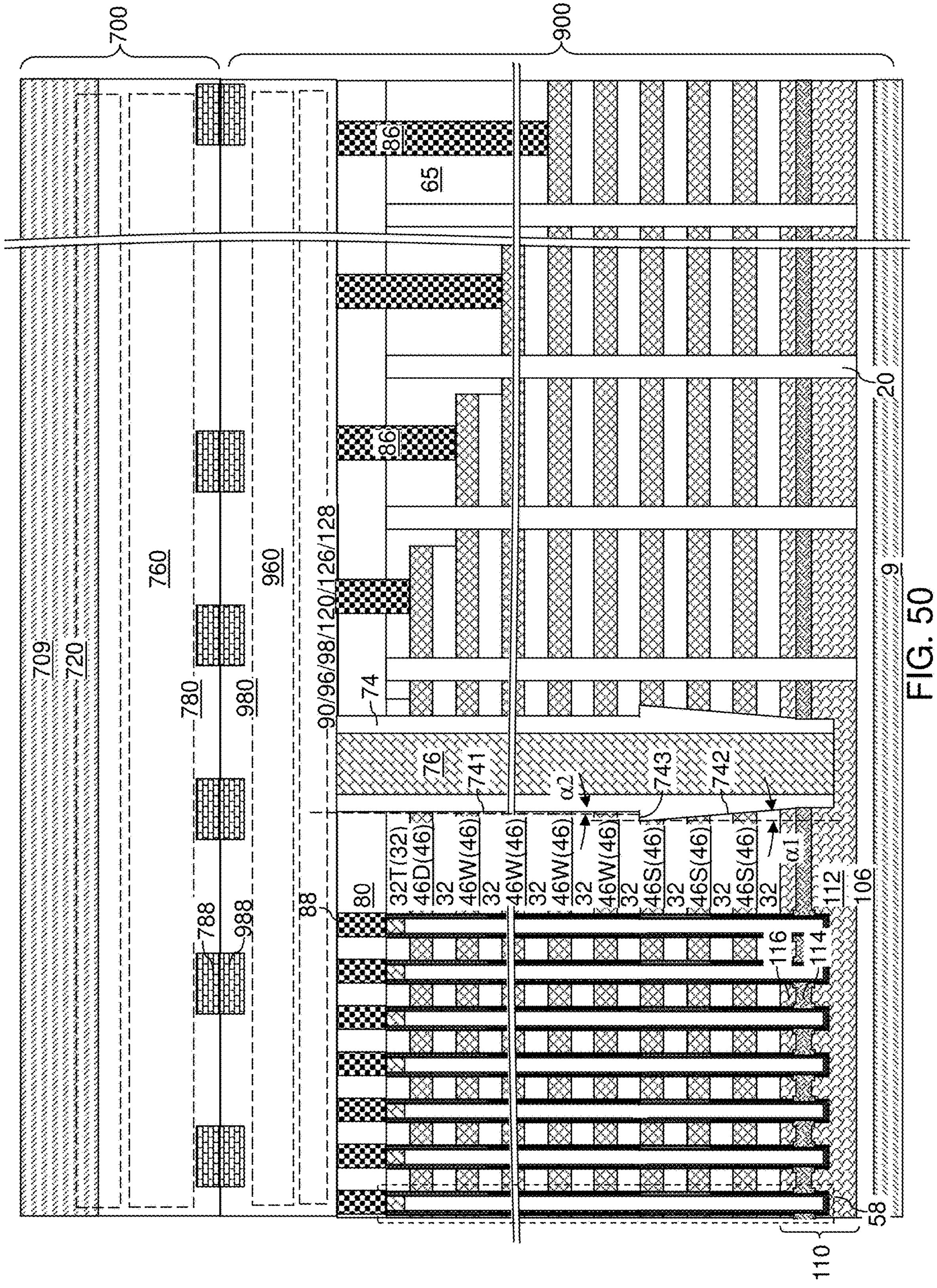
FIG. 50 is a vertical cross-sectional view of the third exemplary structure after formation of a bonded assembly of the memory die and the logic die according to the third embodiment of the present disclosure.

Referring to FIG. 50, the processing steps described with reference to FIGS. 18A-22 can be performed to provide the memory die 900, to provide the optional logic die 700, and to bond the memory die 900 and the logic die 700. A bonded assembly of the memory die 900 and the logic die 700 is thus formed.

Referring to FIGS. 23-50 and related drawings and according to various embodiments of the present disclosure, a memory device comprises: source-level material layers 110 comprising, from bottom to top, a lower source-level semiconductor layer 112, a source contact layer 114, and an upper source-level semiconductor layer 116; an alternating stack (32, 46) of insulating layers 32 and electrically conductive layers 46 located over of the source-level material layers 110; a memory opening 49 vertically extending through the alternating stack (32, 46), the upper source-level semiconductor layer 116, and the source contact layer 114; a memory opening fill structure 58 located in the memory opening 49 and comprising a memory film 50 and a vertical semiconductor layer 60 having a surface segment that contacts the source contact layer 114; and a lateral isolation trench fill structure (74, 76) including an insulating material portion (such as an insulating spacer 74) having a stepped outer sidewall that contacts the alternating stack (32, 46), wherein the stepped sidewall comprises an upper sidewall segment 741 that vertically extends through a first subset of the insulating layers 32 and the electrically conductive layers 46 within the alternating stack (32, 46), a lower sidewall segment 742 that contacts a second subset of the insulating layers 32 and the electrically conductive layers 46 within the alternating stack (32, 46), and a horizontally-extending surface segment 743 that is adjoined to the upper sidewall segment 741 and to the lower sidewall segment 742.

In one embodiment, the lateral isolation trench fill structure (74, 76) vertically extends through the upper source-level semiconductor layer 116 and the source contact layer 114. In one embodiment, the lateral isolation trench fill structure (74, 76) contacts a recessed surface of the lower source-level semiconductor layer 112. In one embodiment, the insulating material portion (such as the insulating spacer 74) contacts a horizontal surface segment of a bottommost insulating layer within the first subset. In one embodiment, the insulating material potion (such as the insulating spacer 74) contacts each of the insulating layers 32 within the alternating stack (32, 46) and each of the electrically conductive layers 46 within the alternating stack (32, 46).

In one embodiment, the lower sidewall segment 742 has a first average taper angle α1 relative to a vertical direction; and the upper sidewall segment 741 is vertical or has a second average taper angle α2 relative to the vertical direction that is less than the first average taper angle α1. In one embodiment, the insulating material portion comprises an insulating spacer 74 that vertically extends from a top surface of the lateral isolation trench fill structure (74, 76) to a recessed surface of the lower source-level semiconductor layer 112. In one embodiment, the lateral isolation trench fill structure (74, 76) also comprises a source contact via structure 76 in contact with a recessed surface of the lower source-level semiconductor layer 112. In one embodiment, the insulating spacer 74 also comprises a straight inner sidewall that is free of any step and vertically extends at least from a horizontal plane including a topmost surface of the alternating stack (32, 46) and at least to a horizontal plane including a top surface of the upper source-level semiconductor layer 116.

In one embodiment, the stepped outer sidewall laterally extends straight along a first horizontal direction hd1; and a contact area between the source contact via structure 76 and the recessed surface of the lower source-level semiconductor layer 112 laterally extends along the first horizontal direction hd1 and has a uniform width along a second horizontal direction hd2 that is perpendicular to the first horizontal direction hd1.

In one embodiment, the memory opening fill structure 58 comprises a stepped surface that comprises: an upper surface segment 611 that contacts the first subset of the insulating layers 32 and the electrically conductive layers 46 within the alternating stack (32, 46); a lower surface segment 612 that contacts the second subset of the insulating layers 32 and the electrically conductive layers 46 within the alternating stack (32, 46); and an annular surface segment 613 that is adjoined to the upper surface segment 611 and to the lower surface segment 612. In one embodiment, the annular surface segment 613 is located in a horizontal plane including the horizontally-extending surface segment 743. In one embodiment, the annular surface segment 613 contacts an annular bottom surface segment of a bottommost insulating layer 32 within the first subset.

In one embodiment, the vertical semiconductor layer 60 comprises a channel portion 601 having a doping of a first conductivity type and a source extension region 602 having a doping of a second conductivity type that is an opposite of the first conductivity type; and the source contact layer 114 has a doping of the second conductivity type.

In one embodiment, the second subset of the electrically conductive layers 46 comprises bottom source-select-level electrically conductive layers 46S, and the first subset of the electrically conductive layers comprises additional source-select-level electrically conductive layers and word lines 46W and drain-select-level electrically conductive layers 46D located over the bottom source-select-level electrically conductive layers 46S; and the p-n junction 609 is located in horizontal plane between a bottommost surface of the second subset and a topmost surface of the second subset.

The various embodiments of the present disclosure can be employed to enhance control of the depths of the lateral isolation trenches 79, and to reduce a thickness of the upper source-level semiconductor layer 116. The reduction in thickness of the upper source-level semiconductor layer 116 provides enhanced control of the vertical locations of p-n junctions 609 within vertical semiconductor layers 60 relative to the source contact layer 114. Specifically the vertical phosphorus out diffusion distance from the source contact layer 114 into the vertical semiconductor layers 60 may be reduced and terminated within the horizontal plane located within the bottom source-select-level electrically conductive layers 46S (i.e., SGSB layers). Furthermore, in the second embodiment, the horizontal step 613 in the memory openings 49 prevents or reduces vertical phosphorus diffusion in the vertical semiconductor layer 60 above the horizontal plane of the top of the SGSB layers. The reduction in phosphorus vertical diffusion length and enhanced control of the diffusion length allows control of the vertical location of the bottom of the semiconductor channel 601 relative to the top of the source extension region 602, and provides enhanced control of the device characteristics of the vertical NAND strings (e.g., memory opening fill structures 58).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A memory device, comprising:

source-level material layers comprising a lower source-level semiconductor layer, an upper source-level semiconductor layer located over the lower source-level semiconductor layer, and a source contact layer located between the lower source-level semiconductor layer and the upper source-level semiconductor layer, wherein the lower source-level semiconductor layer comprises a first portion having a first thickness and a second portion having a second thickness that is less than the first thickness;

an alternating stack of insulating layers and electrically conductive layers located over the source-level material layers;

a memory opening vertically extending through the alternating stack and partially through the source-level material layers into the first portion of the lower source-level semiconductor layer; and a memory opening fill structure located in the memory opening and comprising a memory film and a vertical semiconductor layer that contacts the source contact layer;

wherein the source contact layer comprises:

a first horizontally extending portion overlying the first portion of the lower source-level semiconductor layer;

a second horizontally-extending portion overlying the second portion of the lower source-level semiconductor layer; and a third portion connecting the first horizontally-extending portion and the second horizontally-extending portion.

2. The memory device of claim 1, further comprising a lateral isolation trench fill structure having an insulating sidewall that contacts sidewalls of the insulating layers and sidewalls of the electrically conductive layers, and laterally spaced from the first portion of the lower source-level semiconductor layer.

3. The memory device of claim 2, wherein the lateral isolation trench fill structure contacts a top surface of a third portion of the lower source-level semiconductor layer having a third thickness that is not greater than the second thickness.

4. The memory device of claim 3, wherein the third thickness is less than the second thickness.

5. The memory device of claim 3, wherein the lateral isolation trench fill structure comprises:

a source contact via structure that contacts a surface segment of the third portion of the lower source-level semiconductor layer; and an insulating spacer that laterally surrounds the source contact via structure.

6. The memory device of claim 5, wherein the source-level material layers further comprise an insulating fill layer that is surrounded by the source contact layer and contacts a surface segment of an outer sidewall of the insulating spacer.

7. The memory device of claim 2, wherein the upper source-level semiconductor layer has a greater thickness around the lateral isolation trench fill structure than above the first portion of the lower source-level semiconductor layer.

8. The memory device of claim 2, wherein:

the insulating sidewall laterally extends along a first horizontal direction; and a boundary between the first portion and the second portion is parallel to the first horizontal direction.

9. The memory device of claim 1, wherein an entirety of an interface between the upper source-level semiconductor layer and the alternating stack is located within a horizontal plane.

10. The memory device of claim 1, wherein:

the memory film is in contact with a sidewall of the upper source-level semiconductor layer; and the vertical semiconductor layer is laterally spaced from the upper source-level semiconductor layer by the memory film.

11. The memory device of claim 1, wherein the source contact layer comprises:

the first horizontally extending portion in contact with the first portion of the lower source-level semiconductor layer;

the second horizontally-extending portion in contact with the second portion of the lower source-level semiconductor layer; and the third portion comprises a vertically-extending portion connecting the first horizontally-extending portion and the second horizontally-extending portion.

12. The memory device of claim 11, wherein the vertically-extending portion of the source contact layer contacts a sidewall of the first portion of the lower source-level semiconductor layer.

13. The memory device of claim 1, wherein:

the vertical semiconductor layer comprises a channel portion having a doping of a first conductivity type and a source extension region having a doping of a second conductivity type that is an opposite of the first conductivity type; and the source contact layer has a doping of the second conductivity type.

14. The memory device of claim 1, wherein:

the memory opening fill structure comprises a drain region contacting an end portion of the channel portion of the vertical semiconductor layer;

a drain contact via structure contacts a top surface of the drain region; and each of the electrically conductive layers is contacted by a respective layer contact via structure having a respective top surface located above a horizontal plane including a topmost surface of the alternating stack.

15. A method of forming a device structure, comprising:

forming a lower source-level semiconductor layer over a substrate, wherein the lower source-level semiconductor layer has a first portion having a first thickness and a second portion having a second thickness that is less than the first thickness;

forming a source-level sacrificial layer and an upper source-level semiconductor layer over the lower source-level semiconductor layer;

forming an alternating stack of insulating layers and sacrificial material layers over the upper source-level semiconductor layer;

forming a lateral isolation trench through the alternating stack and the upper source-level semiconductor layer over the second portion of the lower source-level semiconductor layer;

replacing the source-level sacrificial layer with at least a source contact layer by providing an etchant that etches the source-level sacrificial layer through the lateral isolation trench and by providing a reactant that deposits the source contact layer through the lateral isolation trench; and replacing the sacrificial material layers with electrically conductive layers.

16. The method of claim 15, further comprising:

forming a memory opening through the alternating stack, the upper source-level semiconductor layer, and the source-level sacrificial layer into the first portion of the lower source-level semiconductor layer; and forming a memory opening fill structure comprising a memory film and a vertical semiconductor layer in the memory opening.

17. The method of claim 15, further comprising:

depositing a blanket semiconductor material layer having a uniform thickness over the substrate; and patterning a line trench laterally extending along a first horizontal direction through the blanket semiconductor material layer to form the lower source-level semiconductor layer, wherein the lateral isolation trench is formed entirely within an area of the line trench in a plan view along a vertical direction.

18. The method of claim 15, wherein the source-level sacrificial layer is formed by a conformal deposition process and comprises a first horizontally-extending portion overlying the first portion of the lower source-level semiconductor layer, a second horizontally-extending portion overlying the second portion of the lower source-level semiconductor layer, and a vertically-extending portion contacting a sidewall of the first portion of the lower-level semiconductor layer and connecting the first horizontally-extending portion and the second horizontally-extending portion.

19. The method of claim 15, further comprising planarizing a top surface of the upper source-level semiconductor layer, wherein an entirety of an interface between the upper source-level semiconductor layer and the alternating stack is formed within a horizontal plane.

20. The method of claim 15, further comprising:

forming an insulating spacer in a peripheral region of the lateral isolation trench; and forming a source contact via structure in a volume that is laterally surrounded by the insulating spacer on a surface of the lower source-level semiconductor layer.

* * * * *